United States Patent
Sundaresan et al.

(10) Patent No.: US 10,840,385 B1
(45) Date of Patent: Nov. 17, 2020

(54) PERFORMANCE SIC SCHOTTKY DIODES

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US)

(73) Assignee: GeneSiC Semiconductor Inc., Dulles, VA (US)

( * ) Notice: Subject to any disclaimer, the term of this patent is extended or adjusted under 35 U.S.C. 154(b) by 0 days.

(21) Appl. No.: 16/777,928

(22) Filed: Jan. 31, 2020

(51) Int. Cl.
*H01L 21/04* (2006.01)
*H01L 29/872* (2006.01)
*H01L 29/16* (2006.01)
*H01L 29/36* (2006.01)
*H01L 29/66* (2006.01)
*H01L 29/47* (2006.01)

(52) U.S. Cl.
CPC ........ *H01L 29/872* (2013.01); *H01L 21/0465* (2013.01); *H01L 21/0495* (2013.01); *H01L 29/1608* (2013.01); *H01L 29/36* (2013.01); *H01L 29/47* (2013.01); *H01L 29/6606* (2013.01)

(58) Field of Classification Search
CPC ............ H01L 2924/00; H01L 29/1608; H01L 2924/12032; H01L 29/872; H01L 29/66068; H01L 29/0619
See application file for complete search history.

(56) References Cited

U.S. PATENT DOCUMENTS

| | | | | |
|---|---|---|---|---|
| 2006/0237813 | A1* | 10/2006 | Hshieh | H01L 29/402 257/475 |
| 2014/0266403 | A1* | 9/2014 | Das | H01L 29/872 327/493 |
| 2016/0005883 | A1* | 1/2016 | Yen | H01L 21/0495 257/77 |
| 2019/0027616 | A1* | 1/2019 | Kyoung | H01L 29/8725 |

* cited by examiner

*Primary Examiner* — Jaehwan Oh
(74) *Attorney, Agent, or Firm* — Dave Law Group LLC; Raj S. Dave

(57) ABSTRACT

An embodiment relates to a semiconductor component, comprising a semiconductor body of a first conduction type comprising a voltage blocking layer; and islands of a second conductivity type on a contact surface; and a metal layer on the voltage blocking layer, wherein the metal layer and the voltage blocking layer includes a Schottky contact, and a first conductivity type layer comprising the first conduction type not in contact with the Schottky contact that is interspersed between the islands of the second conductivity type.

19 Claims, 92 Drawing Sheets n-type implant

PERFORMANCE SIC SCHOTTKY DIODES

FIELD OF THE INVENTION

This invention relates to 4H—SiC merged-PiN Schottky (MPS) diodes. An MPS diode consists of inter-digitated Schottky and P+ implanted areas.

BACKGROUND OF INVENTION

There has been a continuous trend toward higher operating frequencies especially in motor control and switch mode power supplies. In power supplies, operation at high frequencies is attractive because of the reduction in size and power losses in the passive components (inductors and capacitors) which leads to a more efficient, compact system design. To accomplish higher frequency operation, it is essential to use power rectifiers with improved switching performance. SiC's electronic parameters superiority would enable dramatic improvement in this regard. SiC power rectifiers can be Schottky diodes which offer extremely high switching speed but suffer from high leakage current, PiN diodes which offer low leakage current but show reverse recovery charge during switching and have a large junction forward voltage drop due to the wide band gap of SiC or merged-PiN Schottky (MPS) diodes. "[T]he merged pin–Schottky (MPS) diode are structures that combine pin and Schottky diodes in a way that takes advantage of the best characteristics of both" [source: T. Kimoto and J. A. Cooper, Fundamentals of Silicon Carbide Technology, IEEE Press (2014), page 296]. Conventional SiC merged-PiN Schottky (MPS) diodes, feature parallel connected Schottky and PiN diodes and offer Schottky-like on-state and switching characteristics, and PiN-like off-state characteristics.

FIG. 1 is the prior art structure of a MPS diode, consisting of interdigitated pin and Schottky diodes connected in parallel as reported in "T. Kimoto and J. A. Cooper, Fundamentals of Silicon Carbide Technology, IEEE Press (2014), page 296]". The MPS diode as shown in the prior art in FIG. 1 has metal layer on top which forms ohmic contacts to the p+ regions and Schottky contacts to the n− regions, so the overall device consists of interdigitated Schottky and pin diodes connected in parallel. The p+ anode regions are spaced far enough apart that their depletion regions do not touch under zero or forward bias. This leaves a conductive path through the n− drift regions between each Schottky contact and the n+ substrate. As forward bias is applied the Schottky regions conduct first since the current density of the Schottky Barrier Diode is orders of magnitude higher than the pin diode at the same forward voltage. The Schottky regions therefore effectively clamp the voltage drop across the pin regions and the pin regions do not conduct. As a result, virtually all of the forward current is due to electrons injected from the n− drift region through the Schottky contact into the metal. Since the p+ regions do not inject holes into the drift region, no minority carrier charge is stored and the turn-off transient is fast, minimizing switching loss. With no conductivity modulation, the series resistance of the drift region is determined by its thickness and doping. This relatively high resistance leads to a voltage drop VDR that dominates the total voltage drop at high currents. This poses a problem under high surge current events, since the pure Schottky diode can go into thermal runaway, with catastrophic consequences.

SUMMARY OF INVENTION

An embodiment relates to semiconductor component, comprising a semiconductor body of a first conduction type comprising a voltage blocking layer (e.g., N−); and islands of a second conductivity type (e.g., P+) on a contact surface; and a metal layer on the voltage blocking layer, wherein the metal layer and the voltage blocking layer includes a Schottky contact, and a first conductivity type layer comprising the first conduction type (e.g., N+) not in contact with the Schottky contact that is interspersed between the islands of the second conductivity type (e.g., P+).

In an embodiment, a vertical extent of the first conductivity type layer (e.g., N+) is lower than a bottom of the islands of the second conductivity type (e.g., P+).

In an embodiment, a vertical extent of the first conductivity type layer (e.g., N+) is higher than a bottom of the islands of the second conductivity type (e.g., P+).

In an embodiment, a doping concentration within the first conductivity type layer (e.g., N+) is non-uniform in a direction that is perpendicular to the Schottky contact (e.g., METAL 1).

In an embodiment, a vertical extent of the first conductivity type layer (e.g., N+) is lower than a bottom of the islands of the second conductivity type (e.g., P+).

In an embodiment, a vertical extent of the first conductivity type layer (e.g., N+) is higher than a bottom of the islands of the second conductivity type (e.g., P+).

In an embodiment, the first conductivity type layer (e.g., N+) has a doping concentration that does not vary in any direction along the contact surface.

In an embodiment, the first conductivity type layer (e.g., N+) has a first doping concentration that is higher than a second doping concentration of a drift region (e.g., N−).

In an embodiment, the first conductivity type layer (e.g., N+) has a first doping concentration that is lower than a second doping concentration of a drift region (e.g., N−).

In an embodiment, the Schottky contact comprises a metal comprising Al, Ag, Au, Mo, Ni, Pt, Ti, W, N, $Ti_xW_y$, $Ti_xN_y$, or combinations thereof.

An embodiment relates to a diode comprising P+ islands interspersed within a N+ region and a N− region contacts with a Schottky layer.

In an embodiment, a vertical extent of the N+ region is lower than a bottom of the P+ islands.

In an embodiment, a vertical extent of the N+ region is higher than a bottom of the P+ islands.

In an embodiment, a doping concentration within the N+ region is non-uniform in a direction that is perpendicular to the Schottky layer.

In an embodiment, a vertical extent of the N+ region is lower than a bottom of the P+ islands.

In an embodiment, a vertical extent of the N+ region is higher than a bottom of the P+ islands.

An embodiment relates to a diode comprising N+ islands interspersed within a P+ region and a P− region contacts with a Schottky layer.

In an embodiment, a vertical extent of the P+ region is lower than a bottom of the N+ islands.

In an embodiment, a vertical extent of the P+ region is higher than a bottom of the N+ islands.

In an embodiment, a doping concentration within the P+ region is non-uniform in a direction that is perpendicular to the Schottky layer.

In an embodiment, a vertical extent of the P+ region is lower than a bottom of the N+ islands.

In an embodiment, a vertical extent of the P+ region is higher than a bottom of the N+ islands.

BRIEF DESCRIPTION OF THE FIGURES

FIG. 3A to FIG. 3L are cross sectional views showing the process steps for manufacturing the SiC MPS diode shown in FIG. 2A.

FIG. 5A to FIG. 5L are cross sectional views showing the process steps for manufacturing the SiC MPS diode shown in FIG. 4.

DETAILED DESCRIPTION

Definitions and General Techniques

Figure 1:
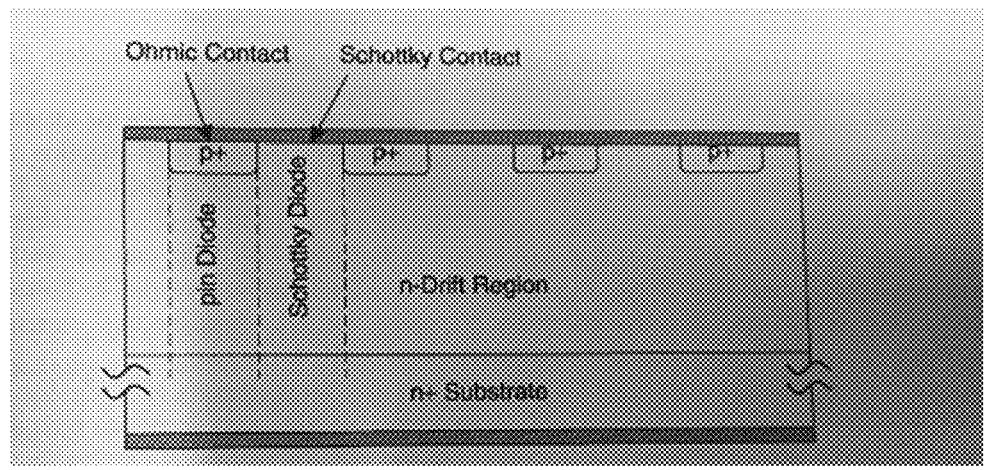
FIG. 1 is the cross-sectional schematic of a prior-art SiC MPS diode.

Unless otherwise defined herein, scientific and technical terms used in connection with the present invention shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques of the present invention are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

The following terms and phrases, unless otherwise indicated, shall be understood to have the following meanings.

The term "SiC" as used herein refers to silicon carbide which is a compound semiconductor and is a mixture of silicon and carbon with the chemical formula SiC. Silicon is covalently bonded with carbon. In 4H—SiC, 4H is written in the Ramsdell classification scheme where the number indicates the layer and the letter indicates the Bravais lattice. That means in a 4H—SiC structure four hexagonal layers of SiC are present. SiC exists in a kind of polymorphic crystalline building known as a polytype, e.g. 3C—SiC, 4H—SiC, 6H—SiC. Presently 4H—SiC is used in power device manufacturing.

The term "substrate" as used herein refers to the supporting material on or in which the components of an integrated circuit are fabricated or attached.

The term "MPS" as used herein refers to merged-PiN Schottky (MPS) diodes which consists of inter-digitated Schottky and P+ implanted areas.

The term "JFET" as used herein refers to junction gate field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a pn-junction. In an insulated-gate FET, the gate is isolated from the channel by an insulating layer so that the gate and channel form a capacitor with the insulating layer as the capacitor dielectric.

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor.

The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "PN junction" as used herein refers to the interface and region of transition between p-type and n-type semiconductors.

The term "P-type" as used herein refers to extrinsic semiconductor in which the hole density exceeds the conduction electron density.

The term "contact" as used herein refers to the point or part of a conductor which touches another electrical conductor or electrical component to carry electrical current to or from the conductor or electrical component.

The term "drift layer" as used herein refers to the region that determines the reverse breakdown voltage of the diode. Its function is to absorb the depletion layer of the reverse biased P+N− junction. As it is lightly doped, it will add significant ohmic resistance to the diode when it is forward biased.

The term "device" as used herein refers to the physical realization of an individual electrical element in a physically independent body which cannot be further divided without destroying its stated function.

The term "surface" as used herein refers to the outer or exterior boundary of a thing.

The term "mobility" as used herein refers to the facility with which carriers move through a semiconductor when subjected to an applied electric field. Electrons and holes typically have different mobilities in the same semiconductor.

The term "ME" as used herein refers to reactive ion etching which is an etching technology used in microfabrication. ME is a type of dry etching which has different characteristics than wet etching. ME uses chemically reactive plasma to remove material deposited on wafers. The plasma is generated under low pressure (vacuum) by an electromagnetic field. High-energy ions from the plasma attack the wafer surface and react with it.

The term "CVD" as used herein refers to chemical vapor deposition is method used to produce high quality, high-performance, solid materials, typically under vacuum. The process is often used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber.

The term "PECVD" as used herein refers to plasma-enhanced chemical vapor deposition process used to deposit thin films from a gas state (vapor) to a solid state on a substrate. Chemical reactions are involved in the process, which occur after creation of a plasma of the reacting gases.

The term "LPCVD" as used herein refers to low pressure chemical vapor deposition technology that uses heat to initiate a reaction of a precursor gas on the solid substrate. This reaction at the surface is what forms the solid phase material.

The term "CMP" as used herein refers to chemical-mechanical polishing (CMP) which is a polishing process assisted by chemical reactions to remove surface materials. CMP is a standard manufacturing process practiced at the semiconductor industry to fabricate integrated circuits and memory disks.

The term "RTA" as used herein refers to rapid thermal anneal which is a process used in semiconductor device fabrication. It consists of heating a single wafer at a time in order to affect its electrical properties. Unique heat treatments are designed for different effects. Wafers can be heated in order to activate dopants, change film-to-film or film-to-wafer substrate interfaces, densify deposited films, change states of grown films, repair damage from ion implantation, move dopants or drive dopants from one film into another or from a film into the wafer substrate. RTA are performed by equipment that heats a single wafer at a time using either lamp based heating, a hot chuck, or a hot plate that a wafer is brought near. Unlike furnace anneals they are short in duration, processing each wafer in several minutes.

The terms "first conductivity type region" and "second conductivity type region" used herein, describe n-type and p-type regions respectively for a N type device. For a P type device "first conductivity type region" and "second conductivity type region" are used to describe p-type and n-type regions respectively.

The embodiments described herein relate to SiC MPS diodes. The cross sectional schematic of conventional prior art, SiC, MPS diode features a parallel connection of a PiN diode and a Schottky rectifier. The MPS diode contains a Schottky metal on the top, with P+ islands interspersed between the Schottky contacts. The device contains a N− drift layer and an N+ substrate. The P+ islands are formed into the N− drift layer using either ion implantation or a selective area epitaxial growth. The second metal layer on top of the Schottky metal is the front side pad metal and metal on the bottom is backside pad metal. The purpose of the second metal placed on top of the first metal or Schottky metal is to provide a thick metallization for a wire bonding and packaging. The silicide layer forms an ohmic contact to the N+ substrate. The metal on the backside is placed on top of the silicide layer to provide a low resistance for packaging purposes. At low currents, the embodiments described in this device behaves like a Schottky diode and at extremely high current the device behaves like a PN junction diode. At low currents in the ON state or forward bias of operation, the device works as a Schottky rectifier, and the current flows from top metal, through the N− drift layer and into the N+ substrate and to the bottom metal. It is a purely majority carrier transport, where only electrons are carrying the device current.

In power electronic applications when SiC diodes are used at nominal current there are high current spikes that are impressed on the device. In the embodiments herein, it was desirable to introduce the interspersed P+ islands as a way to reduce the conductivity of the drift layer under the influence of these high current spikes thus enabling the device to survive these intermittent high current spikes.

The device described in an embodiment herein has a buried N+ region, which is located in between that P+ islands. The buried N+ region is formed in a way that it is physically separated from the wafer surface because it does not contact the Schottky layer. There is a portion of the N− drift layer in contact with the Schottky surface. The physical separation of the N+ region from the wafer surface is a critical feature of this embodiment since SiC devices at the Schottky metal have the N− doping concentration, not the N+ doping concentration. The silicon carbide surfaces in contact with a Schottky metal has the N− doping concentration which is critical for reducing the strength of the electric field at the Schottky metal interface with the SiC. In an embodiment described herein, the vertical extent of the buried N+ region is lower than the bottom of the P+ region and covers the bottom of the P+ region. The spacing between the P+ islands is narrower and the depth of the P+ islands is deeper when compared to prior art MPS diodes. The presence of the N+ region allows the spacing between the P+ islands to be narrower. The P+ islands shield the electric field that develops during the high voltage operation from the Schottky interface. In the embodiments herein the P+ regions interspersed with the N+ regions are designed such as to achieve a certain level of charge balance between the P+ islands and N+ regions which provides the benefit of further reducing the ON resistance of this device and also keeping a low electric field.

In an embodiment herein, the bottom of the N+ region is higher than the bottom of the P+ region. The bottom of the P+ region is in contact with the N− drift layer which is a trade off as this will enable lower leakage currents but higher ON resistance. Better ON resistance can be achieved in an embodiment of the device where the N+ region located in between the P+ islands is buried while lower leakage currents can be achieved in an embodiment of the device where the N+ region does not enclose the bottom of the P+ islands completely. In an embodiment described herein, both buried N+ region located in between the P+ islands and N+ region that do not enclose the bottom of the P+ islands completely can exist on the same device.

In an embodiment described herein the N+ region is formed of several sub N regions while the P+ is formed of many sub P regions such that the doping concentration in each of these different layers or slices could be different. In an embodiment herein either the final slice of the N+ region is underneath the P+ islands and covers around the P+ islands completely or the bottom of the N+ slice is higher than the bottom of the P+ region. The doping concentration of N+ types sub regions farther away from the silicon carbide surface could be progressively higher which may have a benefit of lower conduction losses. In another implementation the doping concentration of the P type sub regions farther away from the SiC surface could be made progressively lower which may enable better blocking characteristics. The varying doping concentration described in the embodiments herein allows freedom to appropriately tune the device design towards a lower leakage currents, better conduction losses, lowered resistance etc. Better trade off can be achieved with layered and differently doped N+ and P+ regions as opposed to just having one P+ layer and one N+ layer and this can be achieved by using multiple ion implantation steps or multiple epi growth.

In an embodiment herein the N+ region which is interspersed between a set of multiple P+ wells is formed in such a way that it is physically separated from the wafer surface and extends all the way into the N− drift region. The physical separation of the N+ region from a SiC wafer surface in the embodiments herein distinguishes it from other similar inventions.

In an embodiment herein, a part of the SiC wafer which is in contact with a Schottky metal (METAL 1) and is an n-type semiconductor has the same doping concentration of the N− drift since the doping concentration of the n-type SiC semiconductor which is in direct contact with the Schottky metal (METAL 1) is critical for reducing the strength of the electric field at the wafer surface, during the high-voltage blocking mode of operation of the SiC MPS diode.

Figure 2A:
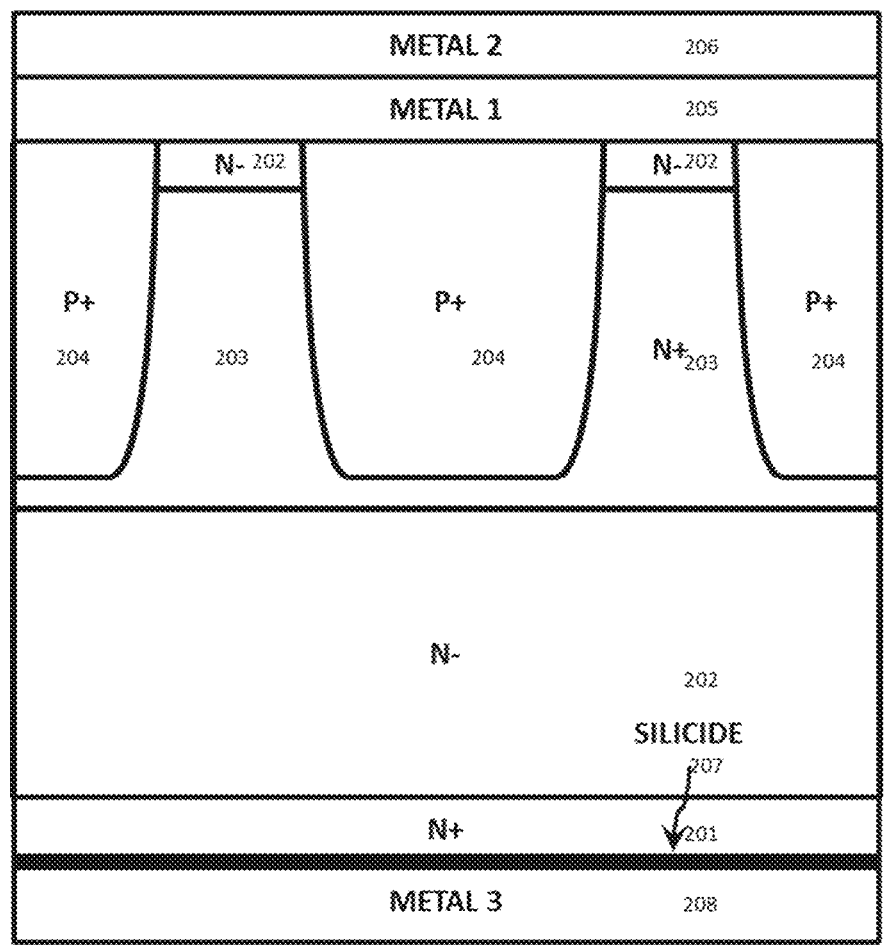
FIG. 2A is an embodiment of MPS diode structure with buried N+ regions.

The device of embodiment shown in FIG. 2A is the cross-sectional schematic of SiC MPS diode. The key regions of this device are an N+ substrate 201 at the bottom which gives mechanical support of the wafer and is ~350 μm-thick. An N− drift region 202 which is usually an epi layer and is on top of the N+ substrate. There are multiple P+ wells 204 that are formed as linear stripes or more complex circular or hexagonal patterns. The device has a first metal layer 205 denoted as METAL 1, which is the Schottky metal to an N-type SiC semiconductor region and forms Schottky contact to its underlying N-type regions. The device has a second metal layer 206 denoted as METAL 2 on the front side of the wafer which is in contact with the METAL 1. METAL 2 is often called "power metal" and is usually in Aluminum. There is a silicide layer 207 under the bottom of the N+ substrate. There is a third metal layer 208 denoted as METAL 3 under the back side of the wafer which is in contact with the silicide layer.

The device shown in FIG. 2A has a N+ region 203 which is interspersed between a set of multiple P+ wells 204. The N+ region 203 is formed in such a way that it is physically separated from the wafer surface and extends all the way into the N− drift region 202. The physical separation of the N+ region from a SiC wafer surface is a critical feature of the embodiment described herein and distinguishes it from other similar inventions. A part of the SiC wafer which is in contact with a Schottky metal 205 denoted as METAL 1 and is an n-type semiconductor has the same doping concentration of the N− drift 202. In the embodiment described herein, the doping concentration of the n-type SiC semiconductor which is in direct contact with the Schottky metal 205 labeled METAL 1 is critical for reducing the strength of the electric field at the wafer surface, during the high-voltage blocking mode of operation of the SiC MPS diode. The vertical extent of the N+ region 203 is lower than the bottom of the P+ region 204. The buried N+ region completely surrounds the P+ region which provides Schottky-injected majority carriers a more conductive travel path and reduces the total forward conduction loss.

Figure 2B:
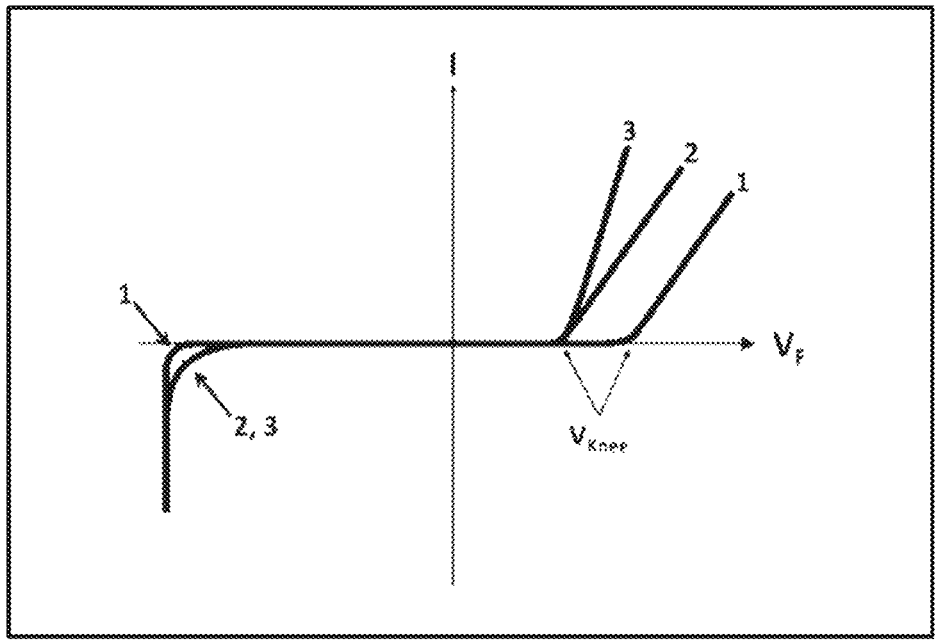
FIG. 2B the I-V characteristic for the embodiment described in FIG. 2A.

The embodiment described in the device herein, uses a different kind of Schottky metal for the METAL 1 layer when comparing to the METAL 1 of the prior art. The choice of METAL 1 205 of the device described in FIG. 2A is made so that the barrier height of its Schottky contact is lower than that of the prior art's. Due to the smaller Schottky barrier height, the injection of the majority carrier over the Schottky barrier becomes more efficient and this reflects as a lower Knee Voltage ($V_{Knee}$) in the forward I-V characteristics as shown in FIG. 2B. The new devices with lower $V_{Knee}$ (marked as #2 and #3) have lower forward conduction loss than their counterpart (marked as #1). The lower Schottky barrier height, leads to higher reverse leakage current as shown in the reverse I-V curves—marked as #2 and #3. The amount of the leakage current can be kept under control in the embodiment described here by fine tuning the barrier height which is dependent on various design elements including but not limited to the annealing temperature of the Schottky contact, the pitch of the device, depth and doping of the P+ region, the doping and depth of the N+ region, and the doping of the N− drift region.

Another distinct feature of the embodiment described here is that the N+ substrate of the new device is thinner (which is usually 100~200 μm) than its counterpart (which is usually ~350 μm). The thinned N+ substrate directly impacts on the forward I-V characteristics that the linear region of the forward I-V curves where $V_F > V_{Knee}$ becomes steeper because the thinned substrate contributes less series resistance to the total amount of the forward conduction loss. As shown in FIG. 2B, the diode with the lower $V_{Knee}$ and thinned substrate (marked #3) must have less conduction loss than another diode with the exact lower $V_{Knee}$ and thick substrate (marked #2). In the embodiment here the Differential On-Resistance ($R_{ON,Diff}$) which is the inverse of the slope of the linear segment of the forward I-V curve is significantly reduced by thinning the N+ substrate. The lower $V_{Knee}$ and $R_{ON,Diff}$ of the diode in the embodiment herein enables significant reduction of the forward conduction loss while maintaining the reverse leakage low enough for suitable needs in the market.

FIG. 3A to FIG. 3L describes the process of manufacturing the structure shown in FIG. 2A. The manufacturing process of the device includes preparing a SiC wafer in FIG. 3A which consists of a highly conductive N+ substrate 301 and an N− drift region 302, where the N− drift region is typically epi-grown. The N− drift region 302 is designed in such a way that the doping concentration and thickness of the N− drift region are primarily selected based on the required blocking performance. When the SiC wafer is prepared, an ion implantation step with an n-type species 303 such as nitrogen and/or phosphorus is performed onto the active region of the device in FIG. 3B forming an N+ region within the N− drift region. The edge termination which is not shown needs to be masked during the n-type ion implantation step. It is important to note that the n-type ion implantation step 303 needs to be performed in such a fashion that the N+ region 304 is completely buried inside the N− drift region in FIG. 3C. The ion implantation step should form the N+ region 304 where the top of the N+ region is physically off from the wafer surface.

Figure 3A:
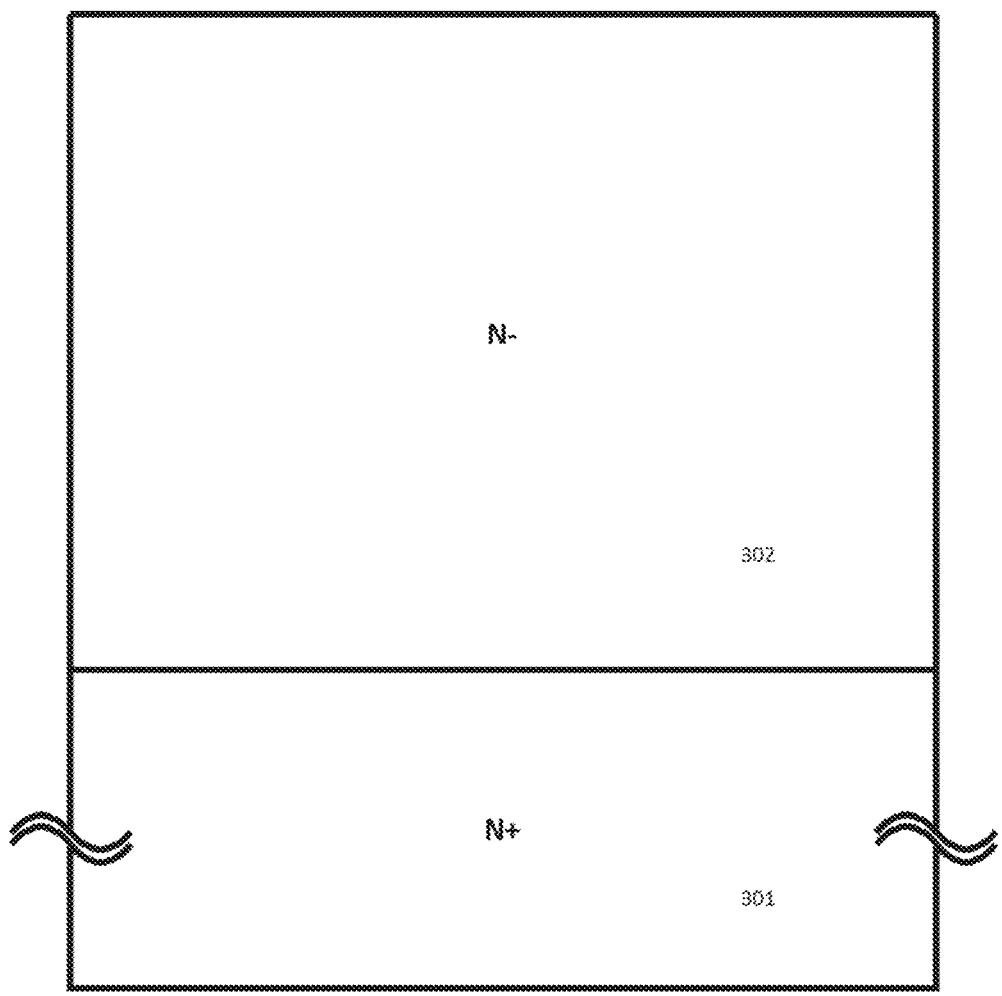
Figure 3B:
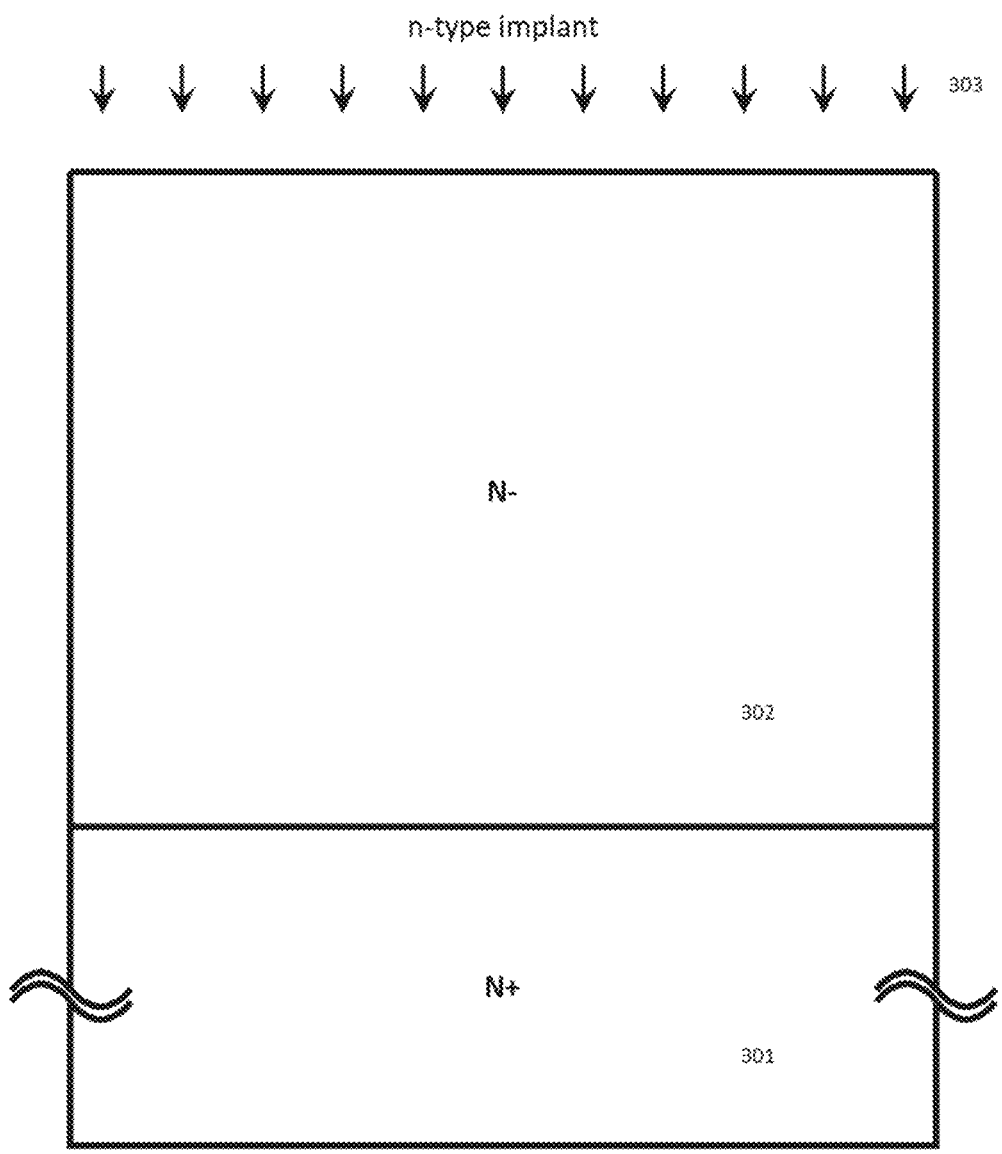
Figure 3C:
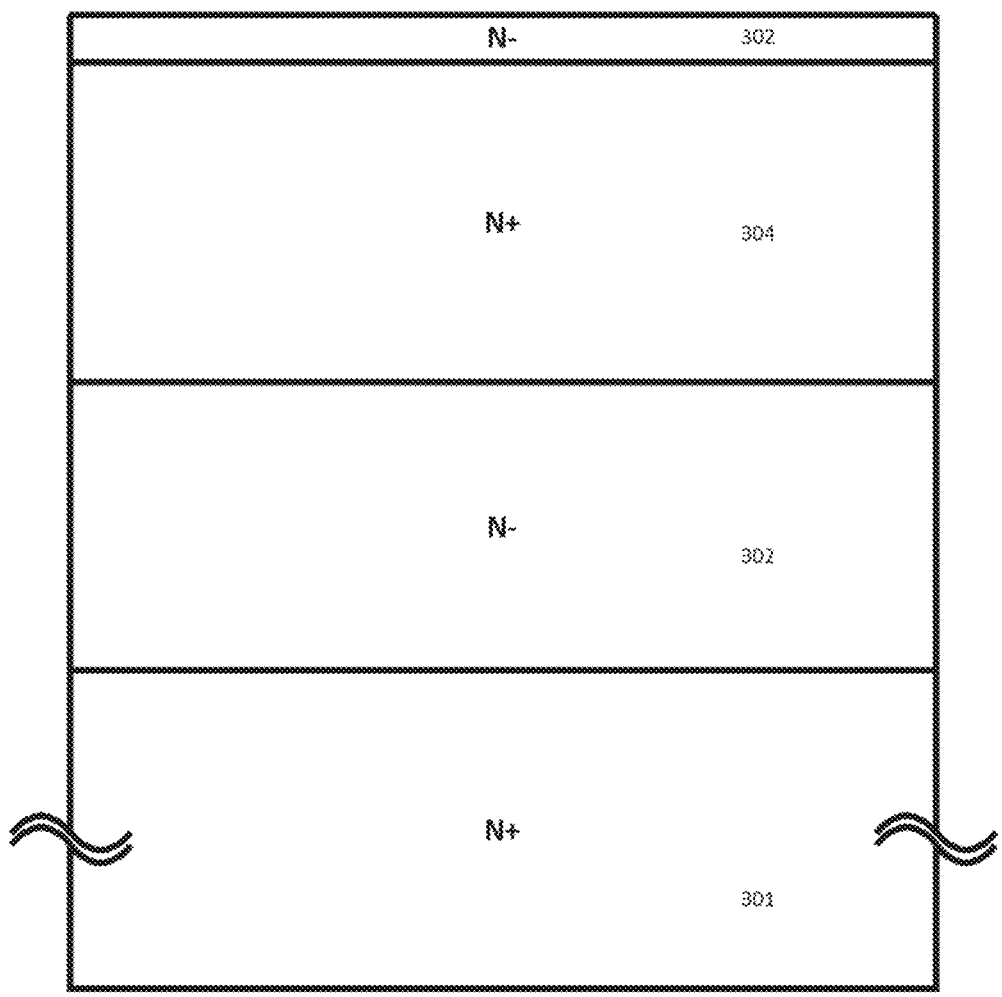
Figure 3D:
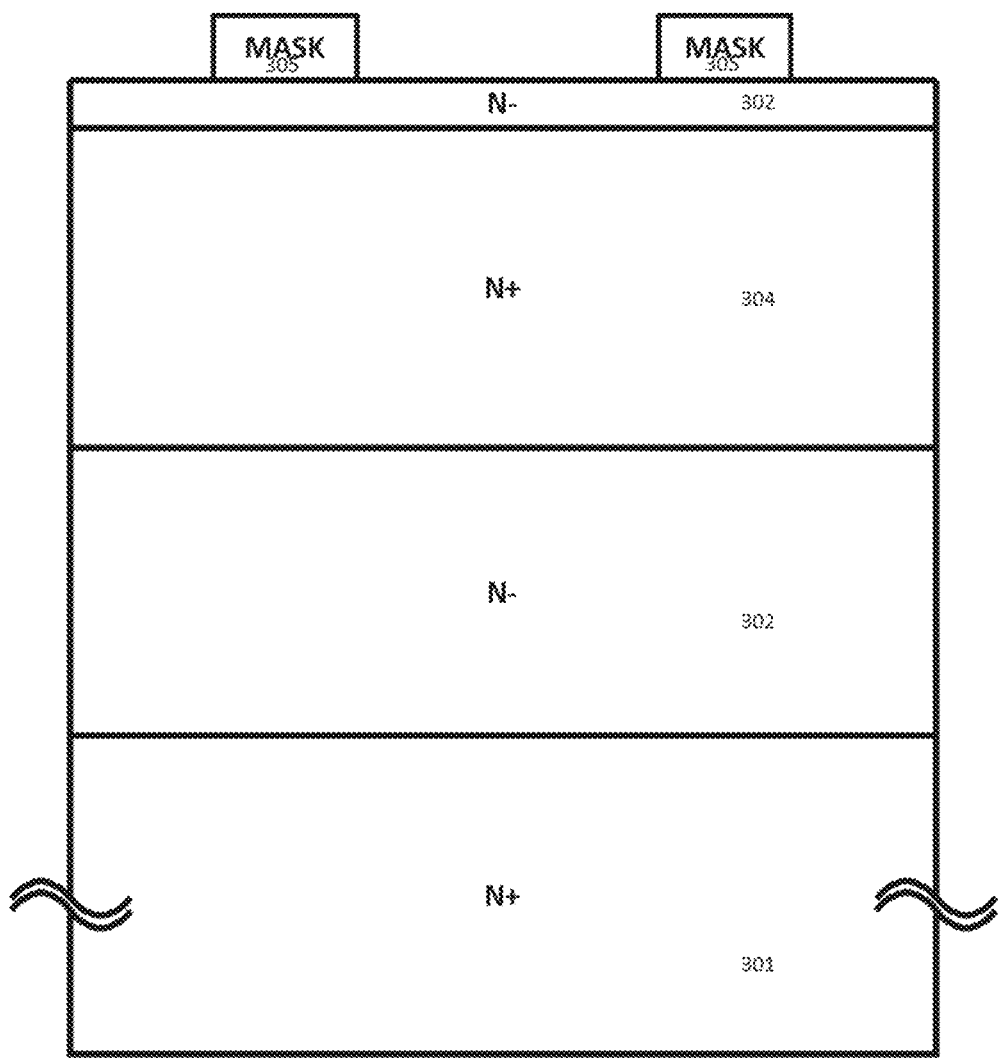
Figure 3E:
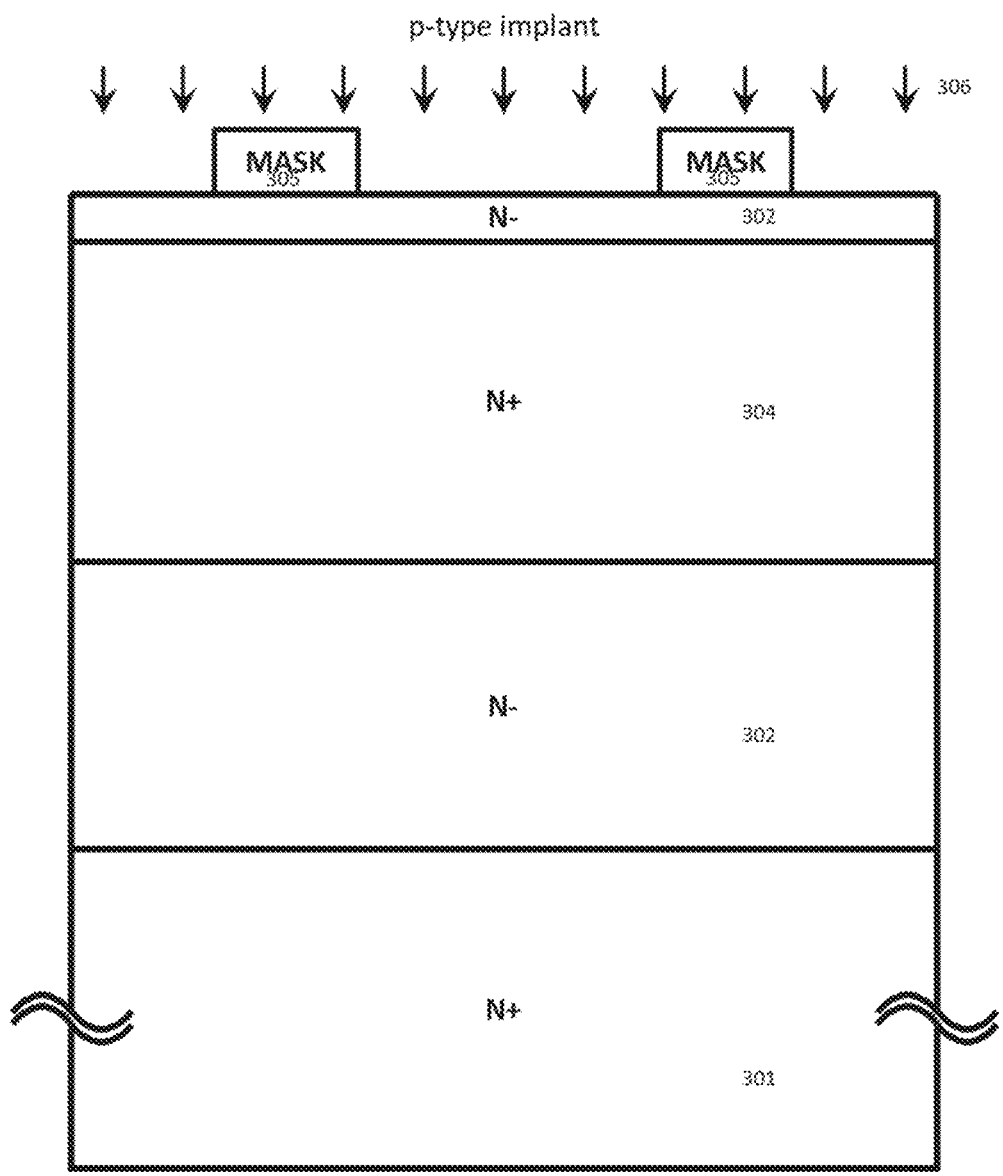
Figure 3F:
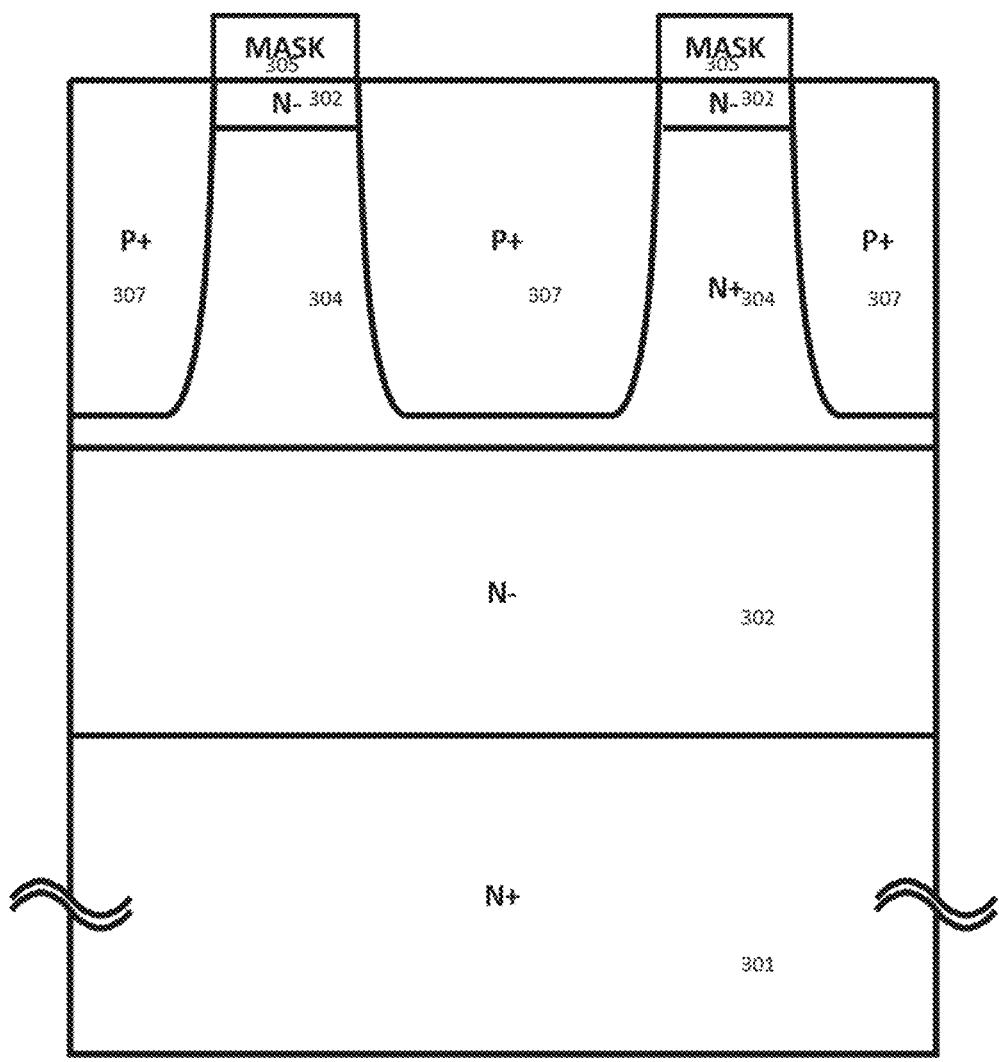
Figure 3G:
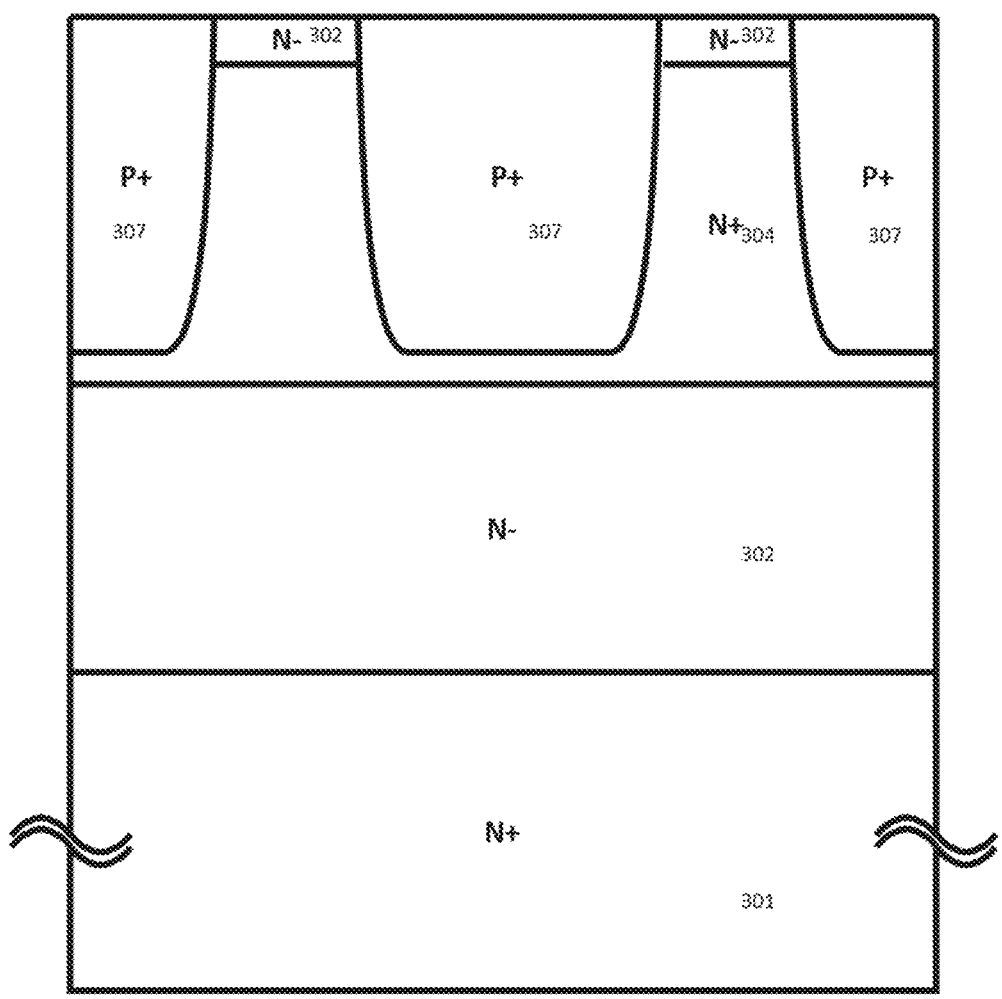

A patterned mask 305, which is preferably a hard mask made of such as an oxide, a nitride, a polysilicon layer, or a combination of these, is formed on the wafer surface in FIG. 3D. The patterned mask must be thick enough to completely block any high energy impurities during the subsequent ion implant step. A p-type ion implantation step with a p-type impurity 306 such as aluminum and/or boron is performed in FIG. 3E to form a set of multiple P+ wells 307 in FIG. 3F. The bottoms of the set of multiple P+ wells 307 are formed such that they are above the bottom of the N+ region 304. In the embodiments herein, the depth of the set of multiple P+ wells is less than the depth of the N+ region. The set of multiple P+ wells leads to a P+ region as a whole in FIG. 3F. The edge termination region which is not shown may be formed by the p-type ion implantation step. The patterned mask 305 is removed by dry or wet etching process in FIG. 3G. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

Figure 3H:
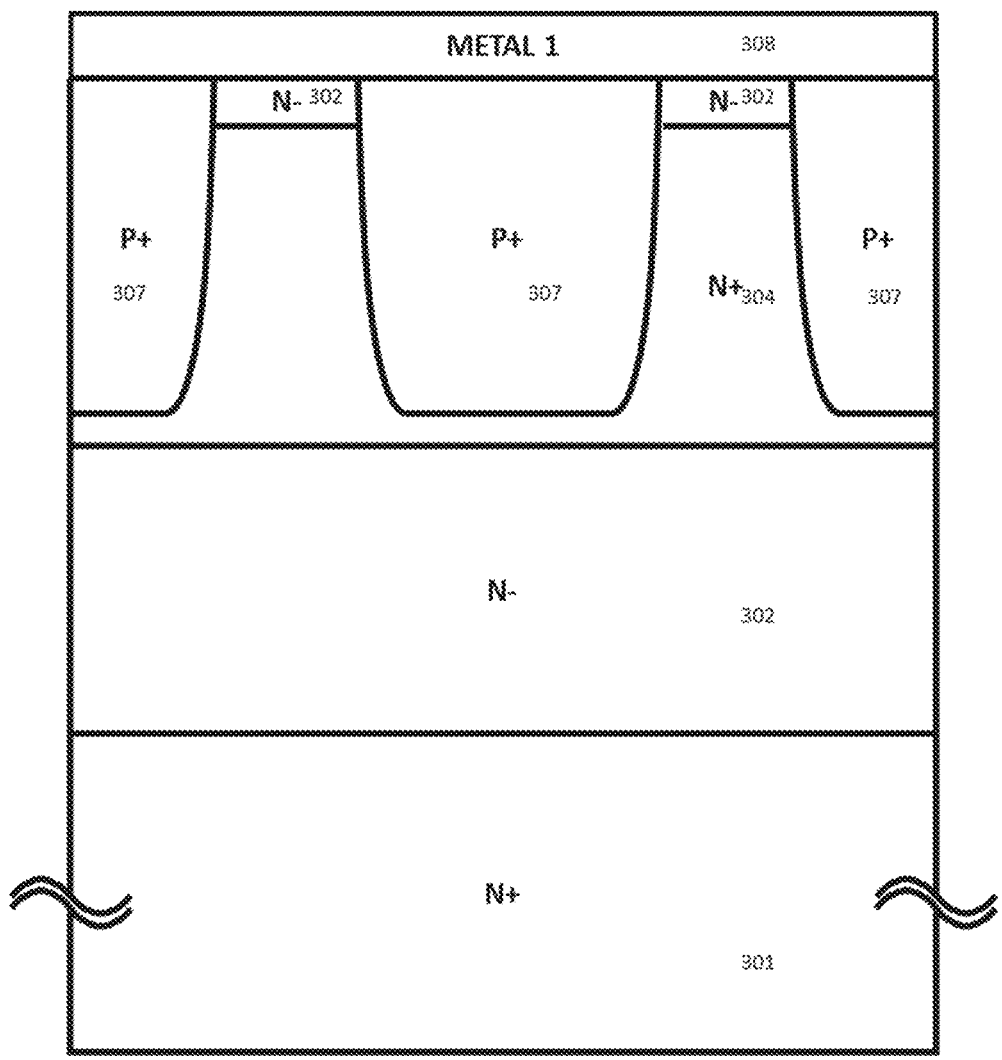
Figure 31:
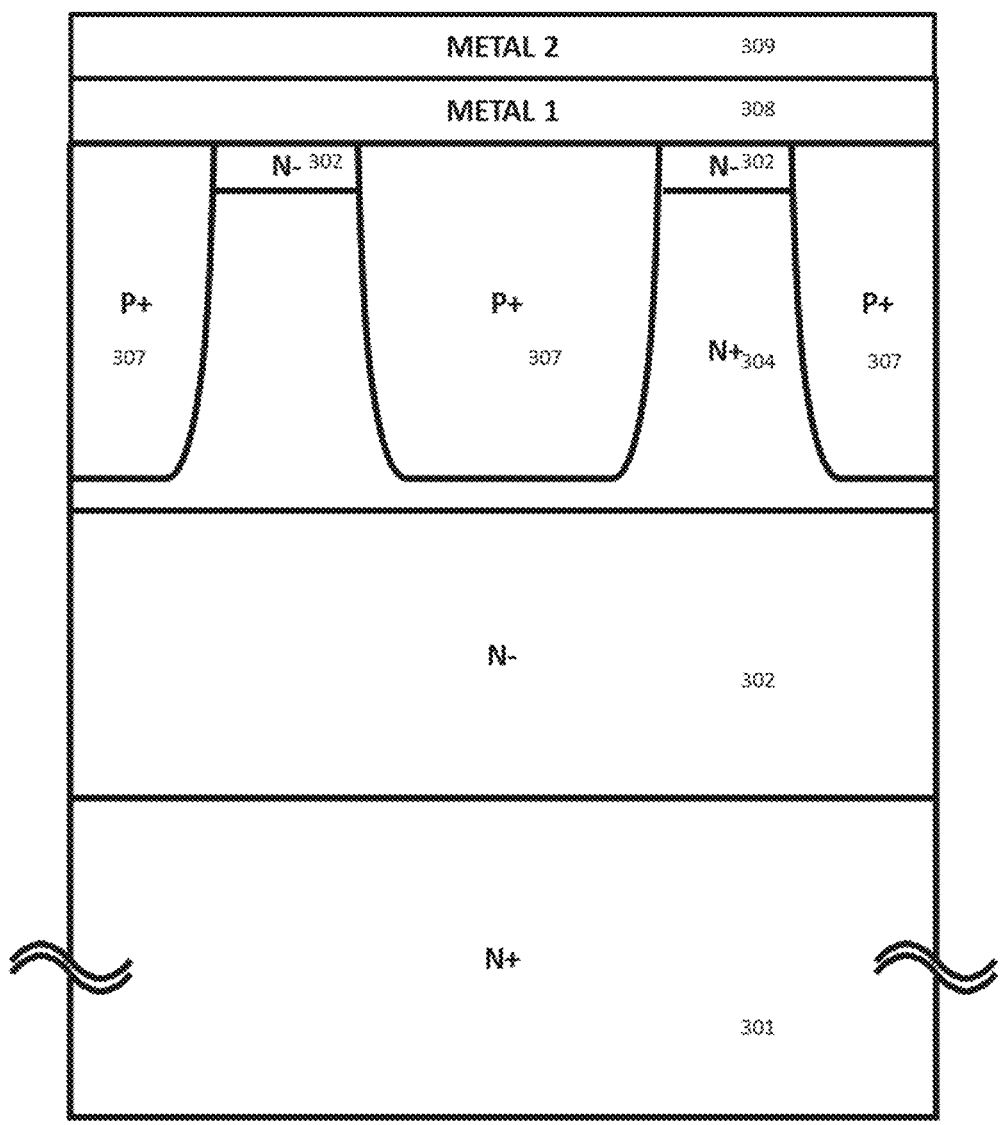
Figure 3J:
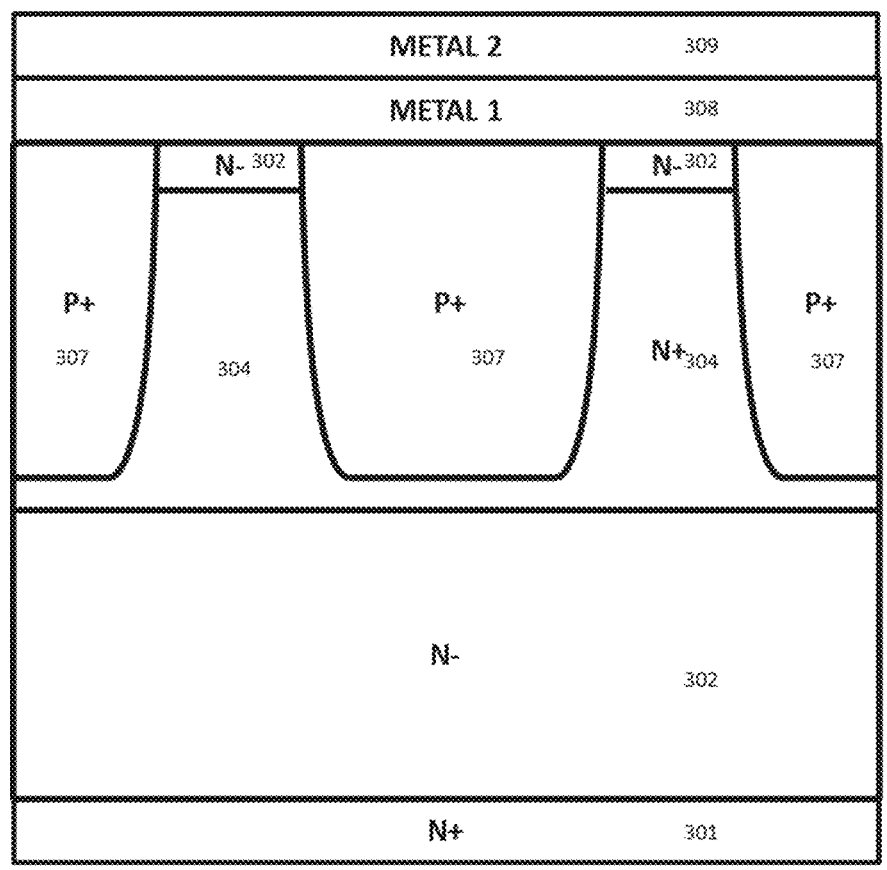

The Schottky contact is formed on the wafer surface by depositing a Schottky metal 308 marked as METAL 1 directly on the wafer surface in FIG. 3H. The deposited Schottky metal layer is then patterned by using dry etching, wet etching, or lift-off process and annealed at a certain temperature for a certain amount of time by using a furnace or RTA (Rapid Thermal Anneal). The thermal budget of the annealing step after the Schottky metal deposition needs to be carefully designed and controlled because it directly affects the barrier height of the Schottky contact. A first pad metal 309 marked as METAL 2 is then deposited on top of the wafer in FIG. 3I and patterned by dry etching, wet etching, or lift-off. The first pad metal can be of Aluminum/Aluminum-based alloy. The wafer is then thinned from its back side until its thickness reaches to a target thickness of 100~200 μm in FIG. 3J. The thickness may be further reduced in the future when the wafer thinning technology improves and provides the target thickness less than the aforementioned 100~200 μm. The wafer thinning can be accomplished by Chemical Mechanical Polishing (CMP), wet etching, dry etching, or a combination of the aforementioned grinding techniques with a proper protective coating at the front side of the wafer.

Figure 3K:
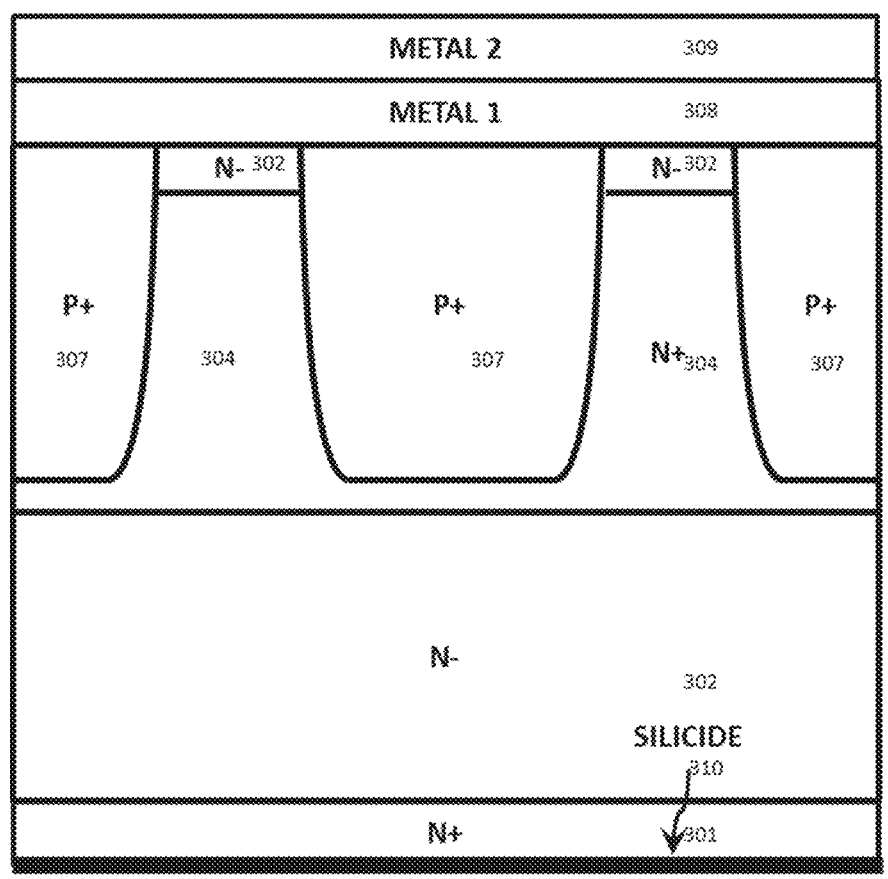
Figure 3L:
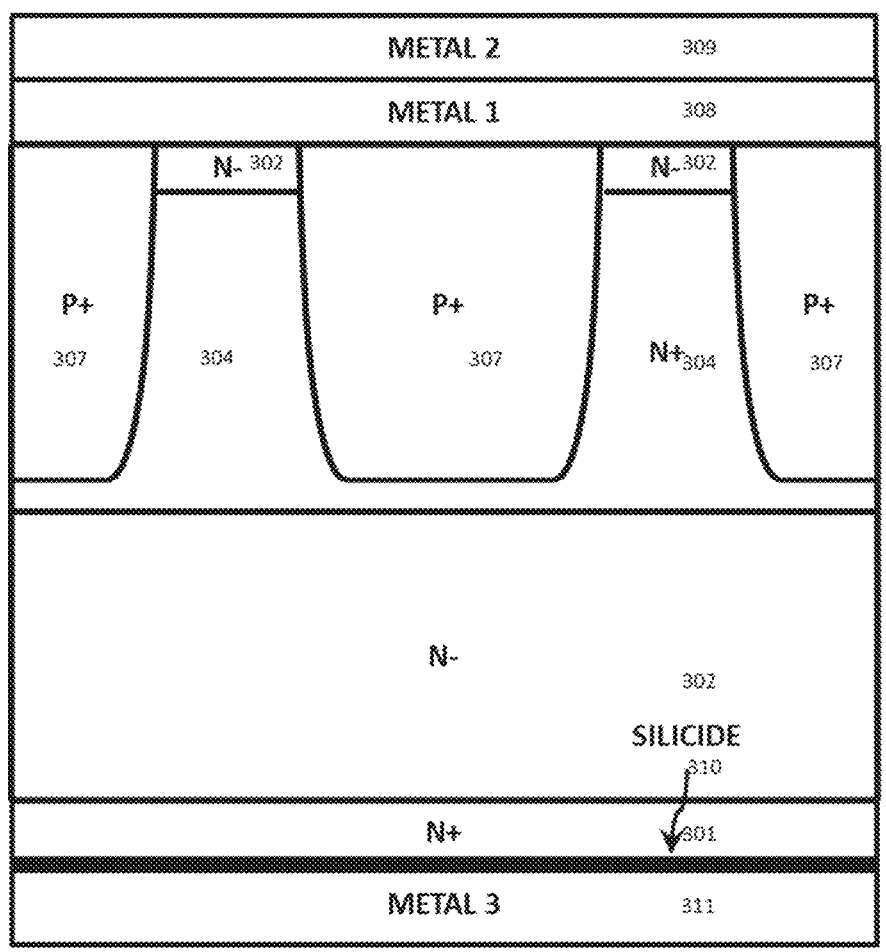

A silicide region 310 on the back side of the wafer is then formed in FIG. 3K. The silicide region is required to form a good ohmic contact on the back side of the wafer. The silicide region is formed by depositing ohmic metal stack and annealing the wafer by using a laser annealing technique as an example. A second pad metal 311 marked as METAL 3 is formed on the back side of the wafer in FIG. 3L. The second pad metal can be of Aluminum or Aluminum-based alloy. After the second pad metal step is finished, a protective coating process step may be followed on top of the wafer to form a moisture barrier.

Another method to fabricate this embodiment is to use a SiC wafer with multiple n-type epi-grown layers to start with. In this case, the SiC wafer consists of three n-type epi-grown layers in FIG. 3C with different doping concentrations and thicknesses and the N+ substrate at the bottom of the SiC wafer. The three n-type epi-grown layers should be formed in such a way that an N− layer 302 is meeting a device side of the wafer and an N+ layer 304 is positioned right underneath the N− layer, where the N+ layer is on top of a second N− layer also labeled 302 which serves as a drift region and the second N− layer is positioned on top of the N+ substrate 301.

When the SiC wafer with the aforementioned epi structure is prepared, a patterned mask 305, which is preferably a hard mask made of such as an oxide, a nitride, a polysilicon layer, or a combination of these, is formed on the wafer surface in FIG. 3D. The patterned mask must be thick enough to completely block any high energy impurities during the subsequent ion implant step. A p-type ion implantation step with a p-type impurity 306 such as aluminum and/or boron is performed in FIG. 3E to form a set of multiple P+ wells 307 in FIG. 3F. The bottoms of the set of multiple P+ wells 307 are formed such that they are above the bottom of the N+ region 304. In the embodiments herein, the depth of the set of multiple P+ wells is less than the depth of the N+ region. The set of multiple P+ wells leads to a P+ region as a whole in FIG. 3F. The edge termination region which is not shown may be formed by the p-type ion implantation step. The patterned mask 305 is removed by dry or wet etching process in FIG. 3G. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 308 marked as METAL 1 directly on the wafer surface in FIG. 3H. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 309 marked as METAL 2 is then deposited on top of the wafer in FIG. 3I and patterned by dry etching, wet etching, or lift-off. The first pad metal can be of Aluminum/Aluminum-based alloy. The wafer is then thinned from its back side until its thickness reaches to a target thickness of 100~200 μm in FIG. 3J. The thickness may be further reduced in the future when the wafer thinning technology improves and provides the target thickness less than the aforementioned 100–200 µm. The wafer thinning can be accomplished by CMP, wet etching, dry etching, or a combination of the aforementioned grinding techniques with a proper protective coating at the front side of the wafer.

A silicide region 310 on the back side of the wafer is then formed in FIG. 3K. The silicide region is required to form a good ohmic contact on the back side of the wafer. The silicide region is formed by depositing ohmic metal stack and annealing the wafer by using a laser annealing technique as an example. A second pad metal 311 marked as METAL 3 is formed on the back side of the wafer in FIG. 3L. The second pad metal can be of Aluminum or Aluminum-based alloy. After the second pad metal step is finished, a protective coating process step may be followed on top of the wafer to form a moisture barrier.

As seen in the embodiment shown in FIG. 2A the P+ region 204 of the SiC MPS diode of this invention is formed in such a way that the set of multiple P+ wells are spaced narrower in lateral direction and extend vertically deeper into the N– drift region 202 when compared to the case of the prior art. The P+ region of this invention, in conjunction with the aforementioned N+ region, is designed to provide a robust shielding to the Schottky barrier formed on the wafer surface. In contrast, the device of the prior art is vulnerable to the high stress of the electric field at its Schottky contact which easily results in temporary/permanent degradation of the Schottky contact leading to the high leakage current and/or irreversible destruction of the device. The device in the prior art has the N– drift region as the sole conduction path only, and it is clear that the majority carriers flowing through the JFET-like region between the P+ wells near the wafer surface will suffer in the carrier transport and increase the total forward conduction loss.

Figure 2C:
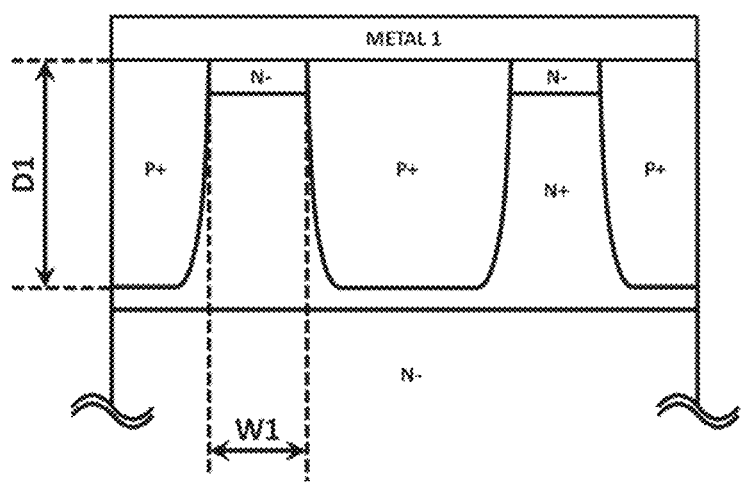
FIG. 2C is the comparison of the cross-sections of the devices in FIG. 2A.

FIG. 2C compares key dimensions of the device structure of this invention. Regardless of the types of the devices, the lateral spacing between two adjacent P+ wells is defined to be W1 and the vertical depth of the P+ wells measured from the surface of the SiC wafer is defined to be D1. It should be noted that the ratio of W1 over D1 (or W1/D1) for the device of this invention is less than 3.0 (or W1/D1<3.0).

Figure 4:
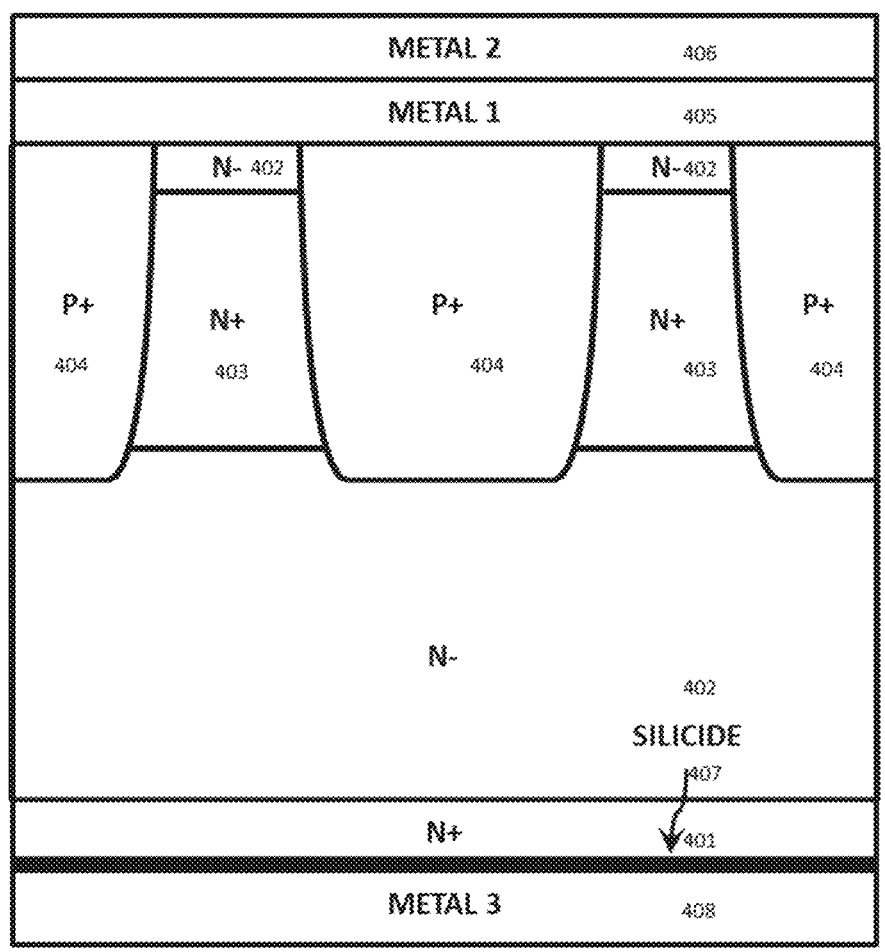
FIG. 4 is an embodiment of MPS diode structure where the bottom of the N+ region is higher than the bottom of the P+ region.

The device of embodiment shown in FIG. 4 is the cross-sectional schematic of SiC MPS diode. The key regions of this device are an N+ substrate 401 at the bottom which gives mechanical support of the wafer and is ~350 µm-thick. An N– drift region 402 which is usually an epi layer and is on top of the N+ substrate. There are multiple P+ wells 404 that are formed as linear stripes or more complex circular or hexagonal patterns. The device has a first metal layer 405 denoted as METAL 1, which is the Schottky metal to an N-type SiC semiconductor region and forms Schottky contact to its underlying N-type regions. The device has a second metal layer 406 denoted as METAL 2 on the front side of the wafer which is in contact with the METAL 1. METAL 2 is often called "power metal" and is usually in Aluminum. There is a silicide layer 407 under the bottom of the N+ substrate. There is a third metal layer 408 denoted as METAL 3 under the back side of the wafer which is in contact with the silicide layer.

The device shown in FIG. 4 has a N+ region 403 which is interspersed between a set of multiple P+ wells 404. The N+ region 403 is formed in such a way to extend near the vicinity of the P+ region 404 but not completely cover the bottom of the P+ region. The physical separation of the N+ region from a SiC wafer surface is a critical feature of the embodiment described herein and distinguishes it from other similar inventions. A part of the SiC wafer which is in contact with a Schottky metal 405 denoted as METAL 1 and is an n-type semiconductor has the same doping concentration of the N– drift 402. In the embodiment described herein, the doping concentration of the n-type SiC semiconductor which is in direct contact with the Schottky metal 405 labeled METAL 1 is critical for reducing the strength of the electric field at the wafer surface, during the high-voltage blocking mode of operation of the SiC MPS diode. The vertical extent of the N+ region 403 is above the bottom of the P+ region 404. The buried N+ region does not completely cover the bottom of the P+ region.

FIG. 5A to FIG. 5L describes the process of manufacturing the structure shown in FIG. 4. The manufacturing process of the device includes preparing a SiC wafer in FIG. 5A which consists of a highly conductive N+ substrate 501 and an N– drift region 502, where the N– drift region is typically epi-grown. The N– drift region 502 is designed in such a way that the doping concentration and thickness of the N– drift region are primarily selected based on the required blocking performance. When the SiC wafer is prepared, an ion implantation step with an n-type species 503 such as nitrogen and/or phosphorus is performed onto the active region of the device in FIG. 5B forming an N+ region within the N– drift region. The edge termination which is not shown needs to be masked during the n-type ion implantation step. It is important to note that the n-type ion implantation step 503 needs to be performed in such a fashion that the N+ region 504 is completely buried inside the N– drift region in FIG. 5C. The ion implantation step should form the N+ region 504 where the top of the N+ region is physically off from the wafer surface.

Figure 5A:
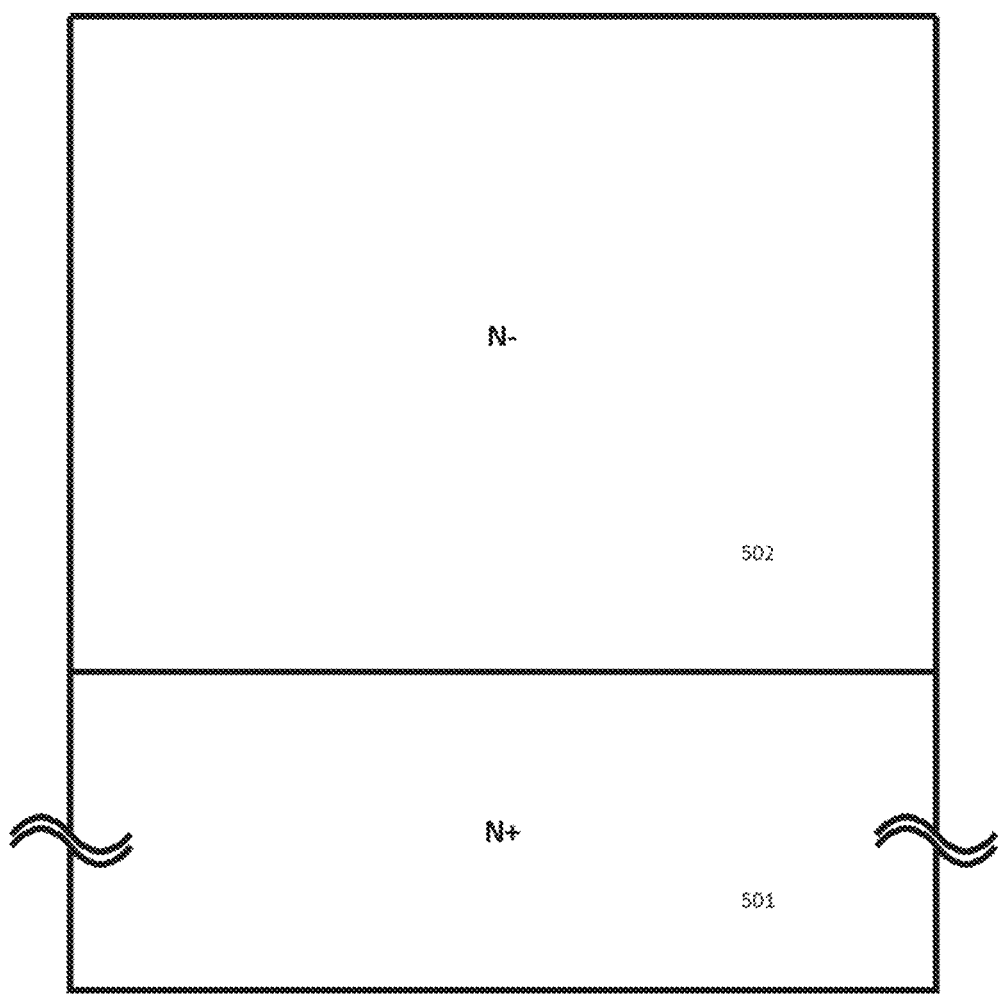
Figure 5B:
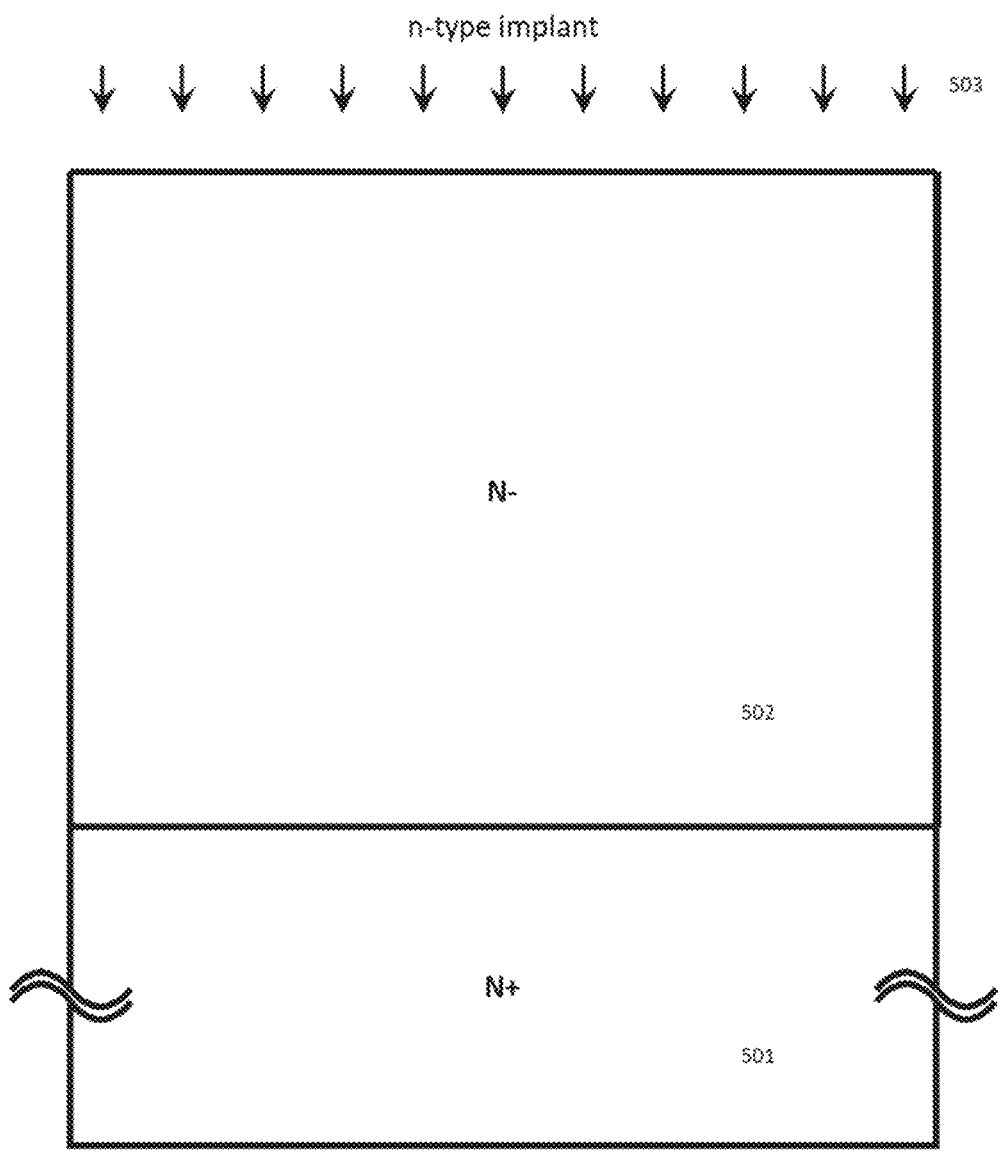
Figure 5C:
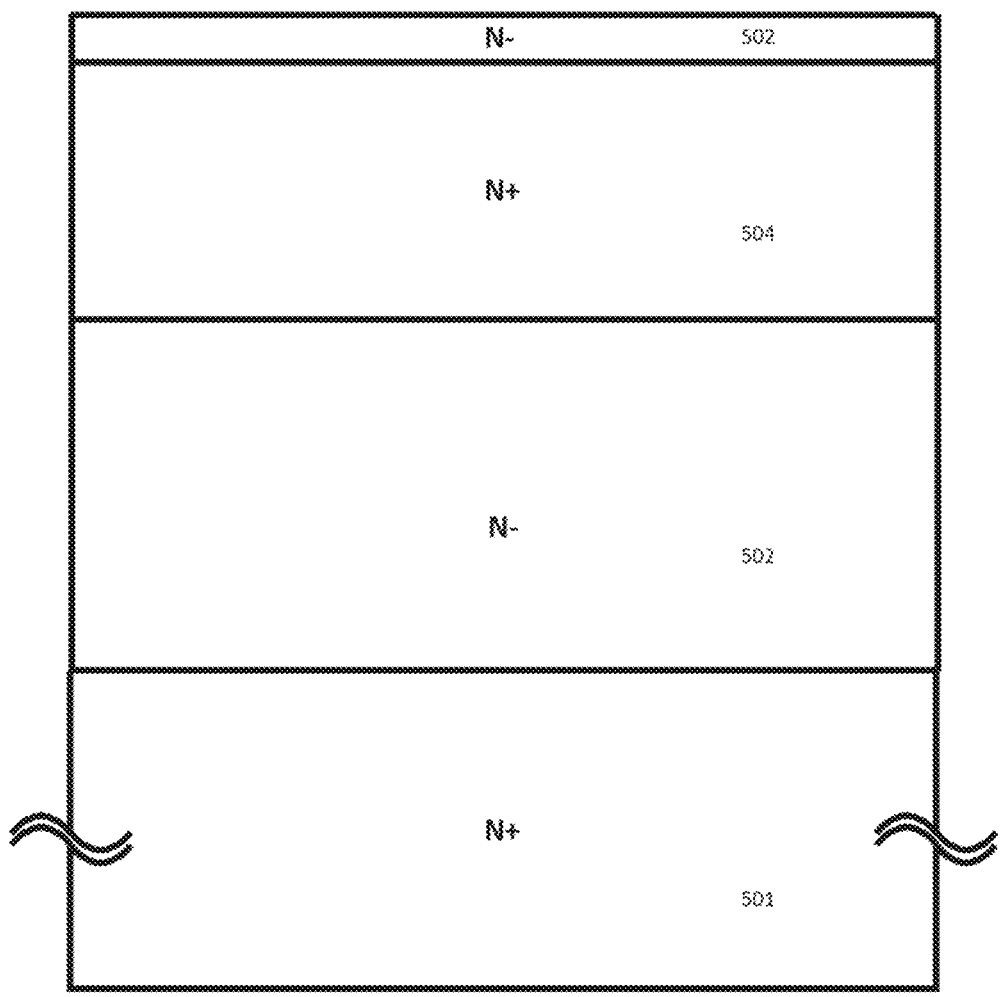
Figure 5D:
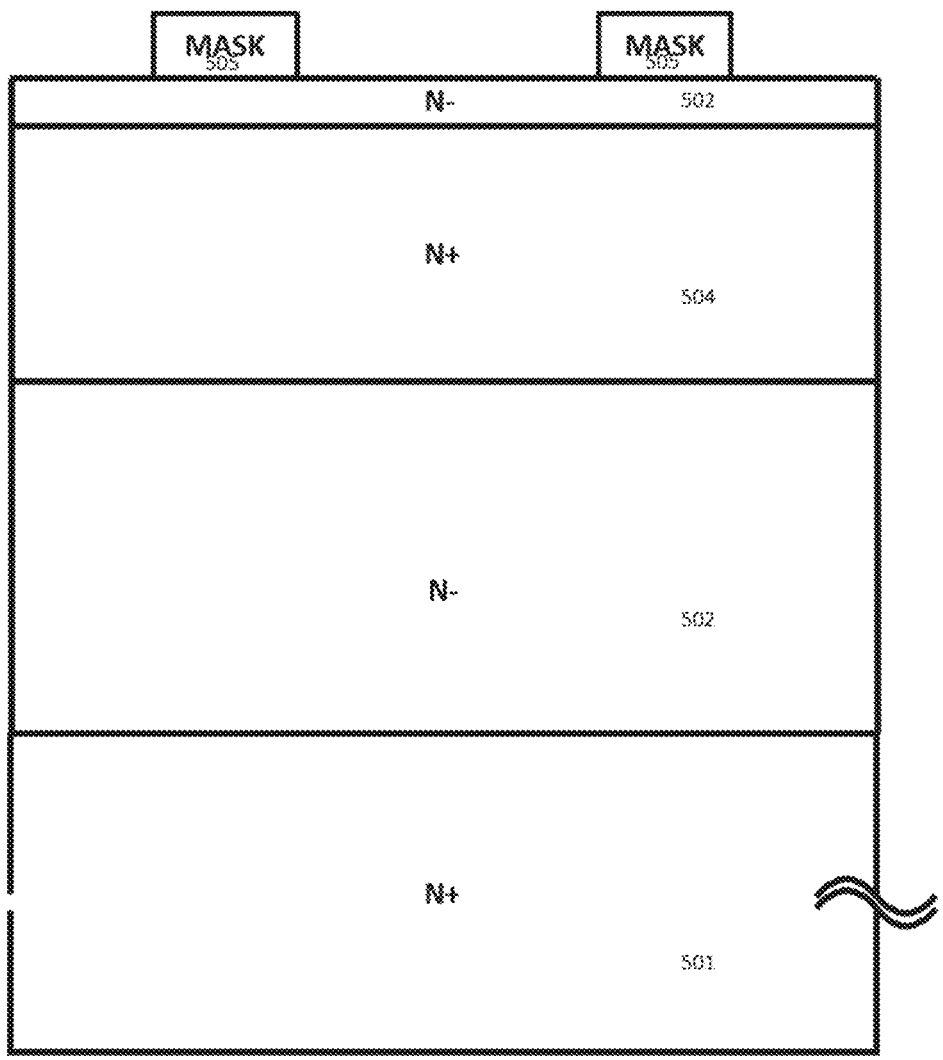
Figure 5E:
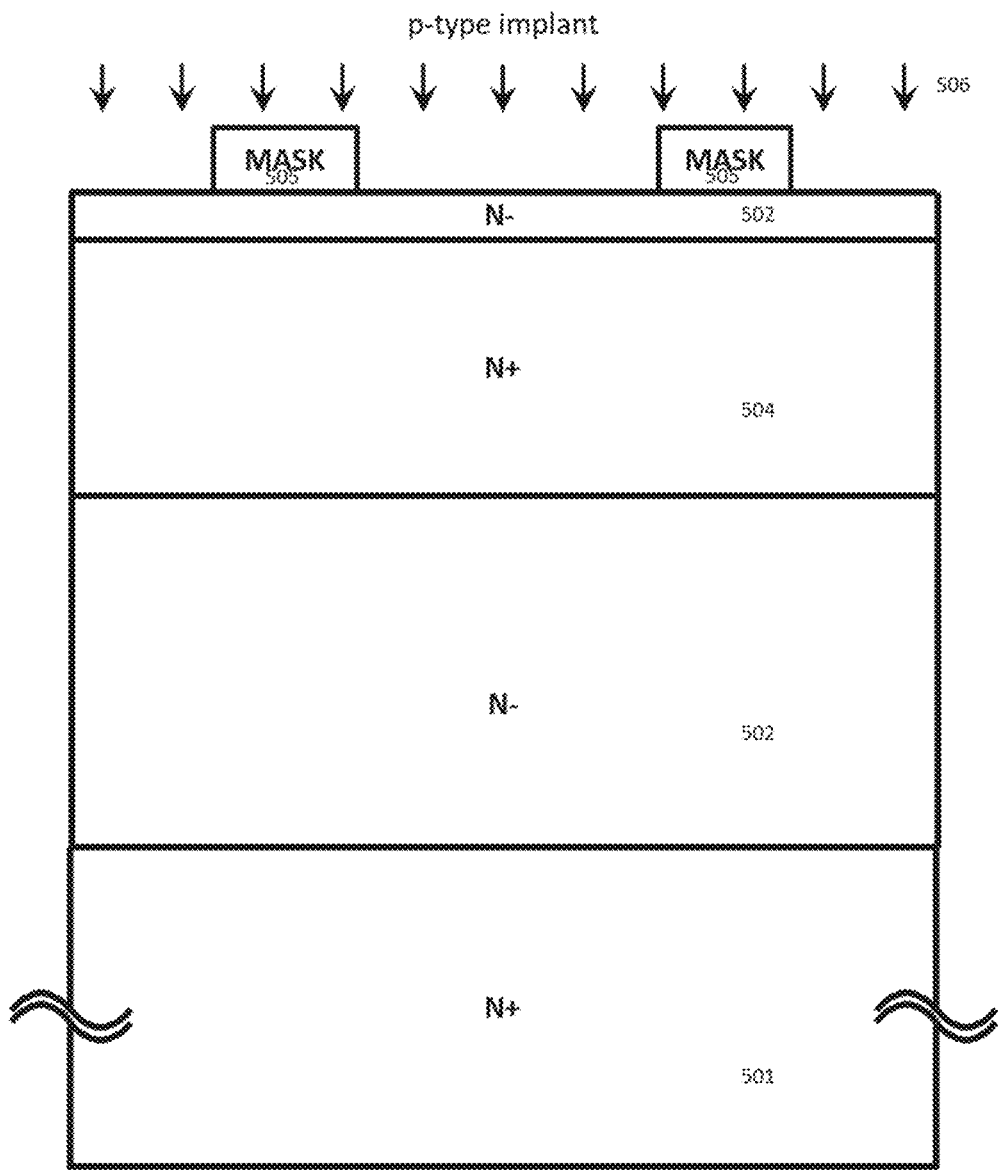
Figure 5F:
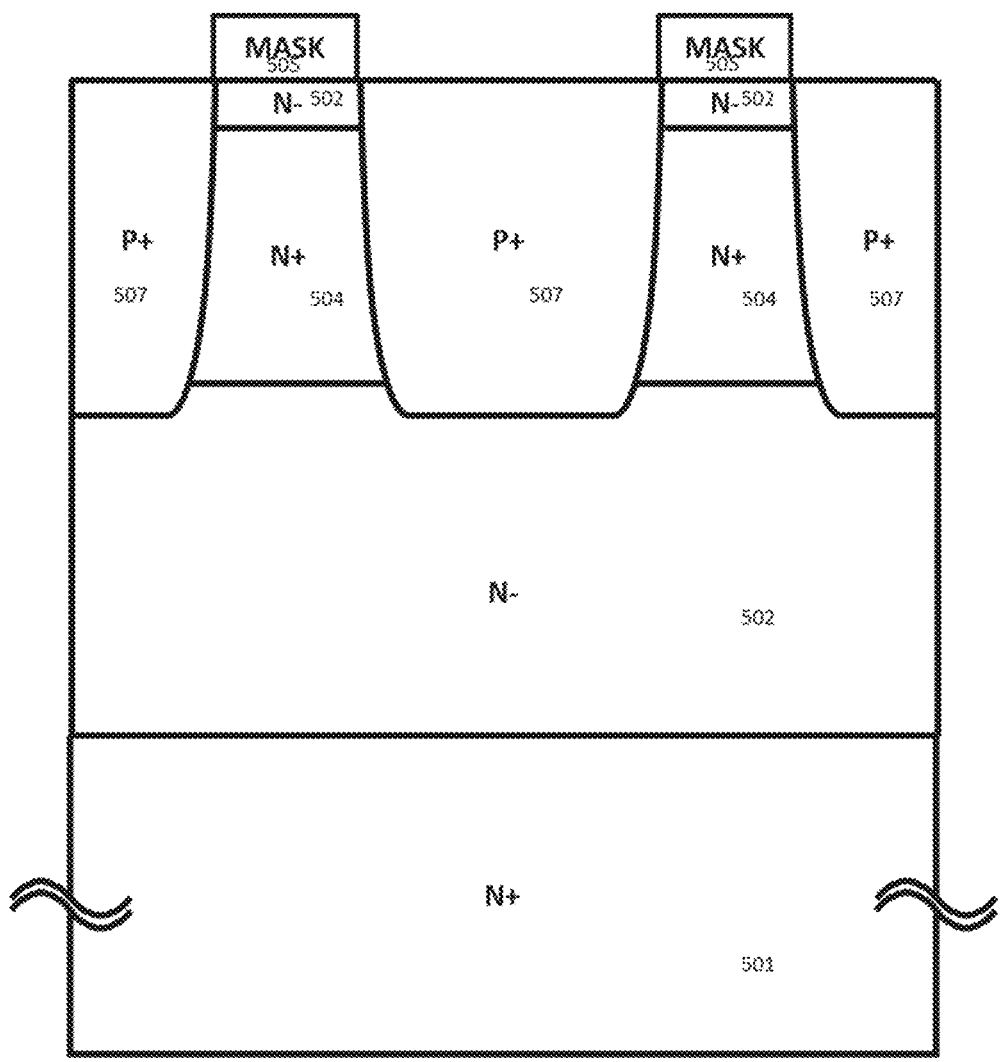
Figure 5G:
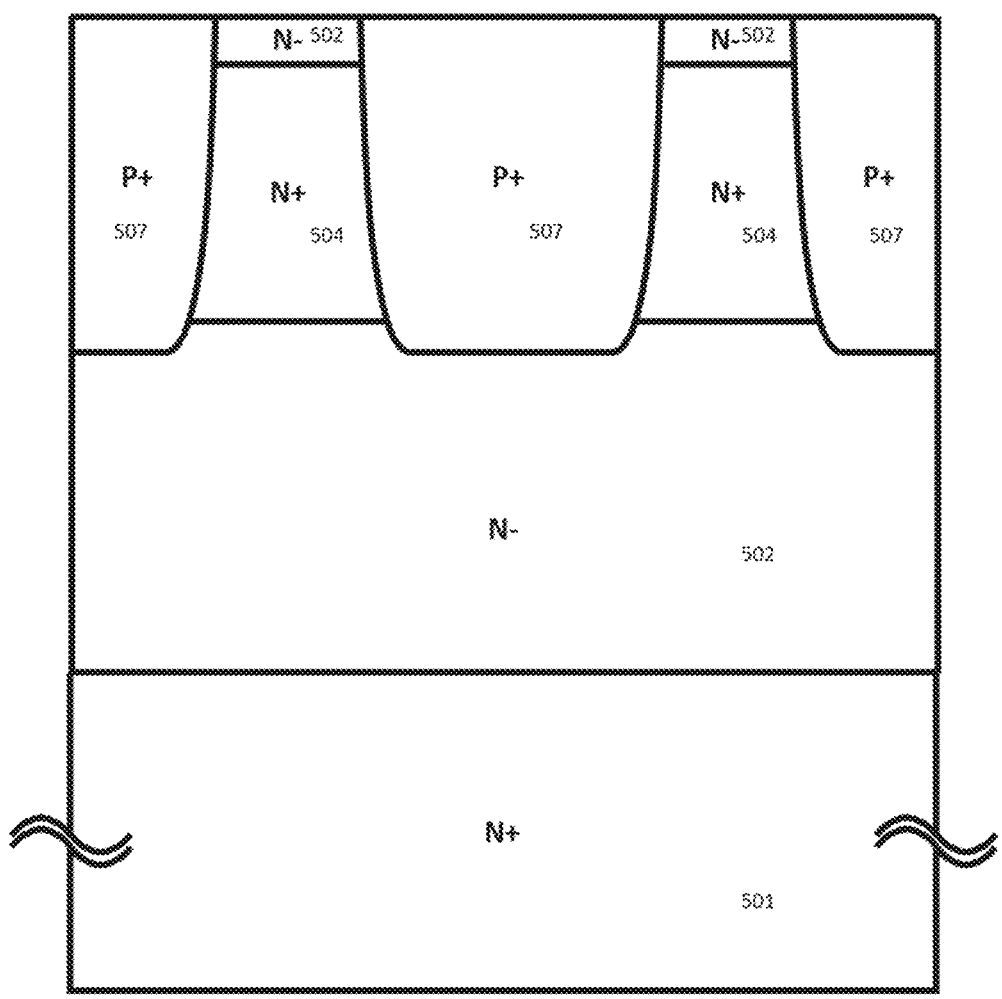

A patterned mask 505, which is preferably a hard mask made of such as an oxide, a nitride, a polysilicon layer, or a combination of these, is formed on the wafer surface in FIG. 5D. The patterned mask must be thick enough to completely block any high energy impurities during the subsequent ion implant step. A p-type ion implantation step with a p-type impurity 506 such as aluminum and/or boron is performed in FIG. 5E to form a set of multiple P+ wells 507 in FIG. 5F. The bottoms of the set of multiple P+ wells 507 are formed such that they are below the bottom of the N+ region 504. In the embodiments herein, the depth of the set of multiple P+ wells is greater than the depth of the N+ region. The set of multiple P+ wells leads to a P+ region as a whole in FIG. 5F. The edge termination region which is not shown may be formed by the p-type ion implantation step. The patterned mask 505 is removed by dry or wet etching process in FIG. 5G. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

Figure 5H:
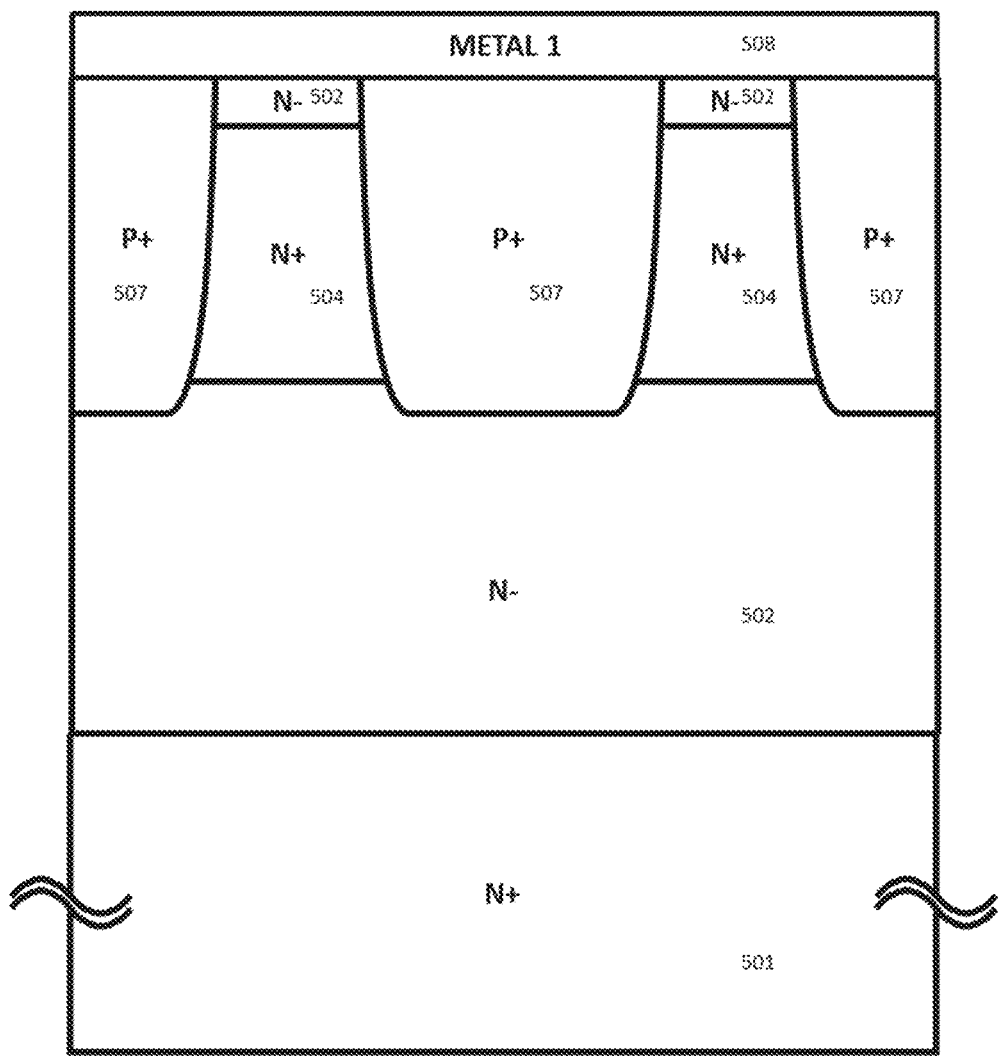
Figure 51:
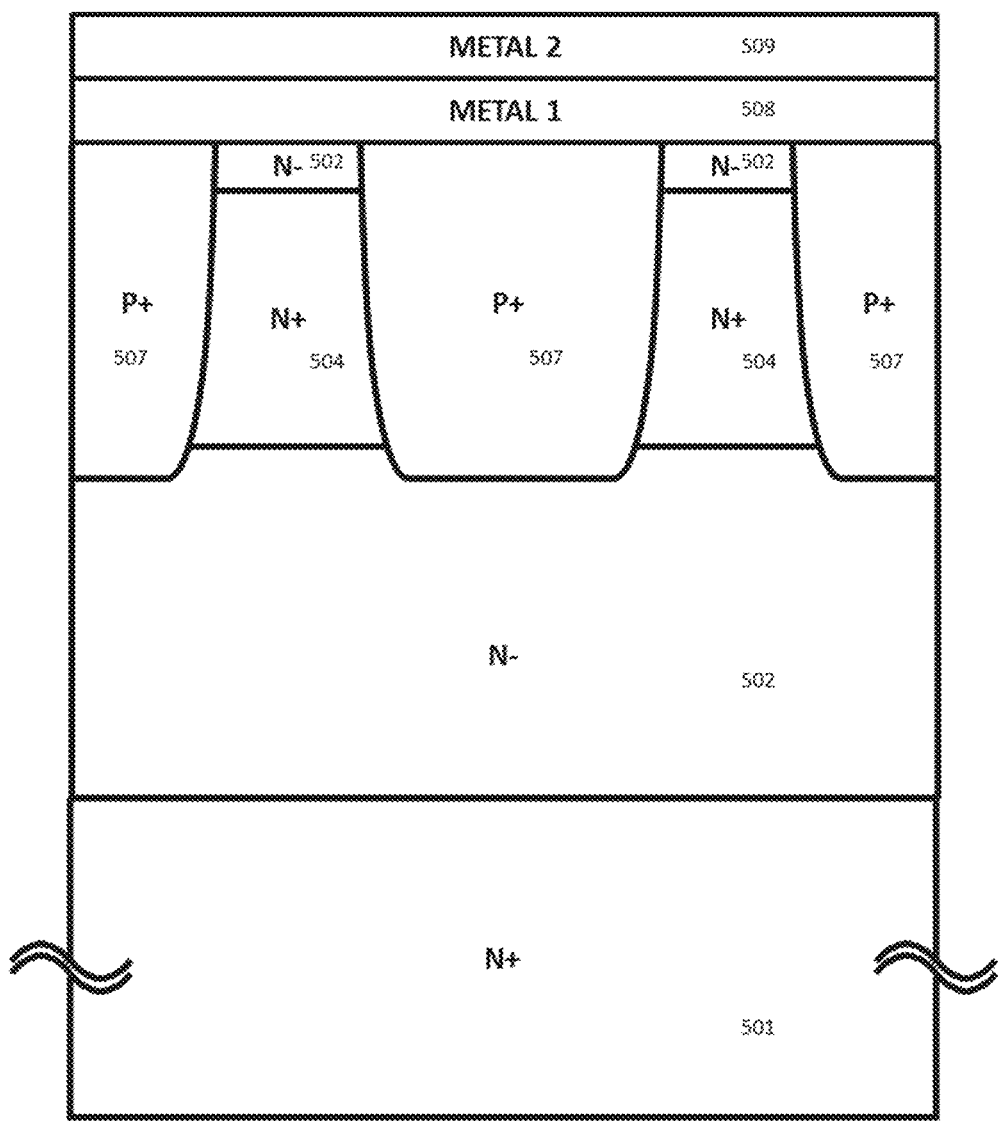
Figure 5J:
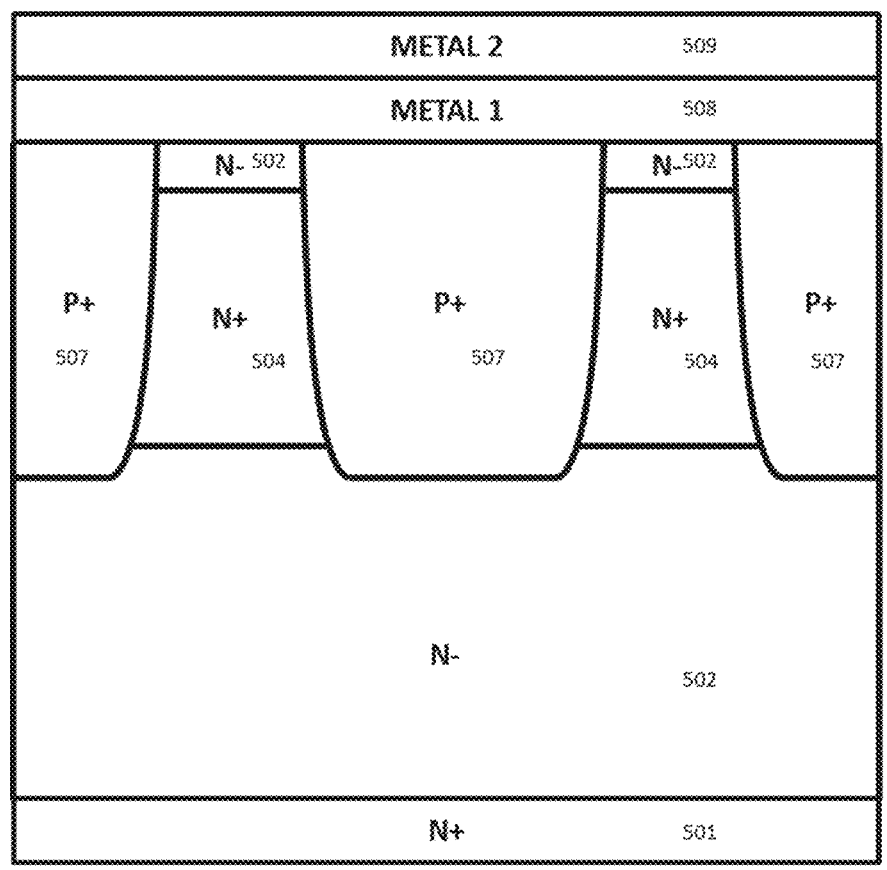

The Schottky contact is formed on the wafer surface by depositing a Schottky metal 508 marked as METAL 1 directly on the wafer surface in FIG. 5H. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 509 marked as METAL 2 is then deposited on top of the wafer in FIG. 5I and patterned by dry etching, wet etching, or lift-off. The first pad metal can be of Aluminum/Aluminum-based alloy. The wafer is then thinned from its back side until its thickness reaches to a target thickness of 100~200 μm in FIG. 5J. The thickness may be further reduced in the future when the wafer thinning technology improves and provides the target thickness less than the aforementioned 100~200 μm. The wafer thinning can be accomplished by CMP, wet etching, dry etching, or a combination of the aforementioned grinding techniques with a proper protective coating at the front side of the wafer.

Figure 5K:
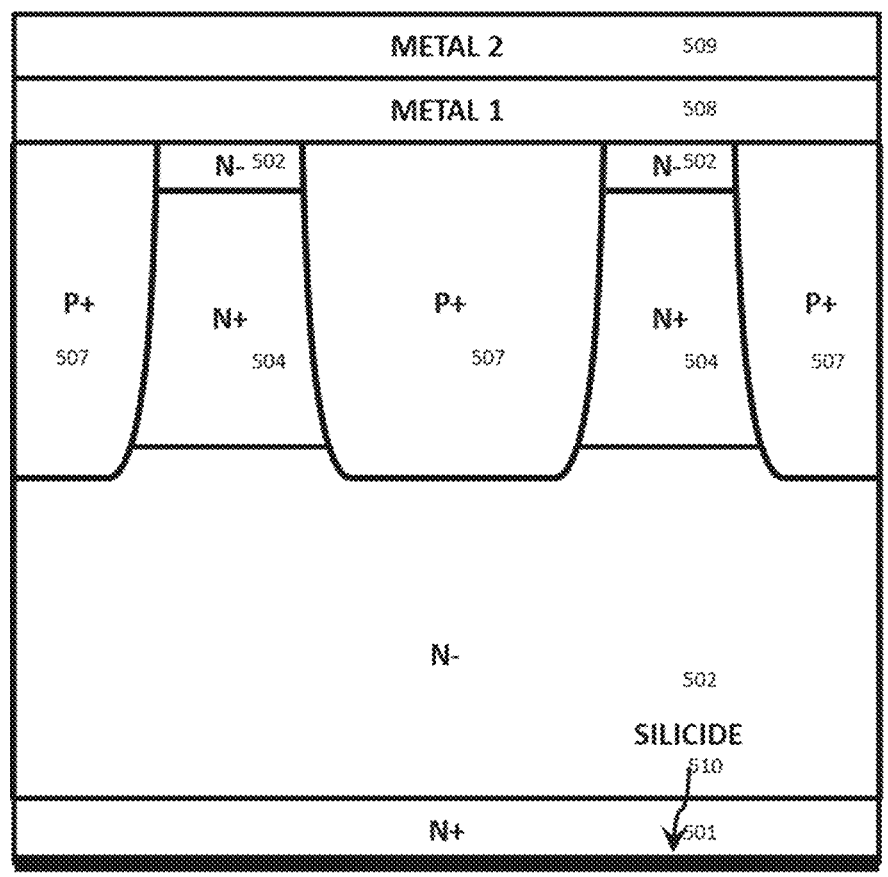
Figure 5L:
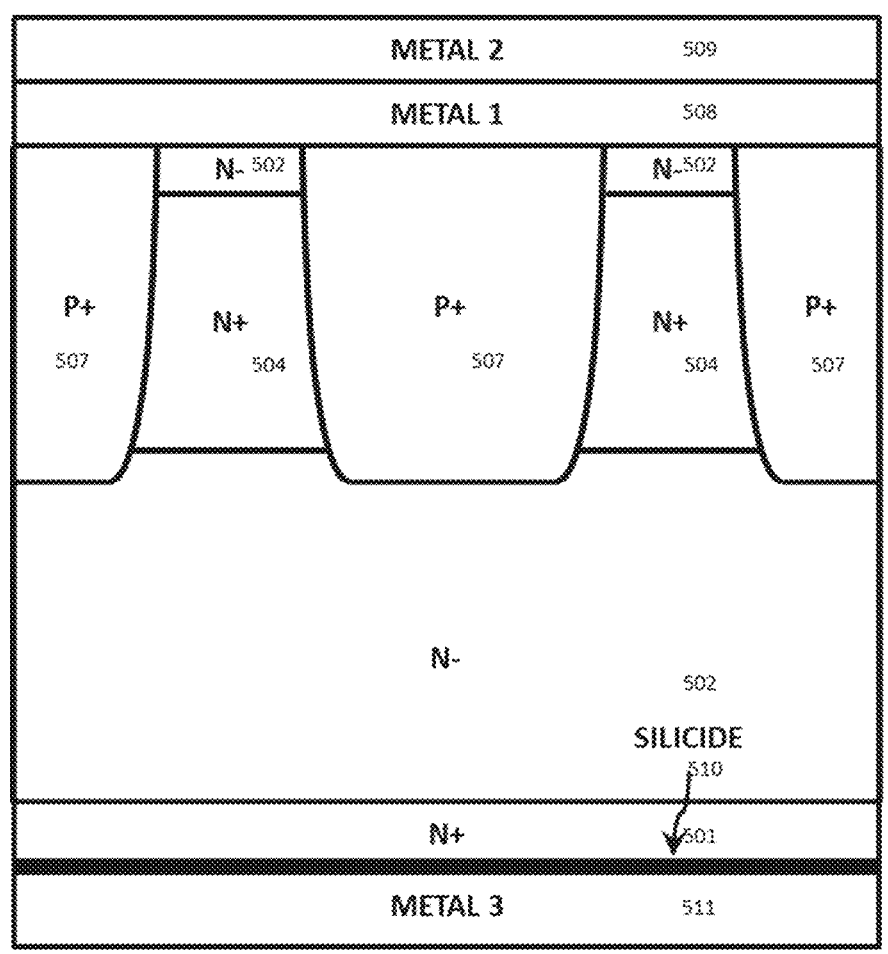

A silicide region 510 on the back side of the wafer is then formed in FIG. 5K. The silicide region is required to form a good ohmic contact on the back side of the wafer. The silicide region is formed by depositing ohmic metal stack and annealing the wafer by using a laser annealing technique as an example. A second pad metal 511 marked as METAL 3 is formed on the back side of the wafer in FIG. 5L. The second pad metal can be of Aluminum or Aluminum-based alloy. After the second pad metal step is finished, a protective coating process step may be followed on top of the wafer to form a moisture barrier.

Another method to fabricate this embodiment is to use a SiC wafer with multiple n-type epi-grown layers to start with. In this case, the SiC wafer consists of three n-type epi-grown layers in FIG. 5C with different doping concentrations and thicknesses and the N+ substrate at the bottom of the SiC wafer. The three n-type epi-grown layers should be formed in such a way that an N− layer 502 is meeting a device side of the wafer and an N+ layer 504 is positioned right underneath the N− layer, where the N+ layer is on top of a second N− layer also labeled 502 which serves as a drift region and the second N− layer is positioned on top of the N+ substrate 501.

When the SiC wafer with the aforementioned epi structure is prepared, a patterned mask 505, which is preferably a hard mask made of such as an oxide, a nitride, a polysilicon layer, or a combination of these, is formed on the wafer surface in FIG. 5D. The patterned mask must be thick enough to completely block any high energy impurities during the subsequent ion implant step. A p-type ion implantation step with a p-type impurity 506 such as aluminum and/or boron is performed in FIG. 5E to form a set of multiple P+ wells 507 in FIG. 5F. The bottoms of the set of multiple P+ wells 507 are formed such that they are below the bottom of the N+ region 504. In the embodiments herein, the depth of the set of multiple P+ wells is greater than the depth of the N+ region. The set of multiple P+ wells leads to a P+ region as a whole in FIG. 5F. The edge termination region which is not shown may be formed by the p-type ion implantation step. The patterned mask 505 is removed by dry or wet etching process in FIG. 5G. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 508 marked as METAL 1 directly on the wafer surface in FIG. 5H. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 509 marked as METAL 2 is then deposited on top of the wafer in FIG. 5I and patterned by dry etching, wet etching, or lift-off. The first pad metal can be of Aluminum/Aluminum-based alloy. The wafer is then thinned from its back side until its thickness reaches to a target thickness of 100~200 μm in FIG. 5J. The thickness may be further reduced in the future when the wafer thinning technology improves and provides the target thickness less than the aforementioned 100~200 μm. The wafer thinning can be accomplished by CMP, wet etching, dry etching, or a combination of the aforementioned grinding techniques with a proper protective coating at the front side of the wafer.

A silicide region 510 on the back side of the wafer is then formed in FIG. 5K. The silicide region is required to form a good ohmic contact on the back side of the wafer. The silicide region is formed by depositing ohmic metal stack and annealing the wafer by using a laser annealing technique as an example. A second pad metal 511 marked as METAL 3 is formed on the back side of the wafer in FIG. 5L. The second pad metal can be of Aluminum or Aluminum-based alloy. After the second pad metal step is finished, a protective coating process step may be followed on top of the wafer to form a moisture barrier.

The embodiment shown in FIG. 4 affords lower leakage current and better blocking performance than embodiment shown in FIG. 2A, by further reducing the electrical field at the Schottky metal interface, but may trade-off a higher on-state voltage drop as compared to the embodiment shown in FIG. 2A.

The devices of embodiments shown in FIG. 6A to FIG. 6F are the cross-sectional schematic of SiC MPS diode. The key regions of these device are an N+ substrate 601 at the bottom which gives mechanical support of the wafer and is ~350 μm-thick. An N− drift region 602 which is usually an epi layer and is on top of the N+ substrate. The device has a first metal layer 605 denoted as METAL 1, which is the Schottky metal to an N-type SiC semiconductor region and forms Schottky contact to its underlying N-type regions. The device has a second metal layer 606 denoted as METAL 2 on the front side of the wafer which is in contact with the METAL 1. METAL 2 is often called "power metal" and is usually in Aluminum. There is a silicide layer 607 under the bottom of the N+ substrate. There is a third metal layer 608 denoted as METAL 3 under the back side of the wafer which is in contact with the silicide layer. The devices of embodiments in FIG. 6A to FIG. 6F differs from the ones shown in embodiments FIG. 2A and FIG. 4 because the N+ region in the previous embodiments is replaced by a set of multiple N sub-regions 603 arranged in layers. The thickness and doping concentration in each of these sub-regions may be different. Similarly the P+ region of devices in embodiments of FIG. 2A and FIG. 4 is replaced by a set of multiple layered P sub-regions. The doping concentration in each slice may be preferably designed.

The devices in embodiments shown in FIG. 6A to FIG. 6F have the N+ region 603 which is interspersed between a set of multiple P+ wells 604. There are several potential examples of the embodiment shown in FIG. 6A to FIG. 6F including a device with a set of multiple N-type sub-layers with different thicknesses and doping concentrations but a set of multiple p-type wells which are of the same kind as in FIG. 6A and FIG. 6B, a device with a set of multiple P-type sub-layers with different thicknesses and doping concentrations but a single N-type layer serving as the N+ region as in FIG. 6C and FIG. 6D, a device with a set of multiple N-type sub-layers and a set of multiple P-type sub-layers with different thicknesses and doping concentrations as in FIG. 6E and FIG. 6F. Devices in FIG. 6A, FIG. 6C and FIG. 6E have the N+ region 603 surrounding and under the P+ wells 604, and devices in FIG. 6Bb, FIG. 6D and FIG. 6F have the N+ region 603 placed in between the P+ wells but not surrounding the P+ wells 604. The physical separation of the N+ region from a SiC wafer surface is a critical feature of the embodiment described herein and distinguishes it from other similar inventions. A part of the SiC wafer which is in contact with a Schottky metal 605 denoted as METAL 1 and is an n-type semiconductor has the same doping concentration of the N− drift 602. In the embodiment described herein, the doping concentration of the n-type SiC semiconductor which is in direct contact with the Schottky metal 605 labeled METAL 1 is critical for reducing the strength of the electric field at the wafer surface, during the high-voltage blocking mode of operation of the SiC MPS diode.

Figure 6A:
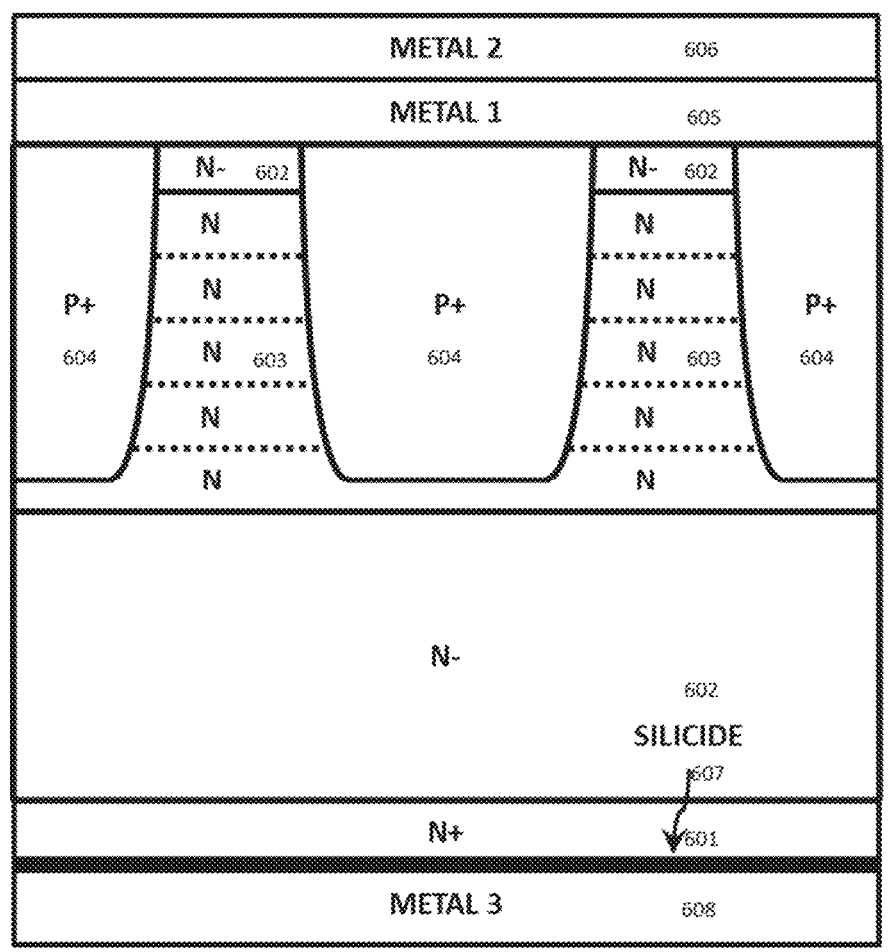
FIG. 6A to FIG. 6F are embodiments of MPS diode structures with multiple N sub-regions, P sub-regions or both FIG. 7AA to FIG. 7AL are cross sectional views showing the process steps for manufacturing the SiC MPS diode shown in FIG. 6A.
Figure 7A:
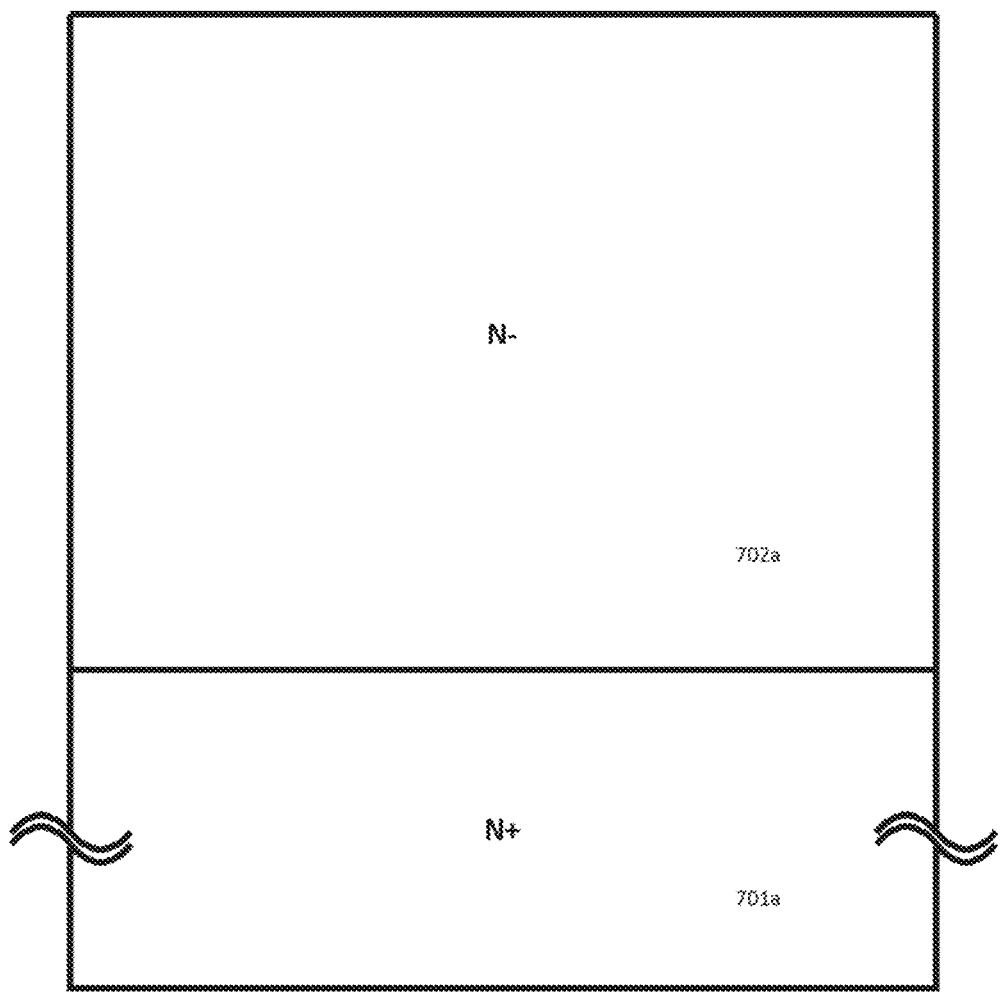
FIG. 7BA to FIG. 7BL are cross sectional views showing the process steps for manufacturing the SiC MPS diode shown in FIG. 6B.
FIG. 7EA to FIG. 7EL are cross sectional views showing the process steps for manufacturing the SiC MPS diode shown in FIG. 6E.
FIG. 7FA to FIG. 7FL are cross sectional views showing the process steps for manufacturing the SiC MPS diode shown in FIG. 6F.
Figure 7A:
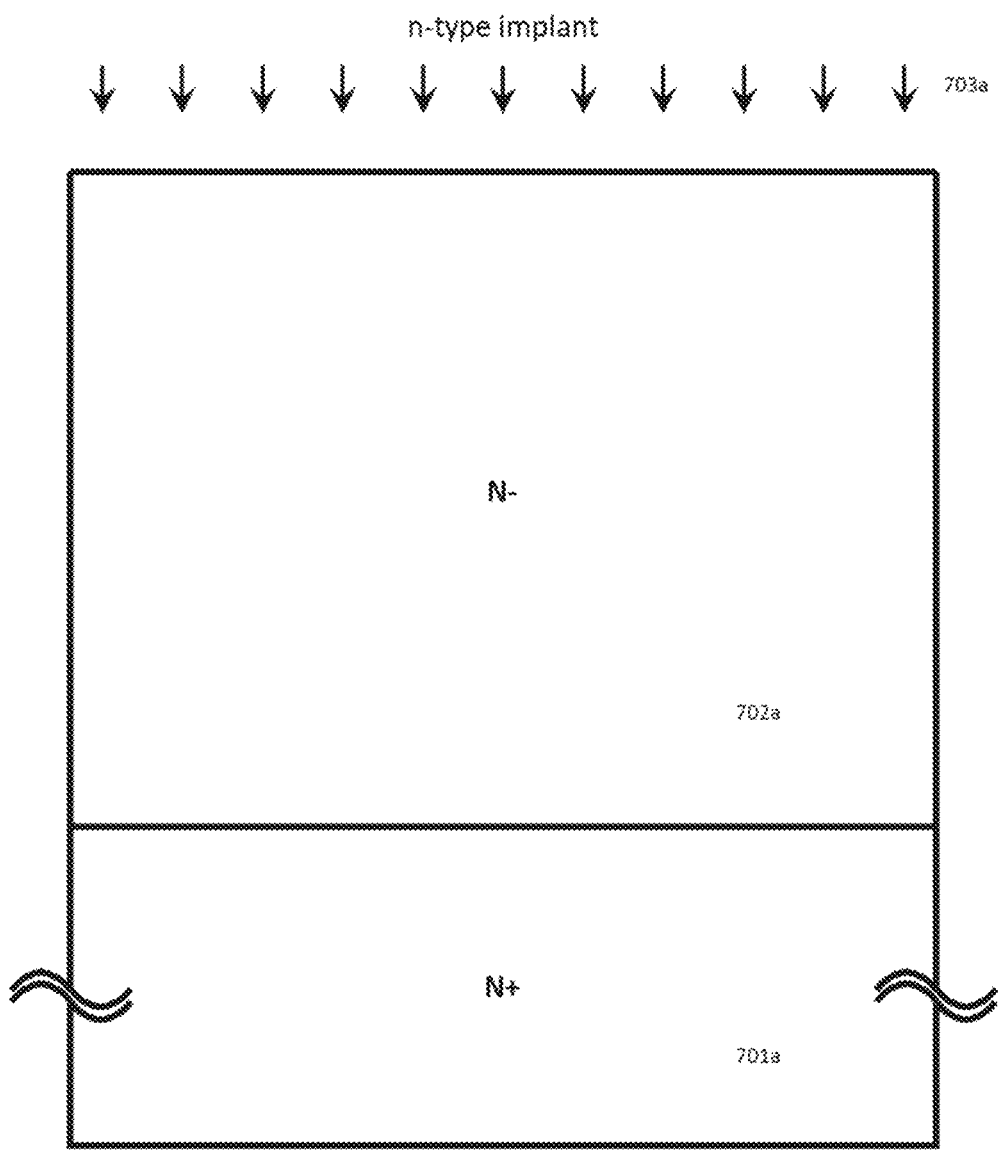
Figure 7A:
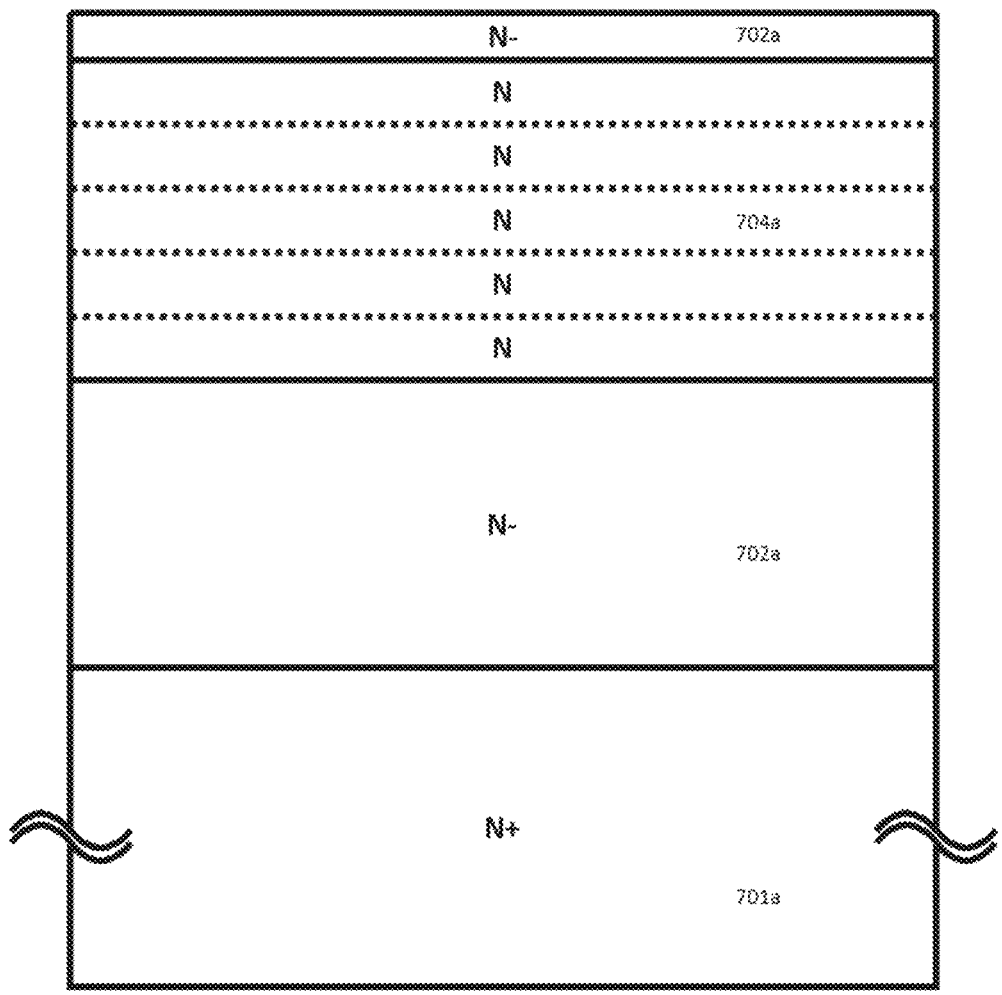
Figure 7A:
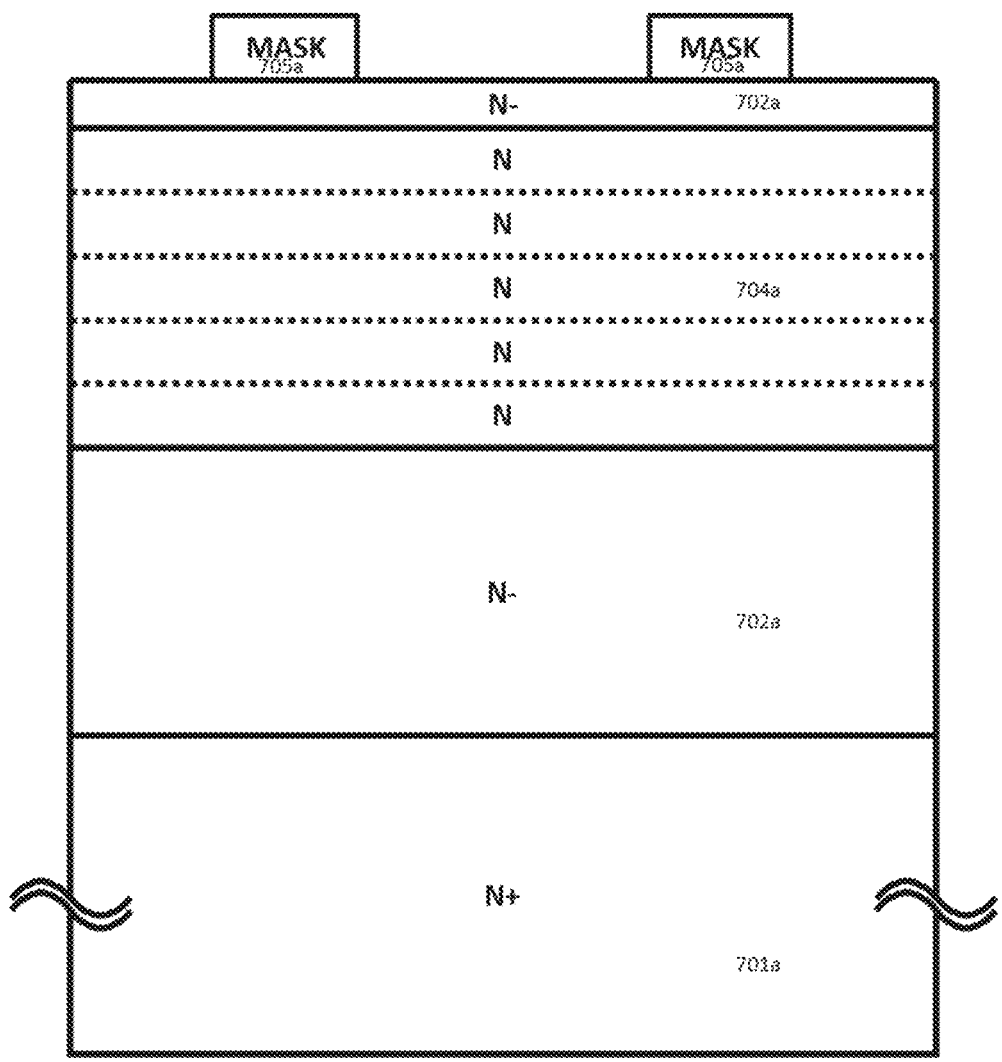
Figure 7A:
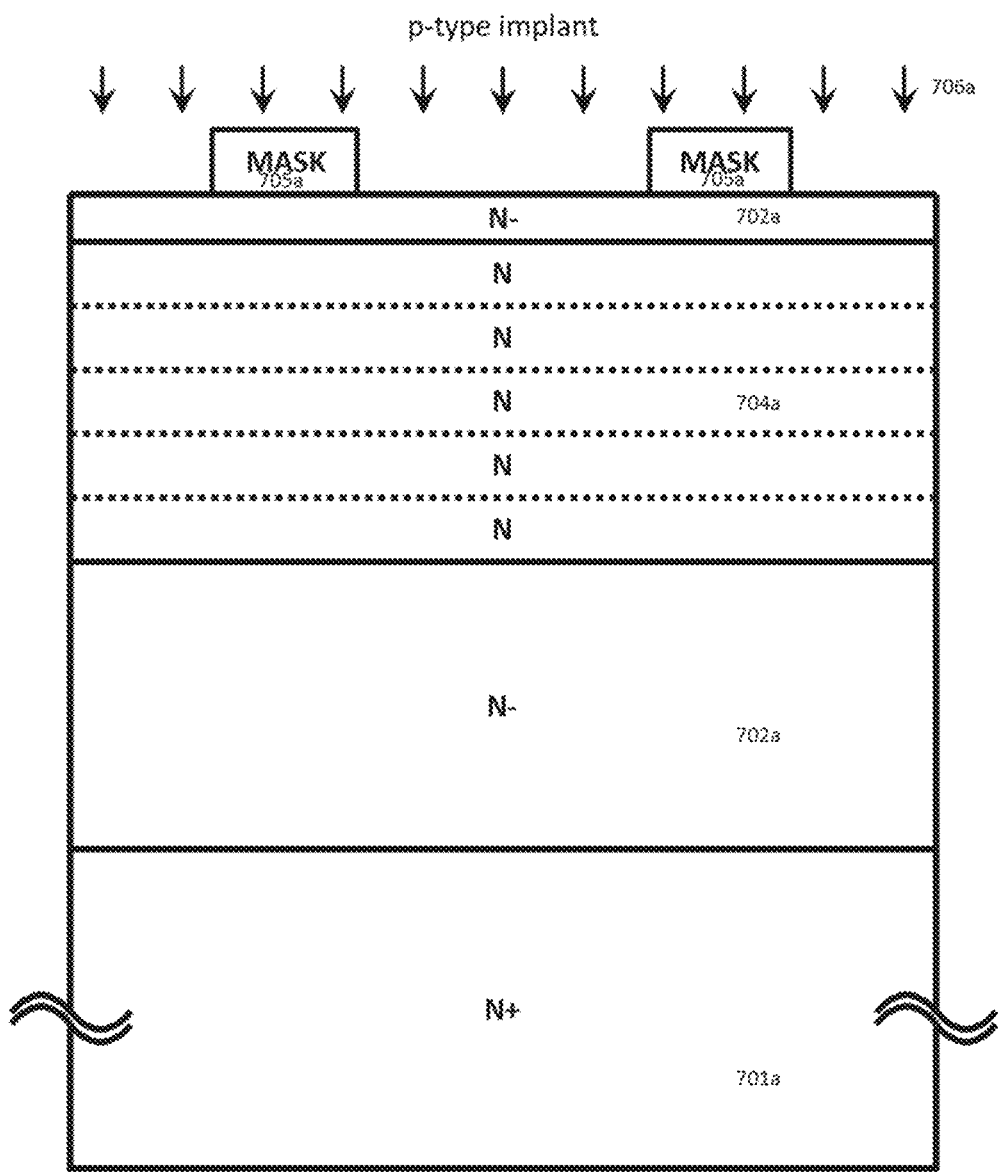
Figure 7A:
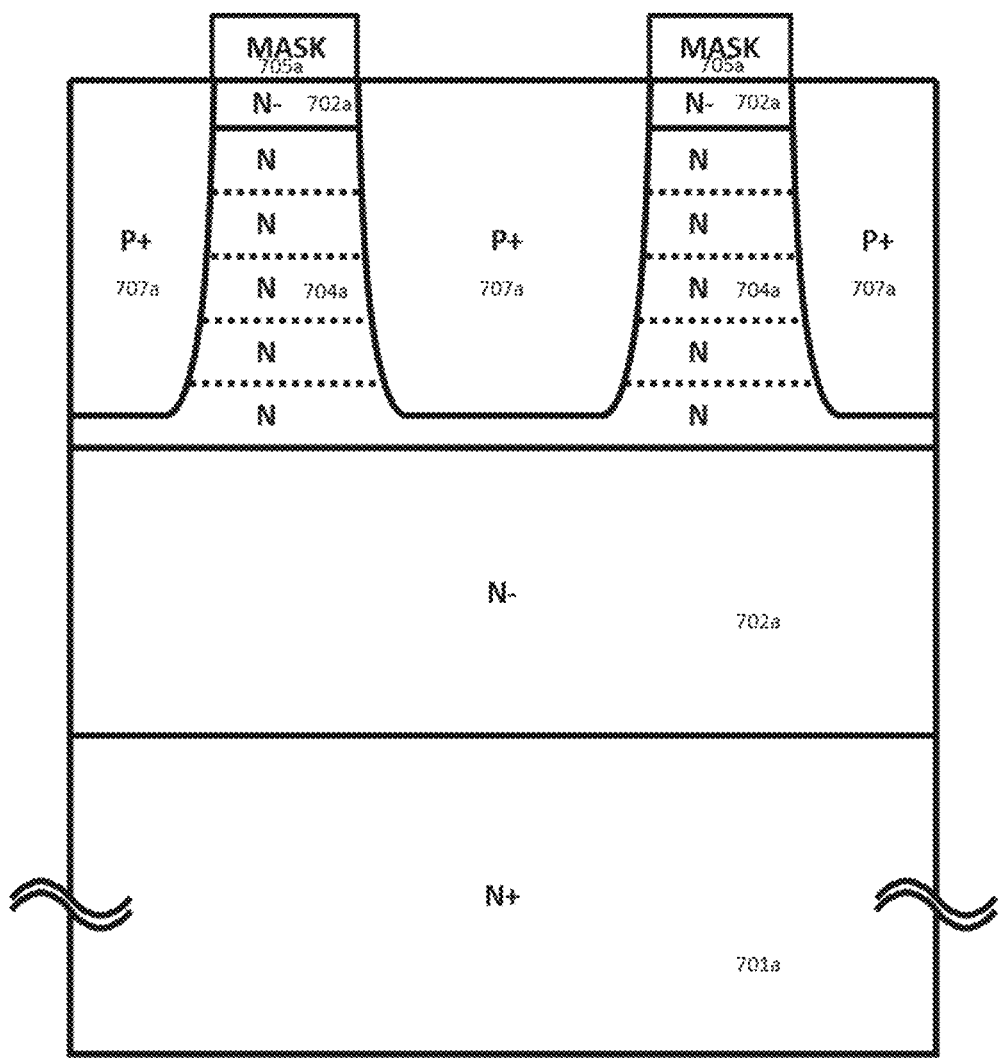
Figure 7A:
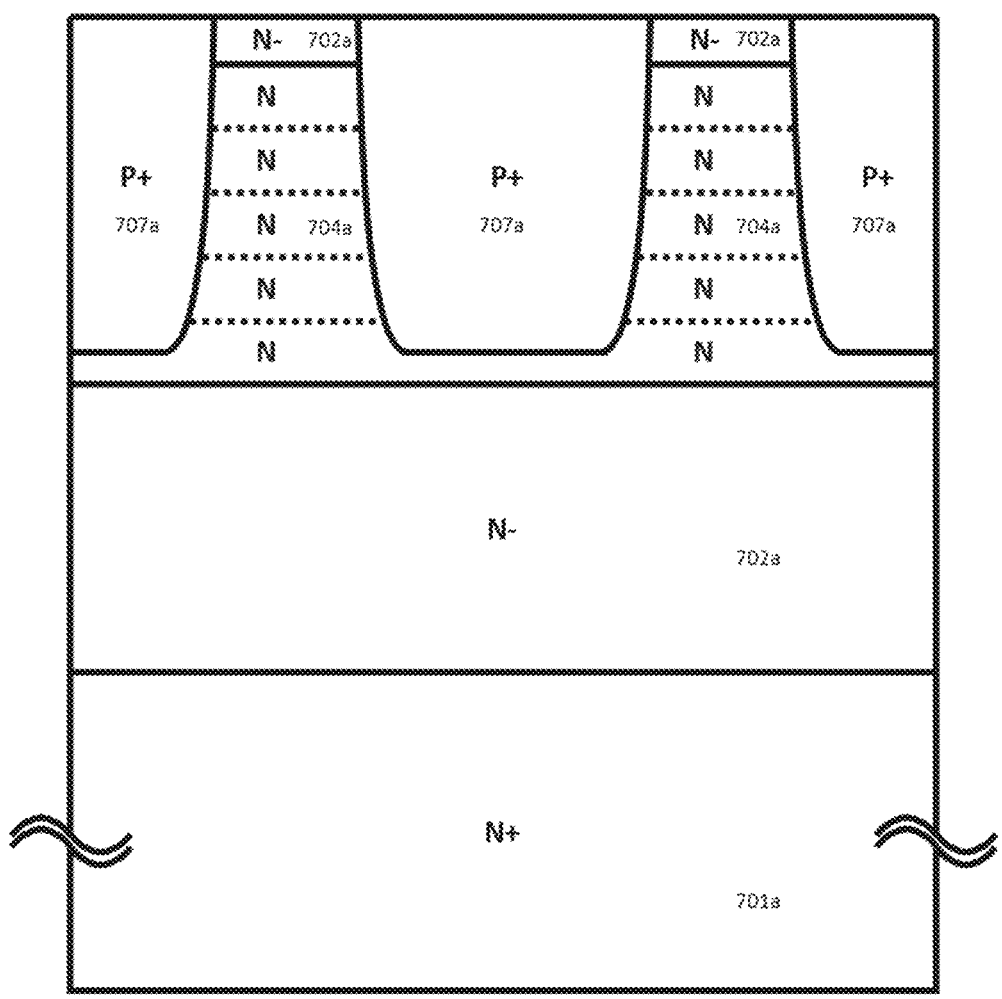
Figure 7A:
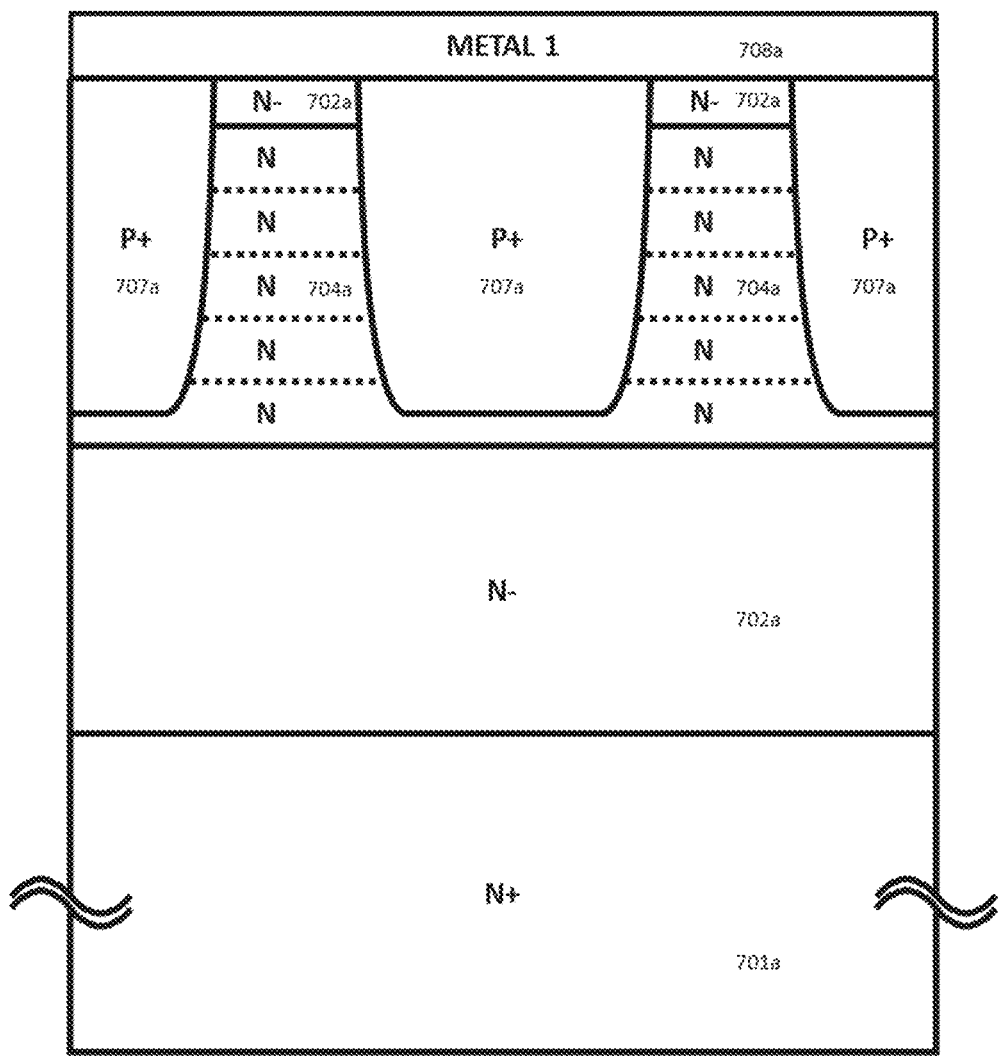
Figure 7A:
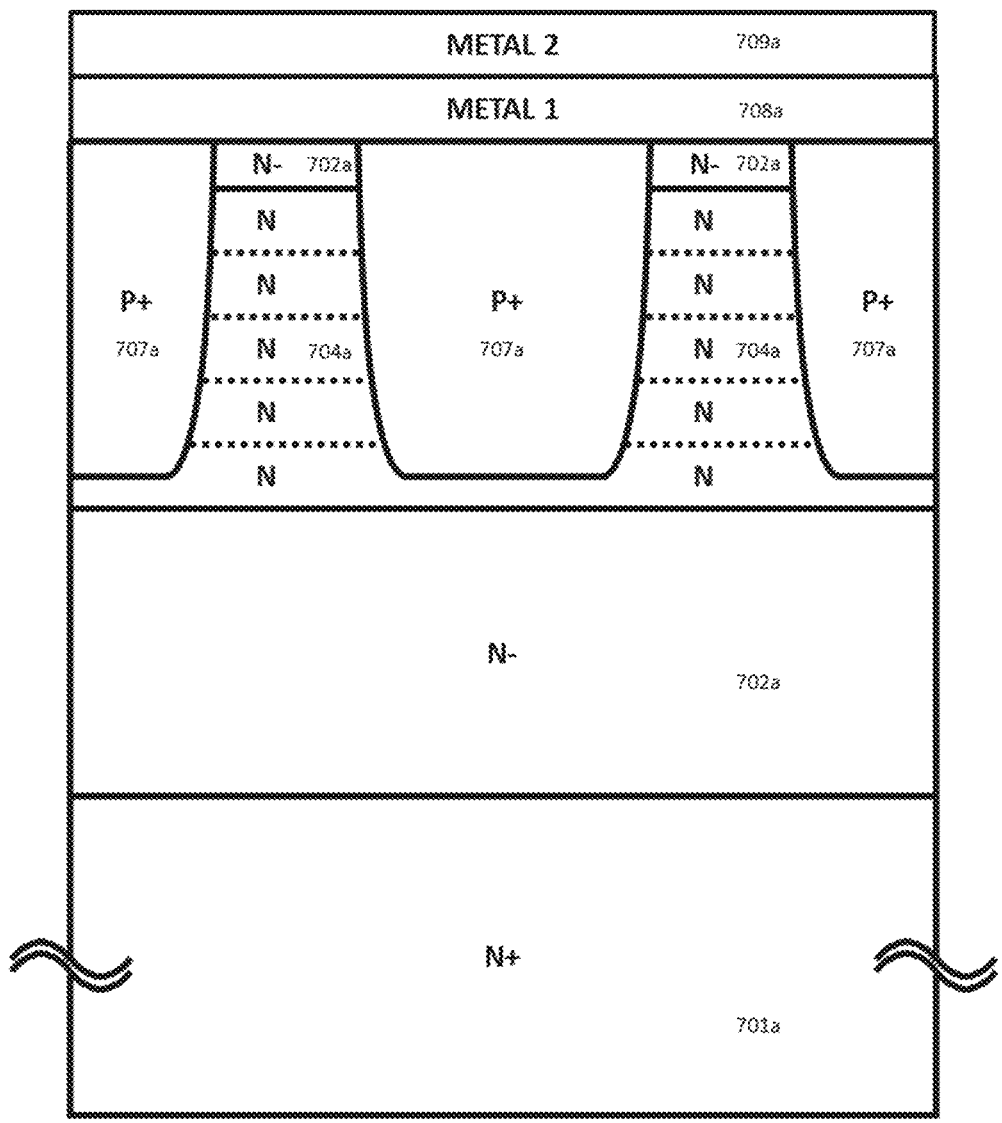
Figure 7A:
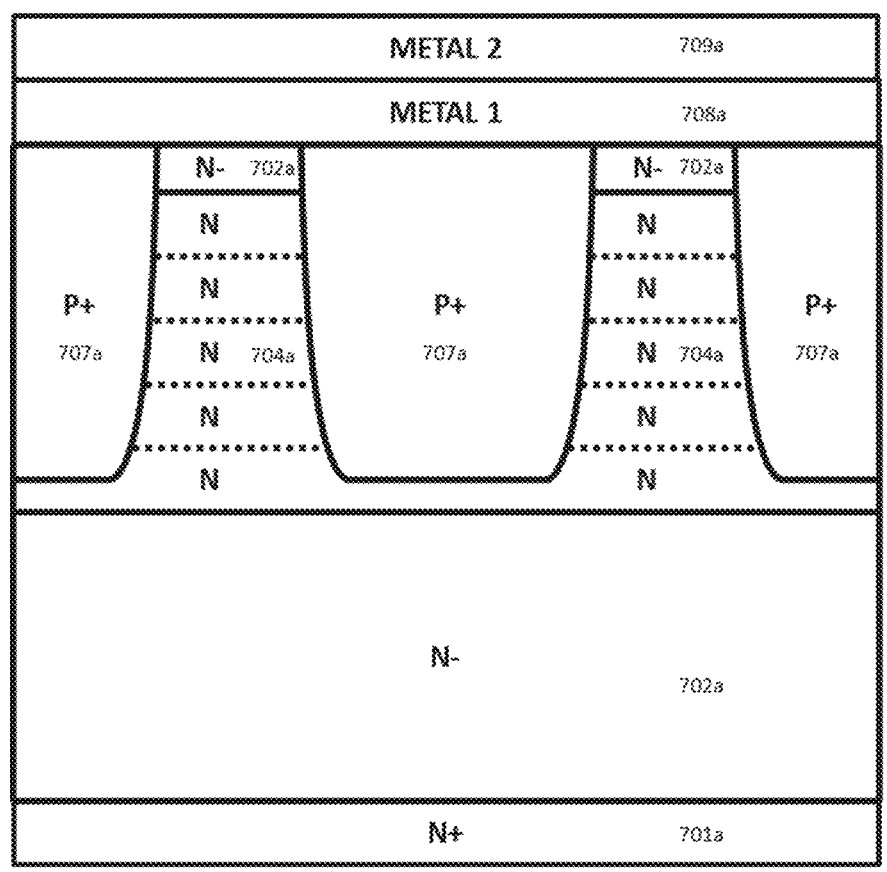
Figure 7A:
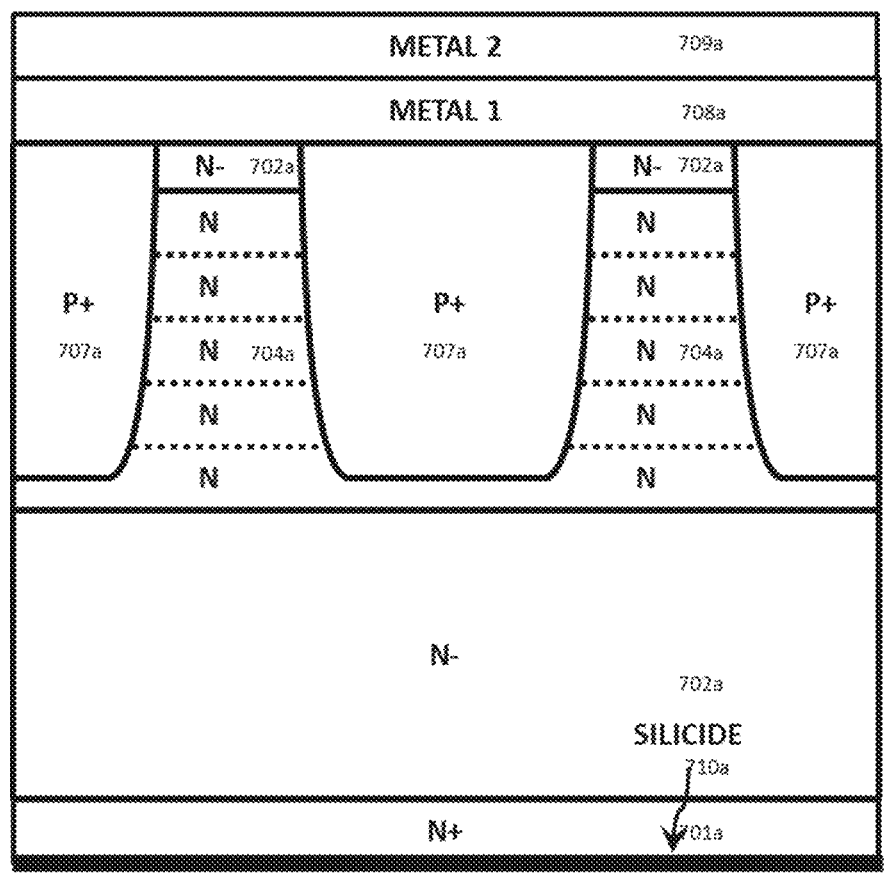
Figure 7A:
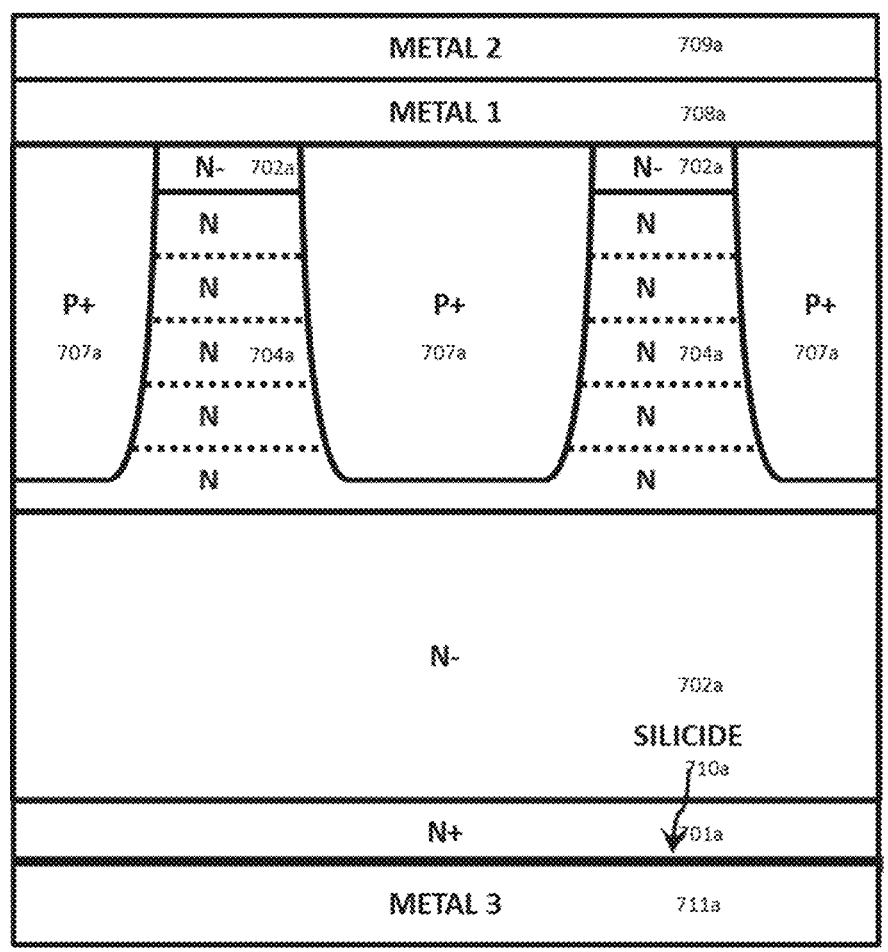

FIG. 7AA to FIG. 7AL describes the process of manufacturing the structure shown in FIG. 6A. The manufacturing process of the device includes preparing a SiC wafer in FIG. 7AA which consists of a highly conductive N+ substrate 701a and an N− drift region 702a, where the N− drift region is typically epi-grown. The N− drift region 702a is designed in such a way that the doping concentration and thickness of the N− drift region are primarily selected based on the required blocking performance. When the SiC wafer is prepared, a set of multiple ion implantation steps with an n-type species 703a such as nitrogen and/or phosphorus is performed onto the active region of the device in FIG. 7AB. The set of multiple ion implantation steps with the n-type species forms a set of sub n-type regions 704a in FIG. 7AC where each sub region is defined by the dotted line in the schematic for indicating the top and bottom of the sub region and all sub regions are interconnected. The interconnected sub regions consist of the N+ region as a whole. The edge termination which is not shown needs to be masked during the set of n-type ion implantation steps. It is important to note that the n-type ion implantation steps 703a needs to be performed in such a fashion that the N+ region 704a is completely buried inside the N− drift region in FIG. 7AC. The ion implantation steps should form the N+ region 704a where the top of the N+ region is physically off from the wafer surface.

A patterned mask 705a, which is preferably a hard mask made of such as an oxide, a nitride, a polysilicon layer, or a combination of these, is formed on the wafer surface in FIG. 7AD. The patterned mask must be thick enough to completely block any high energy impurities during the subsequent ion implant step. A p-type ion implantation step with a p-type impurity 706a such as aluminum and/or boron is performed in FIG. 7AE to form a set of multiple P+ wells 707a in FIG. 7AF. The bottoms of the set of multiple P+ wells 707a are formed such that they are above the bottom of the N+ region 704a. In the embodiments herein, the depth of the set of multiple P+ wells is less than the depth of the N+ region. The set of multiple P+ wells leads to a P+ region as a whole in FIG. 7AF. The edge termination region which is not shown may be formed by the p-type ion implantation step. The patterned mask 705a is removed by dry or wet etching process in FIG. 7AG. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 708a marked as METAL 1 directly on the wafer surface in FIG. 7AH. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 709a marked as METAL 2 is then deposited on top of the wafer in FIG. 7AI and patterned by dry etching, wet etching, or lift-off. The first pad metal can be of Aluminum/Aluminum-based alloy. The wafer is then thinned from its back side until its thickness reaches to a target thickness of 100~200 μm in FIG. 7AJ. The thickness may be further reduced in the future when the wafer thinning technology improves and provides the target thickness less than the aforementioned 100~200 μm. The wafer thinning can be accomplished by CMP, wet etching, dry etching, or a combination of the aforementioned grinding techniques with a proper protective coating at the front side of the wafer.

A silicide region 710a on the back side of the wafer is then formed in FIG. 7AK. The silicide region is required to form a good ohmic contact on the back side of the wafer. The silicide region is formed by depositing ohmic metal stack and annealing the wafer by using a laser annealing technique as an example. A second pad metal 711a marked as METAL 3 is formed on the back side of the wafer in FIG. 7AL. The second pad metal can be of Aluminum or Aluminum-based alloy. After the second pad metal step is finished, a protective coating process step may be followed on top of the wafer to form a moisture barrier.

Another method to fabricate this embodiment is to use a SiC wafer with multiple n-type epi-grown layers to start with. In this case, the SiC wafer consists of multiple n-type epi-grown layers in FIG. 7AC with different doping concentrations and thicknesses and the N+ substrate at the bottom of the SiC wafer. On top of the N+ substrate 701a, an N− drift layer 702a can be epi-grown for serving as a drift/blocking layer. On top of the N− drift layer, a number of n-type epilayers can be grown to form an N+ region 704a as a whole which consists of a set of sub n-type regions where each sub region is defined by different doping concentration and thickness and all sub regions are interconnected. On top of the buried N+ region, an N− layer can be formed which reaches to the surface of the SIC wafer 702a.

When the SiC wafer with the aforementioned epi structure is prepared, a patterned mask 705a, which is preferably a hard mask made of such as an oxide, a nitride, a polysilicon layer, or a combination of these, is formed on the wafer surface in FIG. 7AD. The patterned mask must be thick enough to completely block any high energy impurities during the subsequent ion implant step. A p-type ion implantation step with a p-type impurity 706a such as aluminum and/or boron is performed in FIG. 7AE to form a set of multiple P+ wells 707a in FIG. 7AF. The bottoms of the set of multiple P+ wells 707a are formed such that they are above the bottom of the N+ region 704a. In the embodiments herein, the depth of the set of multiple P+ wells is less than the depth of the N+ region. The set of multiple P+ wells leads to a P+ region as a whole in FIG. 7AF. The edge termination region which is not shown may be formed by the p-type ion implantation step. The patterned mask 705a is removed by dry or wet etching process in FIG. 7AG. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 708a marked as METAL 1 directly on the wafer surface in FIG. 7AH. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 709a marked as METAL 2 is then deposited on top of the wafer in FIG. 7AI and patterned by dry etching, wet etching, or lift-off. The first pad metal can be of Aluminum/Aluminum-based alloy. The wafer is then thinned from its back side until its thickness reaches to a target thickness of 100~200 µm in FIG. 7AJ. The thickness may be further reduced in the future when the wafer thinning technology improves and provides the target thickness less than the aforementioned 100~200 µm. The wafer thinning can be accomplished by CMP, wet etching, dry etching, or a combination of the aforementioned grinding techniques with a proper protective coating at the front side of the wafer.

A silicide region 710a on the back side of the wafer is then formed in FIG. 7AK. The silicide region is required to form a good ohmic contact on the back side of the wafer. The silicide region is formed by depositing ohmic metal stack and annealing the wafer by using a laser annealing technique as an example. A second pad metal 711a marked as METAL 3 is formed on the back side of the wafer in FIG. 7AL. The second pad metal can be of Aluminum or Aluminum-based alloy. After the second pad metal step is finished, a protective coating process step may be followed on top of the wafer to form a moisture barrier.

Figure 6B:
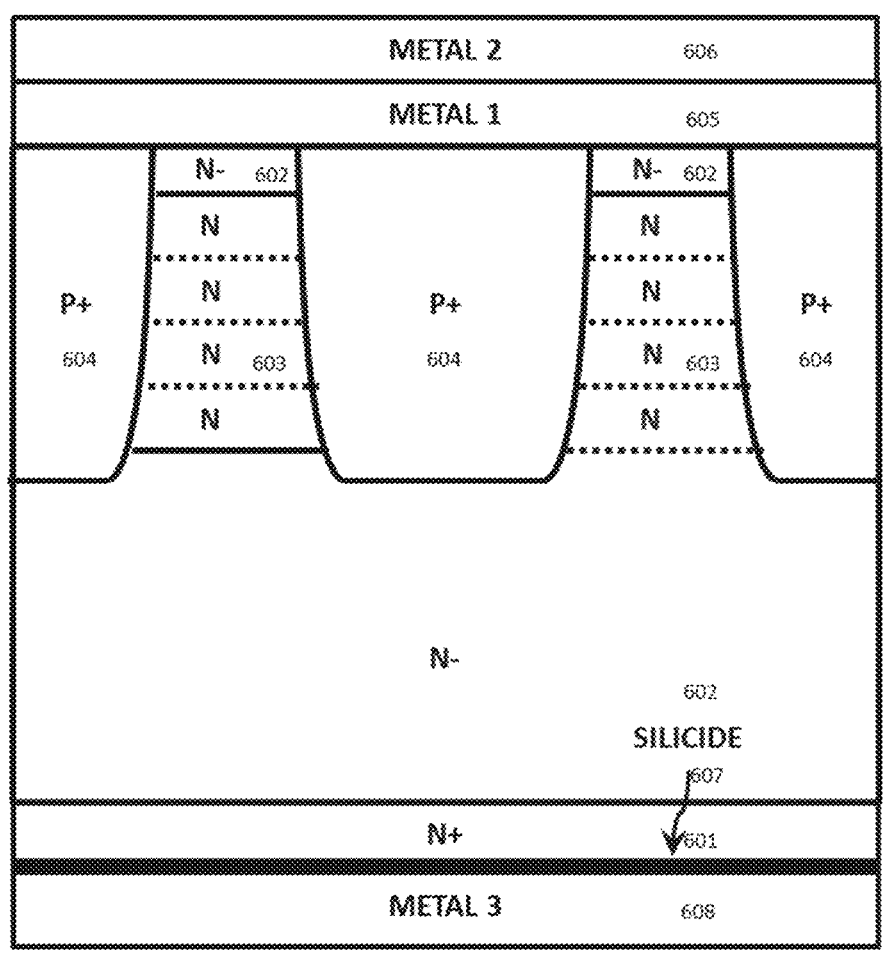
Figure 6C:
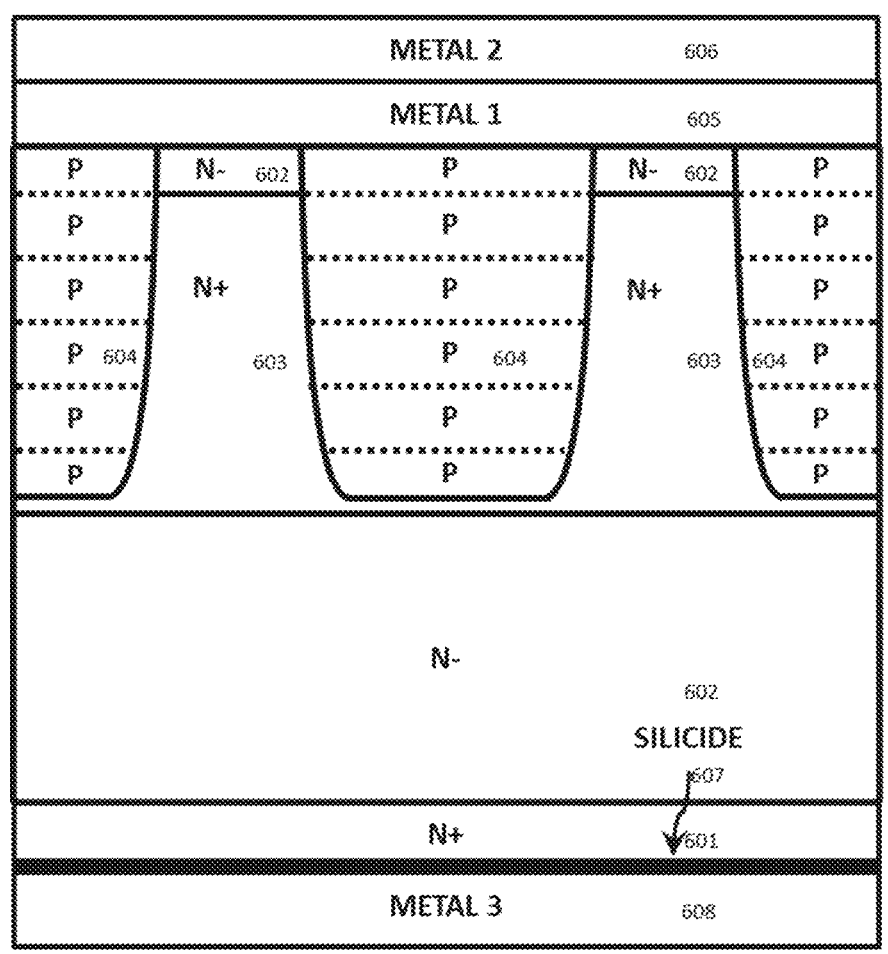
Figure 6D:
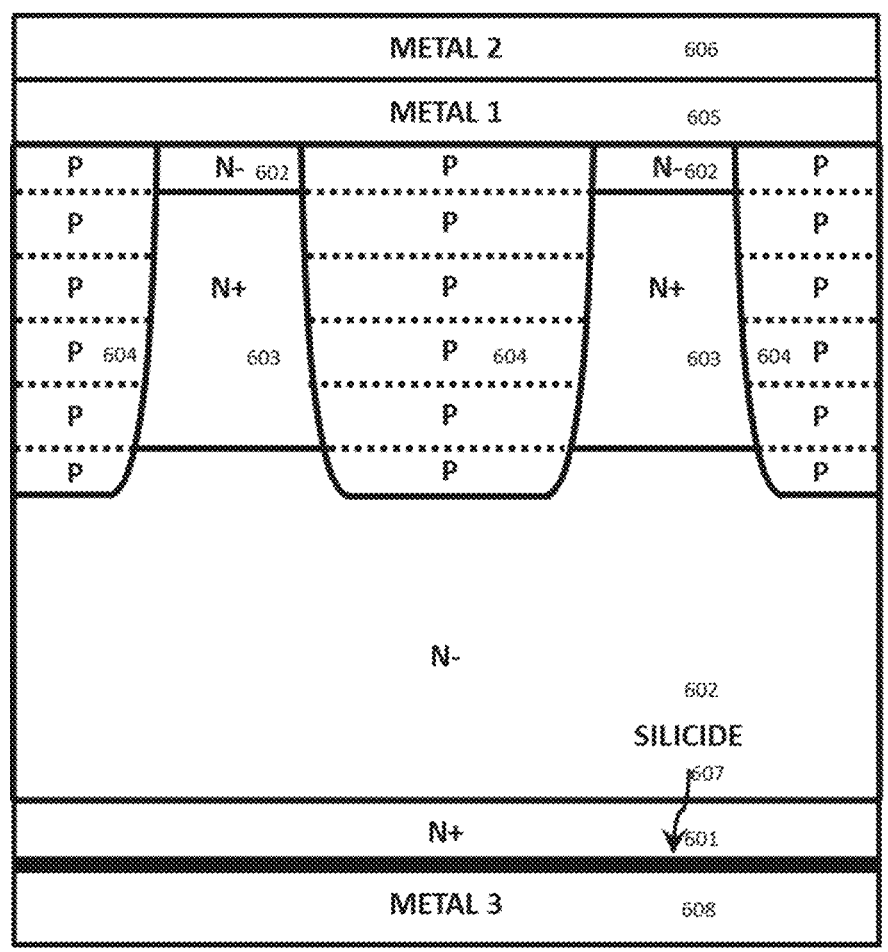
Figure 7B:
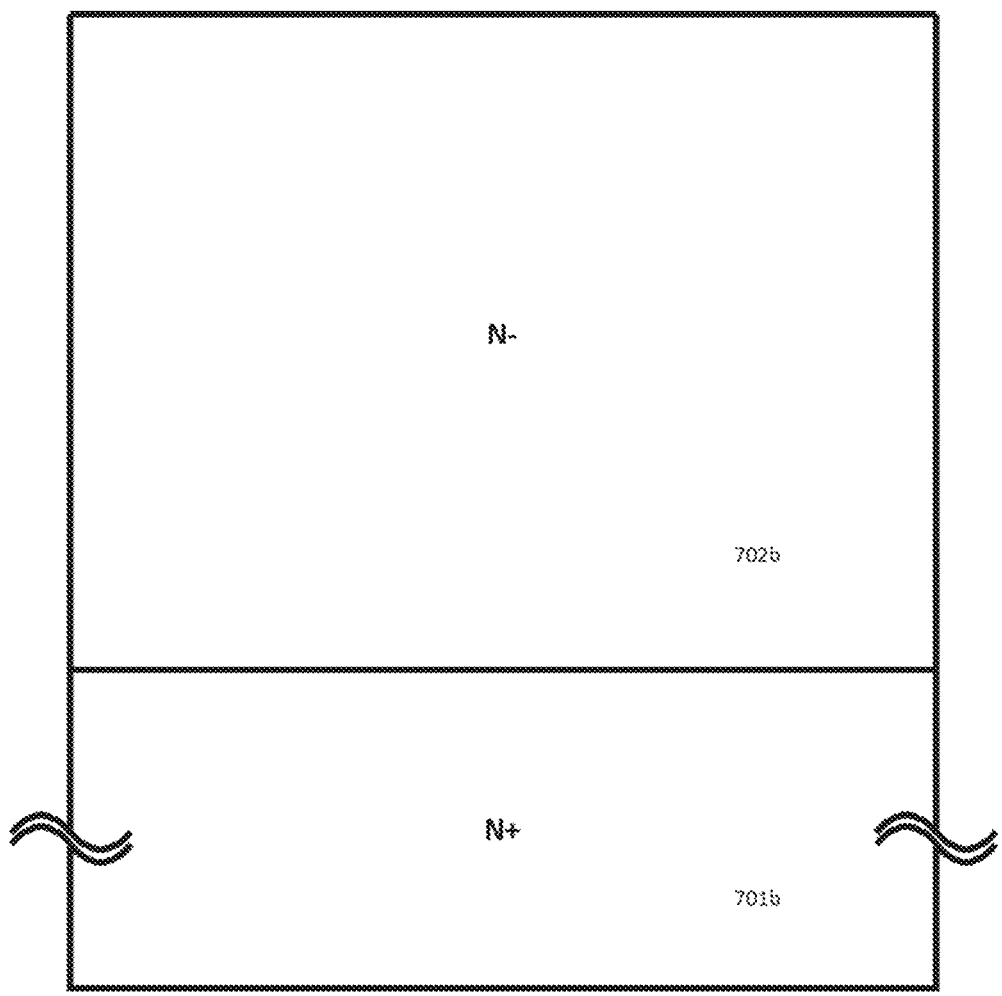
Figure 7B:
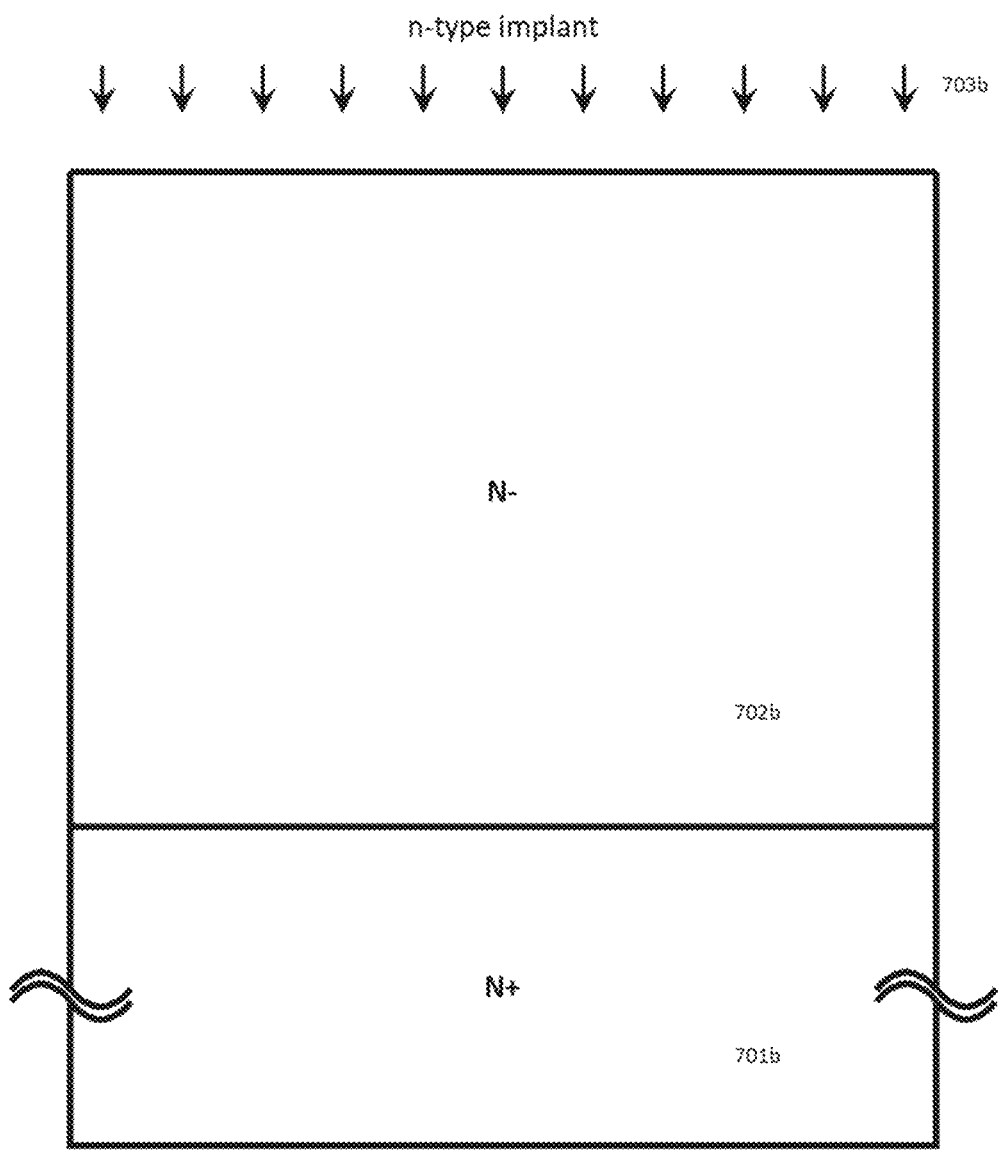
Figure 7B:
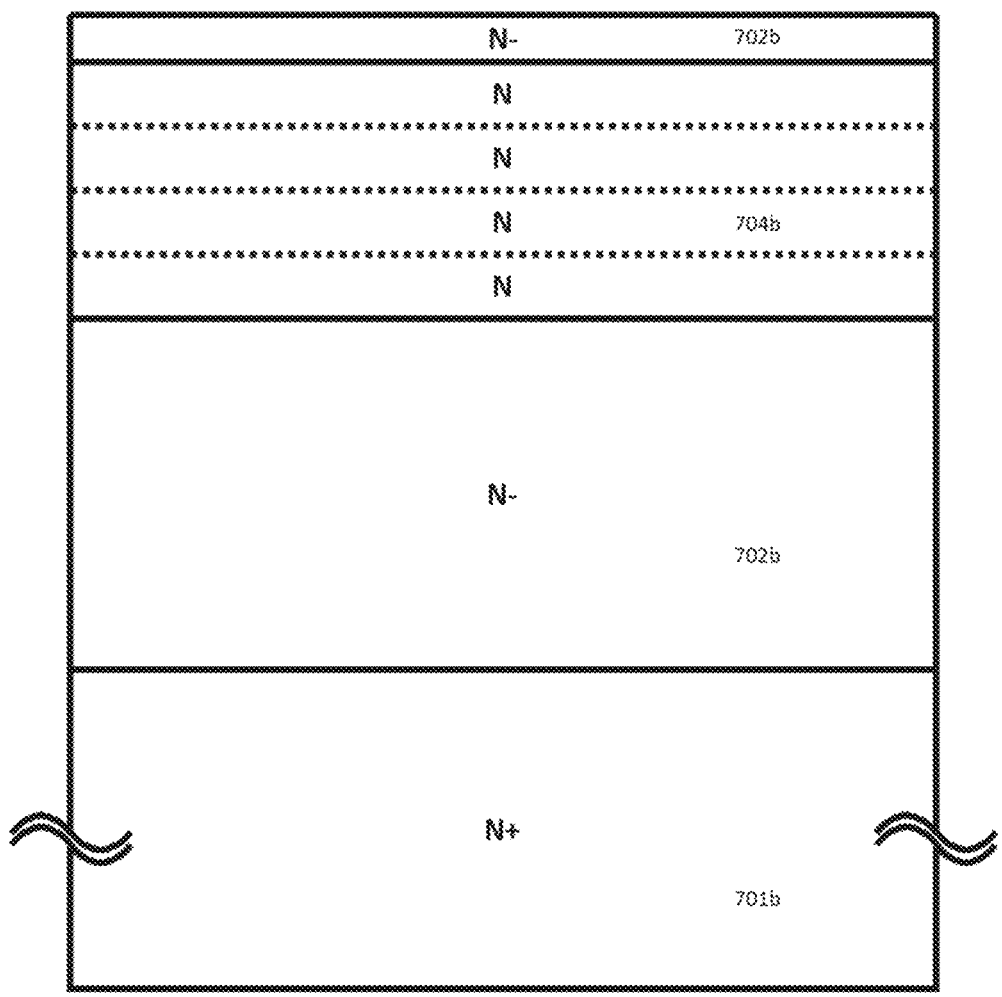
Figure 7B:
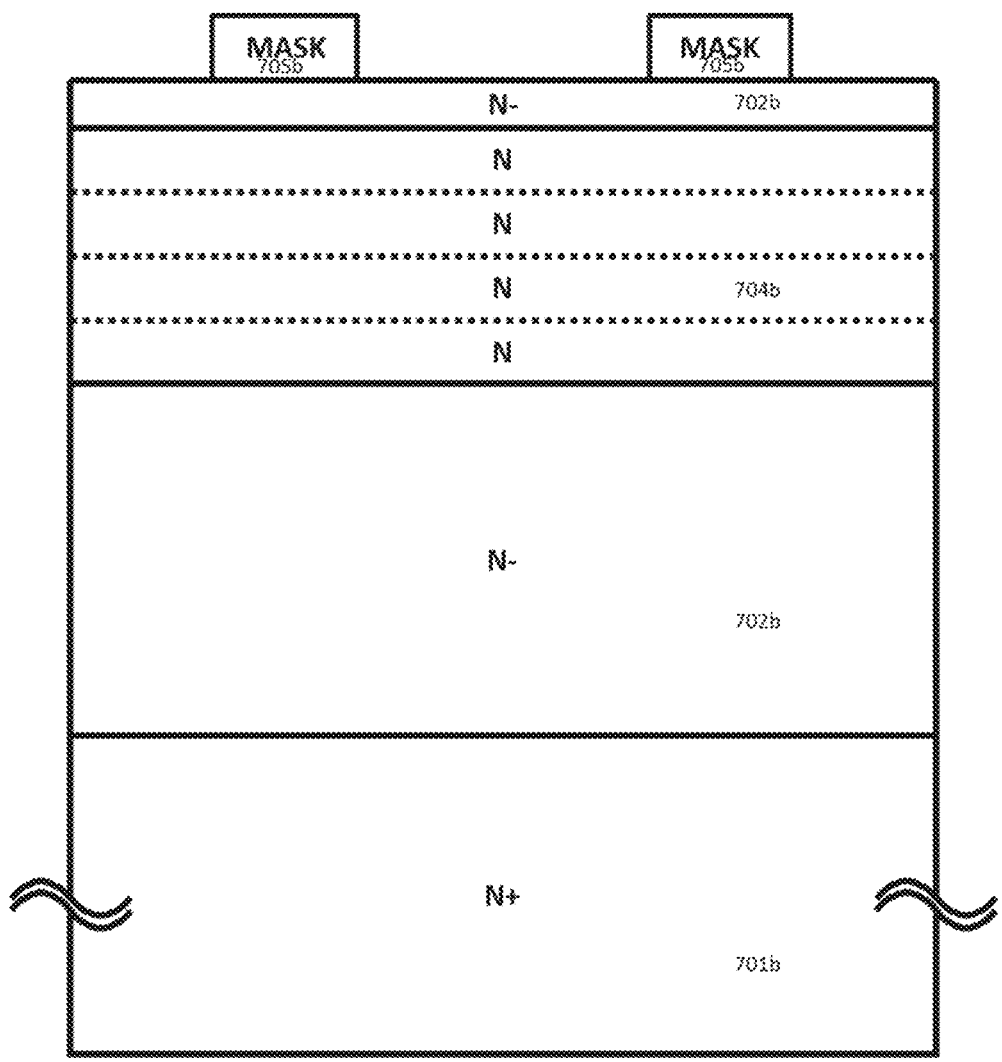
Figure 7B:
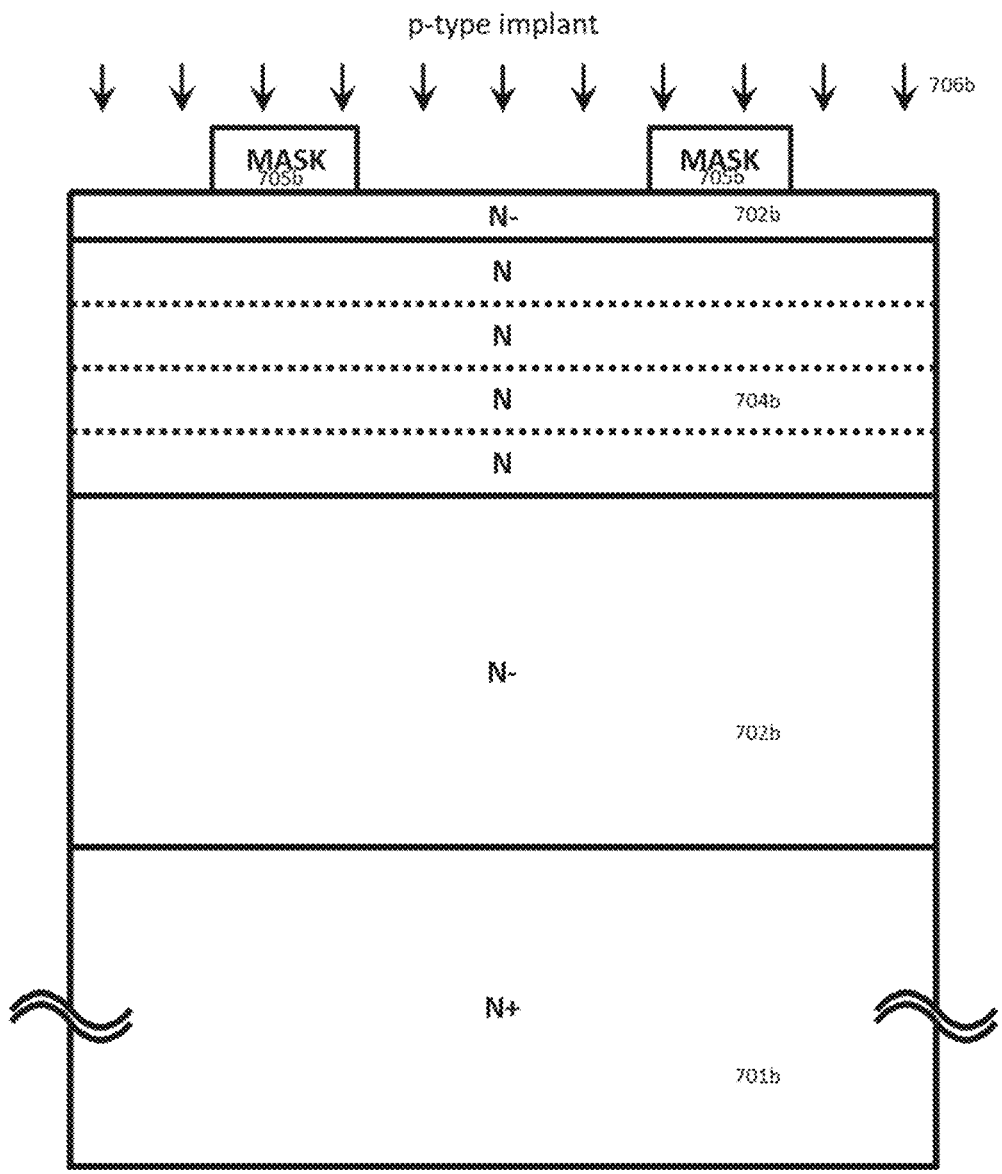
Figure 7B:
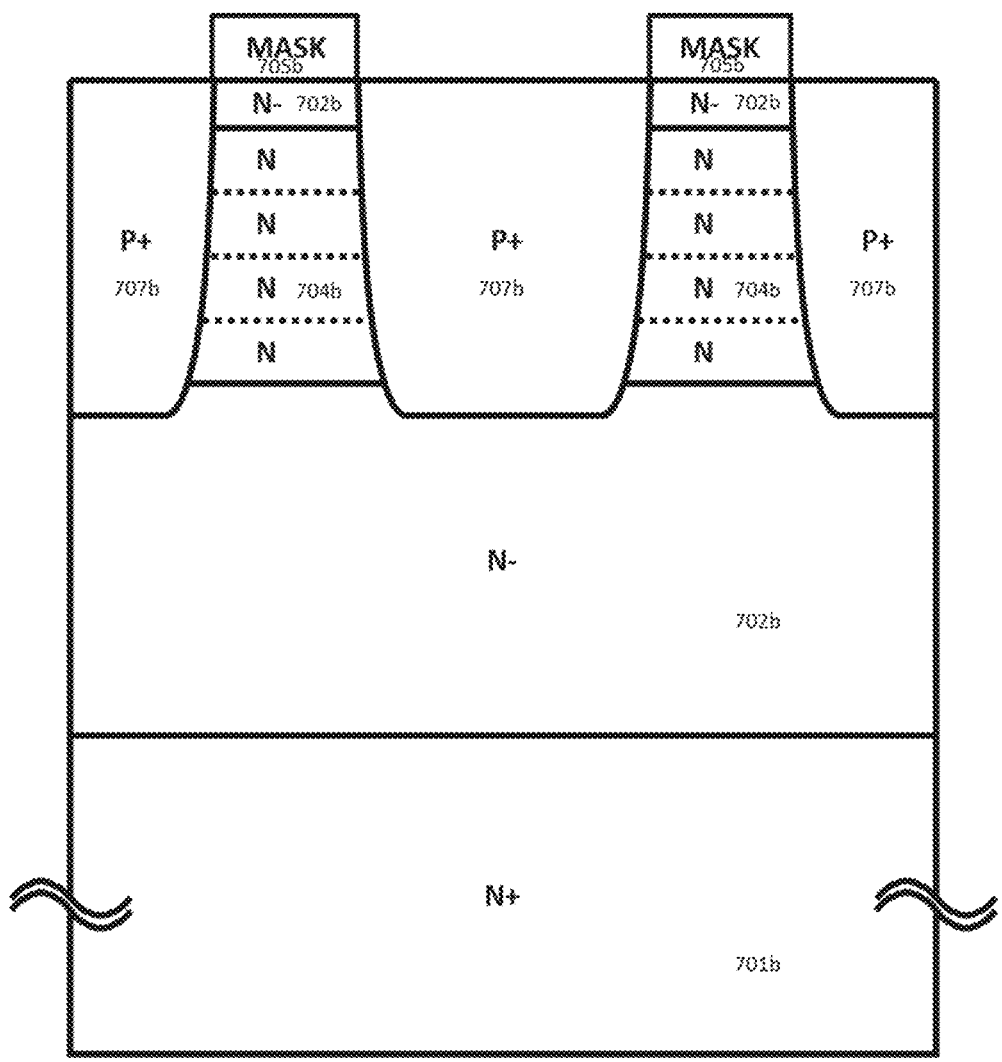
Figure 7B:
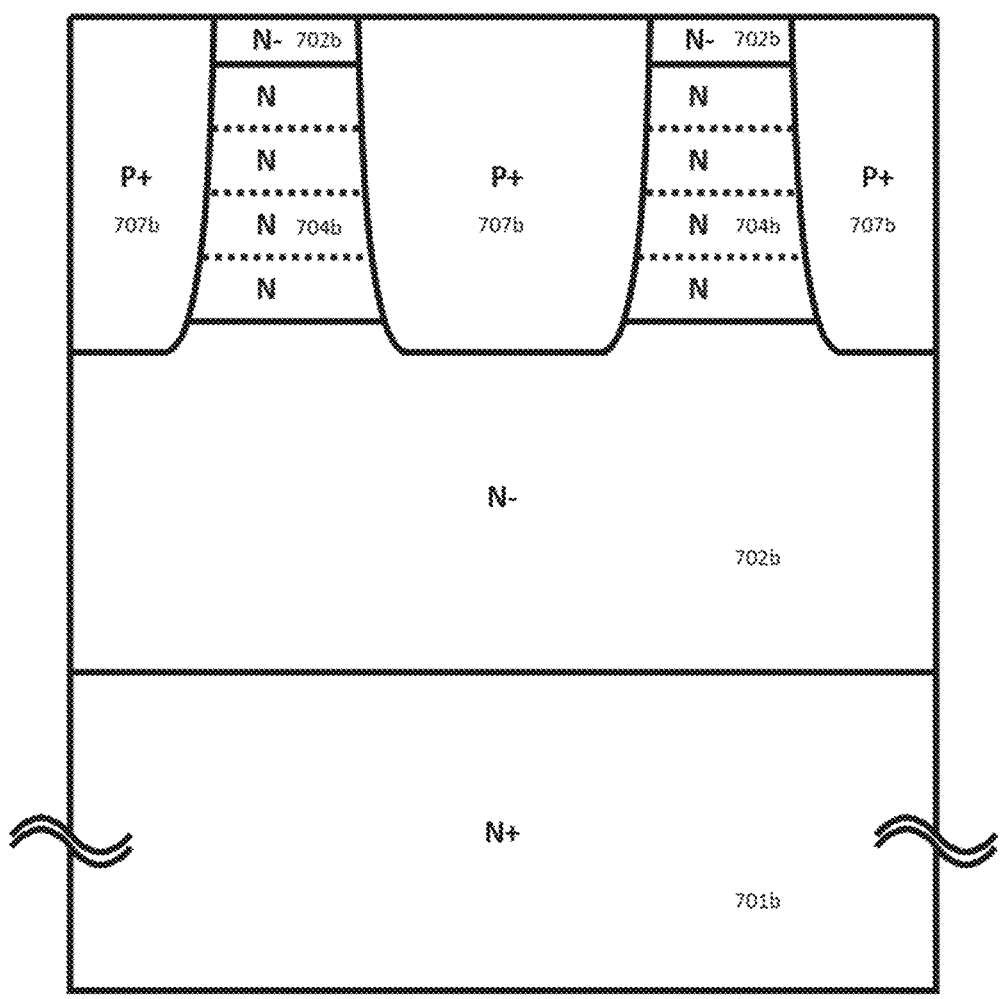
Figure 7B:
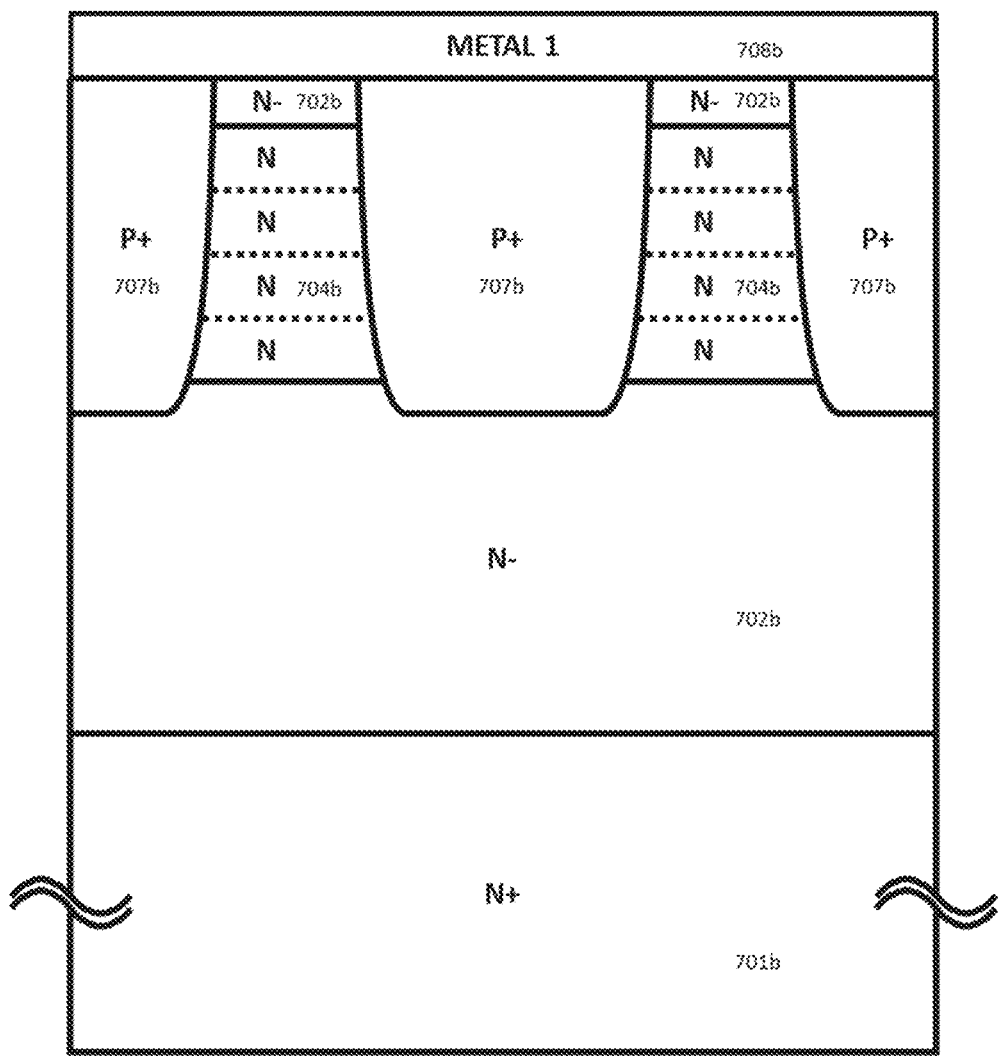
Figure 7B:
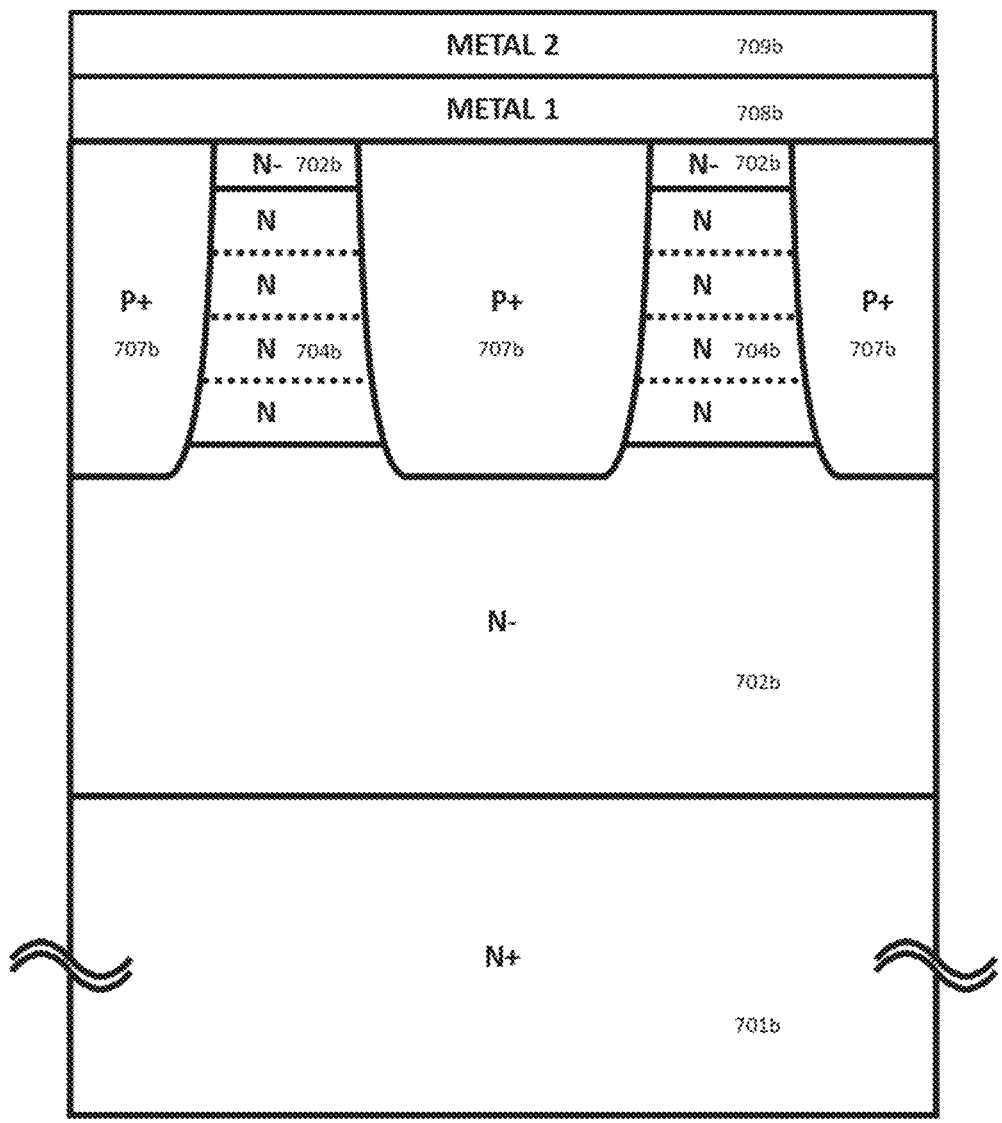
Figure 7B:
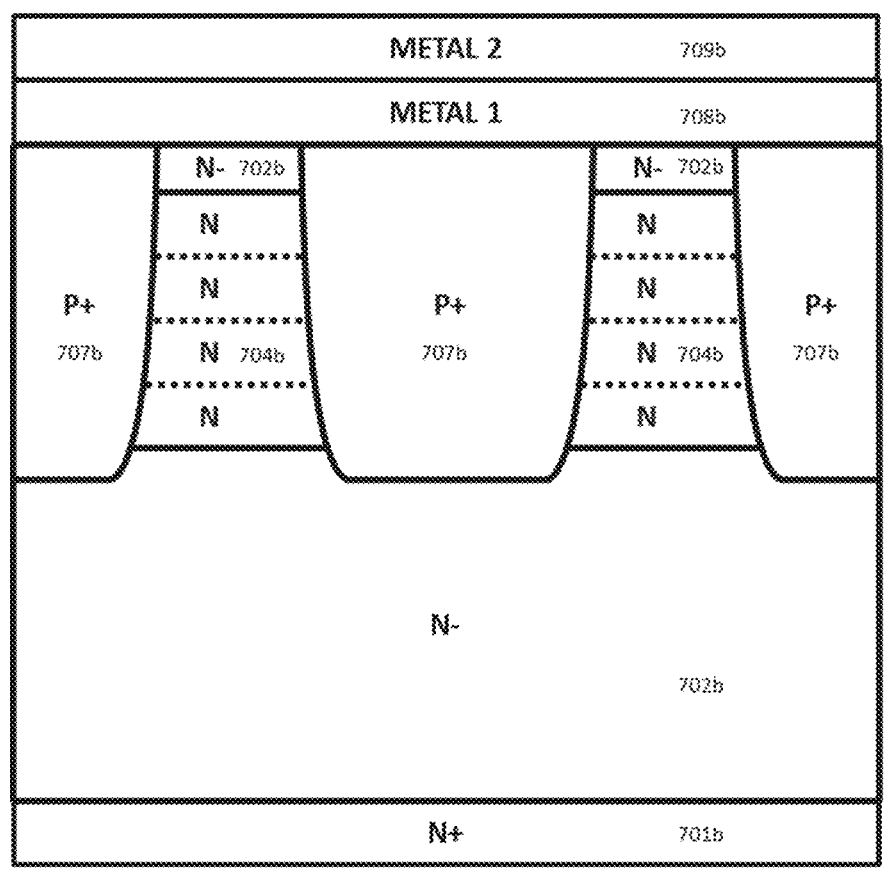
Figure 7B:
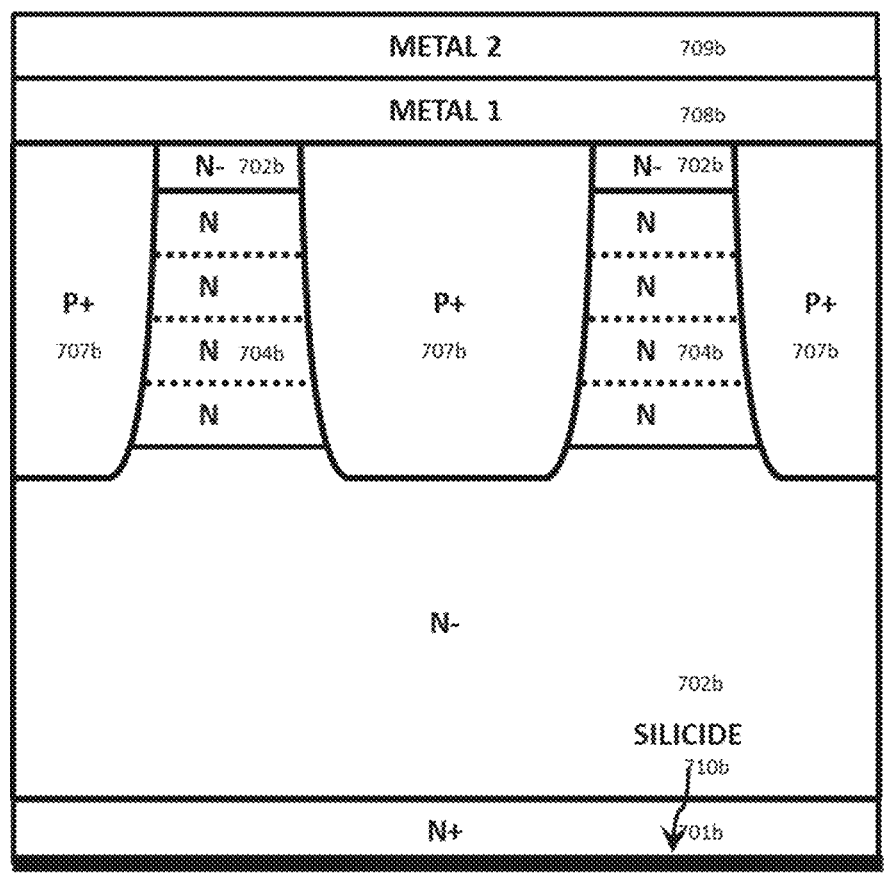
Figure 7B:
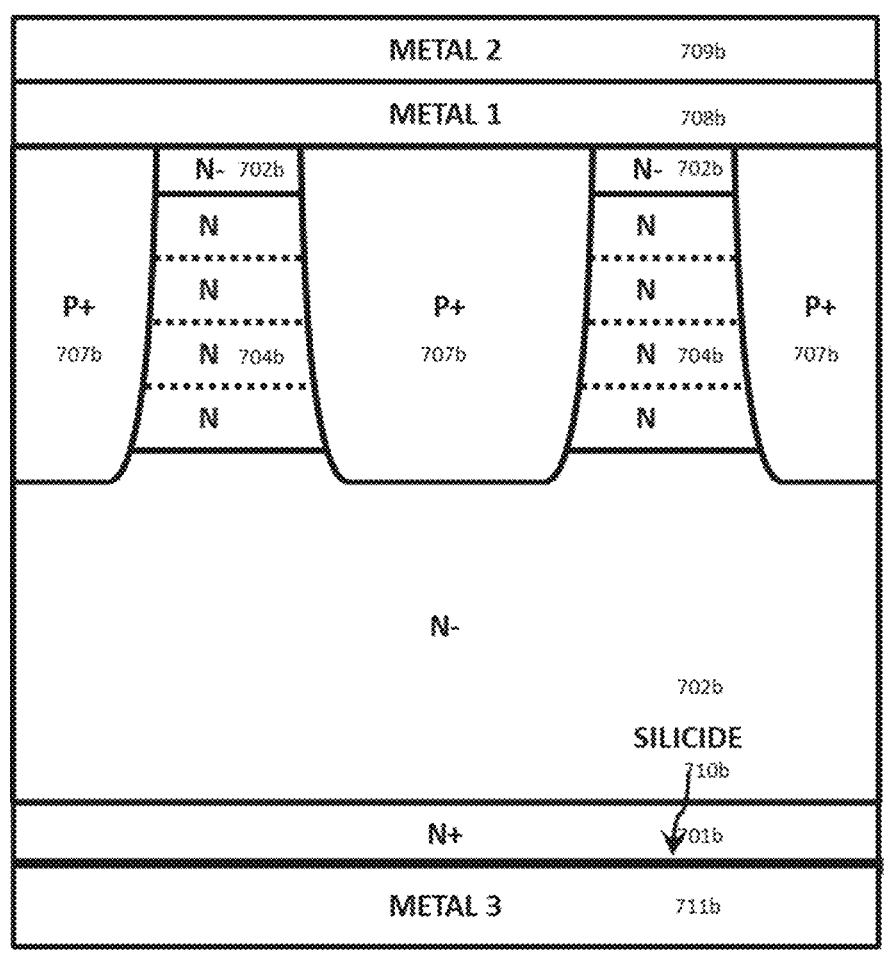

FIG. 7BA to FIG. 7BL describes the process of manufacturing the structure shown in FIG. 6B. The manufacturing process of the device includes preparing a SiC wafer in FIG. 7BA which consists of a highly conductive N+ substrate 701b and an N– drift region 702b, where the N– drift region is typically epi-grown. The N– drift region 702b is designed in such a way that the doping concentration and thickness of the N– drift region are primarily selected based on the required blocking performance. When the SiC wafer is prepared, a set of multiple ion implantation steps with an n-type species 703b such as nitrogen and/or phosphorus is performed onto the active region of the device in FIG. 7BB. The set of multiple ion implantation steps with the n-type species forms a set of sub n-type regions 704b in FIG. 7BC where each sub region is defined by the dotted line in the schematic for indicating the top and bottom of the sub region and all sub regions are interconnected. The interconnected sub regions consist of the N+ region as a whole. The edge termination which is not shown needs to be masked during the set of n-type ion implantation steps. It is important to note that the n-type ion implantation steps 703b needs to be performed in such a fashion that the N+ region 704b is completely buried inside the N– drift region in FIG. 7BC. The ion implantation steps should form the N+ region 704b where the top of the N+ region is physically off from the wafer surface.

A patterned mask 705b, which is preferably a hard mask made of such as an oxide, a nitride, a polysilicon layer, or a combination of these, is formed on the wafer surface in FIG. 7BD. The patterned mask must be thick enough to completely block any high energy impurities during the subsequent ion implant step. A p-type ion implantation step with a p-type impurity 706b such as aluminum and/or boron is performed in FIG. 7BE to form a set of multiple P+ wells 707b in FIG. 7BF. The bottoms of the set of multiple P+ wells 707b are formed such that they are below the bottom of the N+ region 704b. In the embodiments herein, the depth of the set of multiple P+ wells is greater than the depth of the N+ region. The set of multiple P+ wells leads to a P+ region as a whole in FIG. 7BF. The edge termination region which is not shown may be formed by the p-type ion implantation step. The patterned mask 705b is removed by dry or wet etching process in FIG. 7BG. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 708b marked as METAL 1 directly on the wafer surface in FIG. 7BH. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 709b marked as METAL 2 is then deposited on top of the wafer in FIG. 7BI and patterned by dry etching, wet etching, or lift-off. The first pad metal can be of Aluminum/Aluminum-based alloy. The wafer is then thinned from its back side until its thickness reaches to a target thickness of 100~200 µm in FIG. 7BJ. The thickness may be further reduced in the future when the wafer thinning technology improves and provides the target thickness less than the aforementioned 100~200 µm. The wafer thinning can be accomplished by CMP, wet etching, dry etching, or a combination of the aforementioned grinding techniques with a proper protective coating at the front side of the wafer.

A silicide region 710b on the back side of the wafer is then formed in FIG. 7BK. The silicide region is required to form a good ohmic contact on the back side of the wafer. The silicide region is formed by depositing ohmic metal stack and annealing the wafer by using a laser annealing technique as an example. A second pad metal 711b marked as METAL 3 is formed on the back side of the wafer in FIG. 7BL. The second pad metal can be of Aluminum or Aluminum-based alloy. After the second pad metal step is finished, a protective coating process step may be followed on top of the wafer to form a moisture barrier.

Another method to fabricate this embodiment is to use a SiC wafer with multiple n-type epi-grown layers to start with. In this case, the SiC wafer consists of multiple n-type epi-grown layers in FIG. 7BC with different doping concentrations and thicknesses and the N+ substrate at the bottom of the SiC wafer. On top of the N+ substrate 701b, an N– drift layer 702b can be epi-grown for serving as a drift/blocking layer. On top of the N– drift layer, a number of n-type epilayers can be grown to form an N+ region 704b as a whole which consists of a set of sub n-type regions where each sub region is defined by different doping concentration and thickness and all sub regions are interconnected. On top of the buried N+ region, an N− layer can be formed which reaches to the surface of the SIC wafer 702b.

When the SiC wafer with the aforementioned epi structure is prepared, a patterned mask 705b, which is preferably a hard mask made of such as an oxide, a nitride, a polysilicon layer, or a combination of these, is formed on the wafer surface in FIG. 7BD. The patterned mask must be thick enough to completely block any high energy impurities during the subsequent ion implant step. A p-type ion implantation step with a p-type impurity 706b such as aluminum and/or boron is performed in FIG. 7BE to form a set of multiple P+ wells 707b in FIG. 7BF. The bottoms of the set of multiple P+ wells 707b are formed such that they are below the bottom of the N+ region 704b. In the embodiments herein, the depth of the set of multiple P+ wells is greater than the depth of the N+ region. The set of multiple P+ wells leads to a P+ region as a whole in FIG. 7BF. The edge termination region which is not shown may be formed by the p-type ion implantation step. The patterned mask 705b is removed by dry or wet etching process in FIG. 7BG. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 708b marked as METAL 1 directly on the wafer surface in FIG. 7BH. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 709b marked as METAL 2 is then deposited on top of the wafer in FIG. 7BI and patterned by dry etching, wet etching, or lift-off. The first pad metal can be of Aluminum/Aluminum-based alloy. The wafer is then thinned from its back side until its thickness reaches to a target thickness of 100~200 μm in FIG. 7BJ. The thickness may be further reduced in the future when the wafer thinning technology improves and provides the target thickness less than the aforementioned 100~200 μm. The wafer thinning can be accomplished by CMP, wet etching, dry etching, or a combination of the aforementioned grinding techniques with a proper protective coating at the front side of the wafer.

A silicide region 710b on the back side of the wafer is then formed in FIG. 7BK. The silicide region is required to form a good ohmic contact on the back side of the wafer. The silicide region is formed by depositing ohmic metal stack and annealing the wafer by using a laser annealing technique as an example. A second pad metal 711b marked as METAL 3 is formed on the back side of the wafer in FIG. 7BL. The second pad metal can be of Aluminum or Aluminum-based alloy. After the second pad metal step is finished, a protective coating process step may be followed on top of the wafer to form a moisture barrier.

Figure 6E:
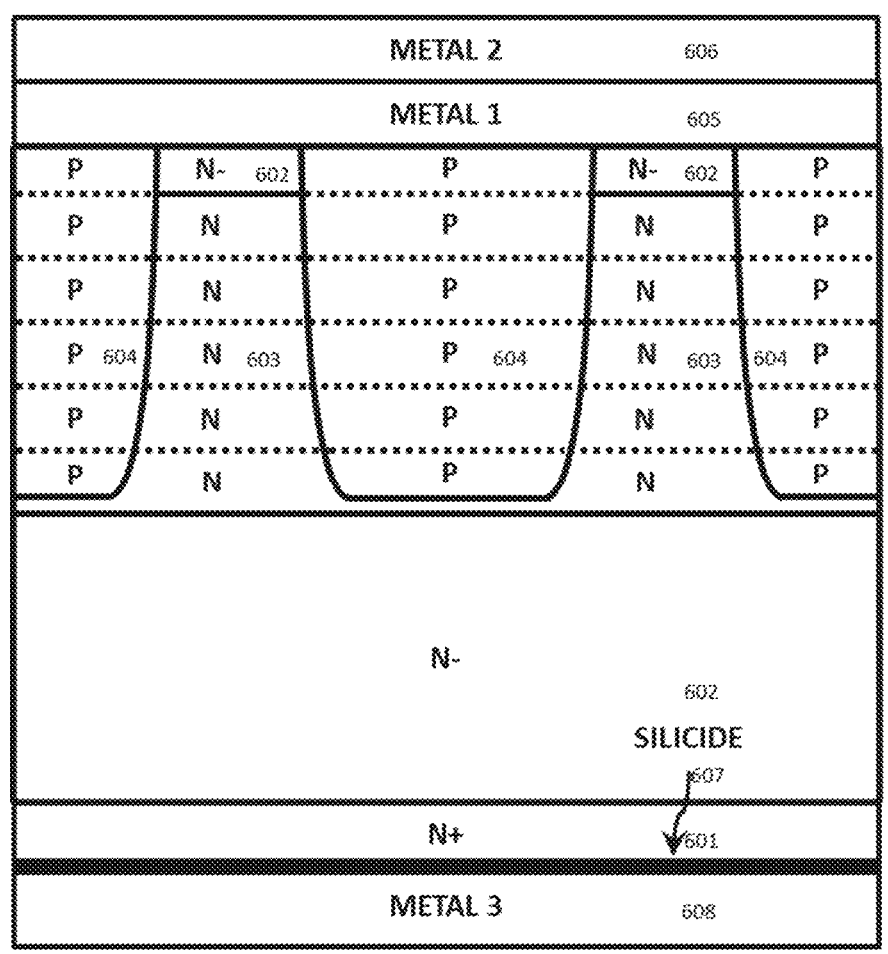
Figure 7E:
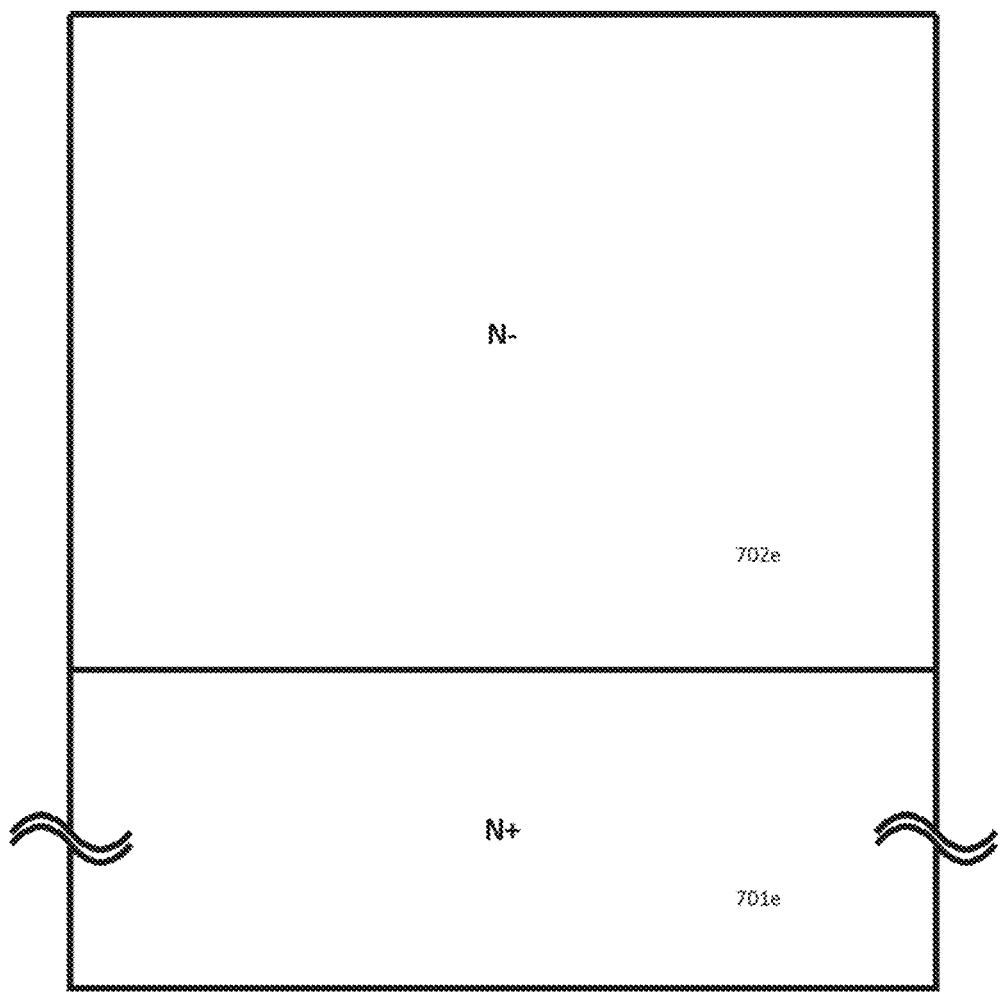
Figure 7E:
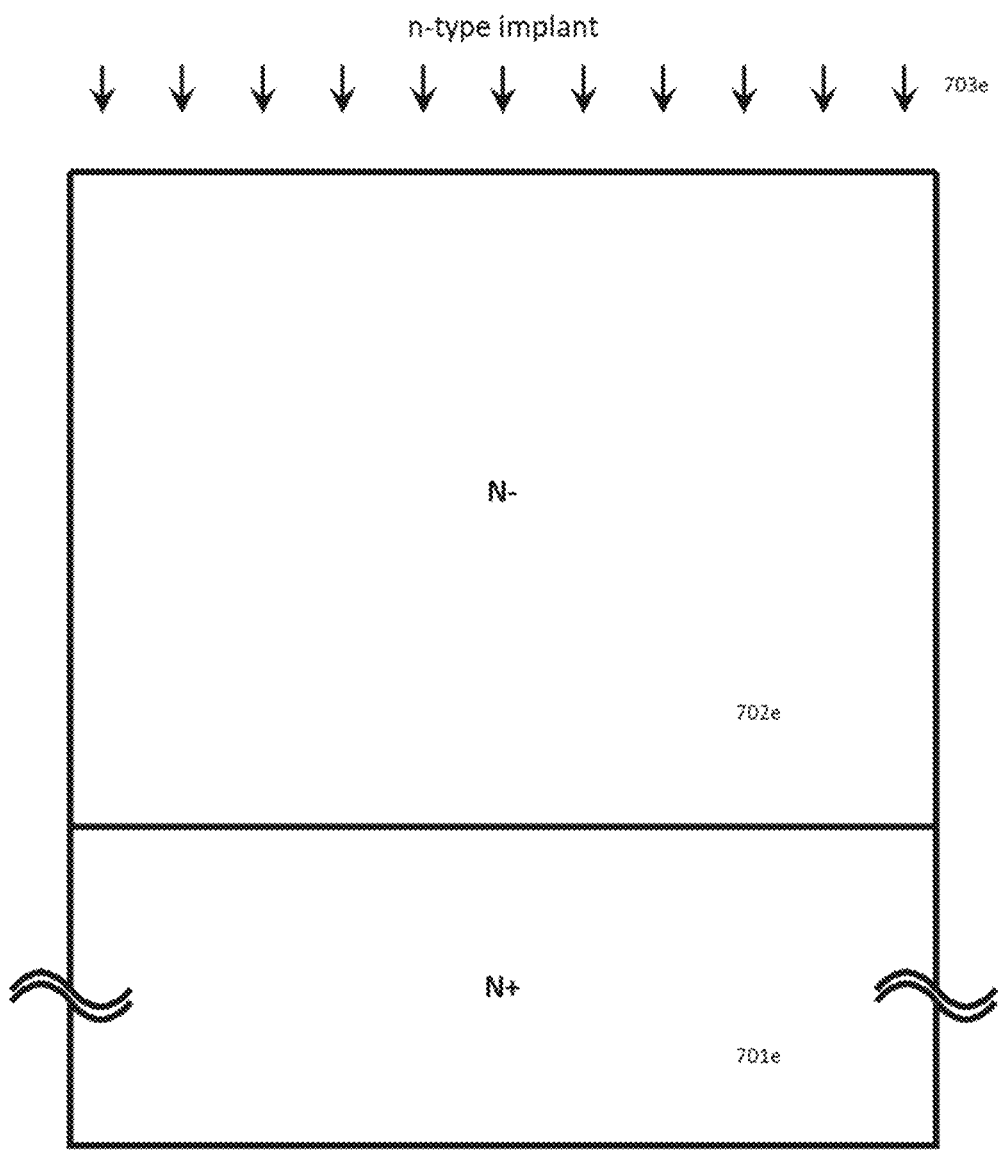
Figure 7E:
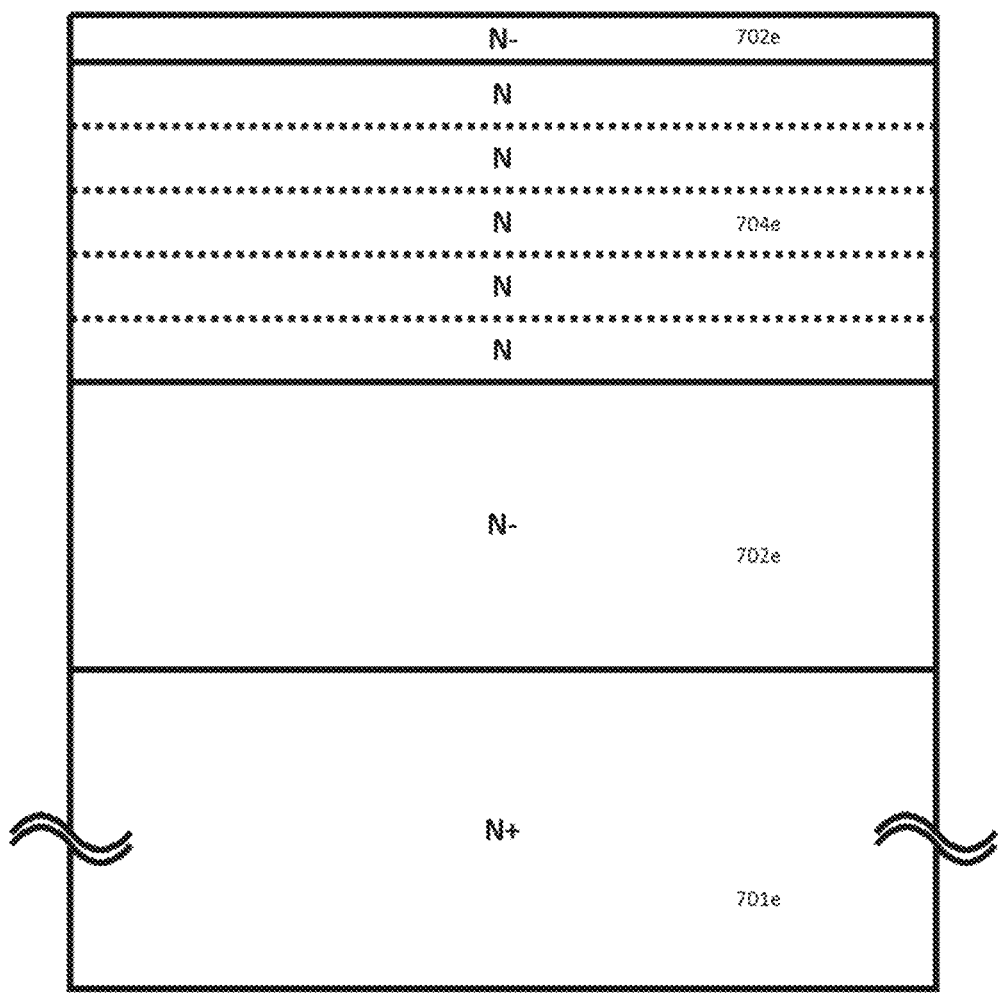
Figure 7E:
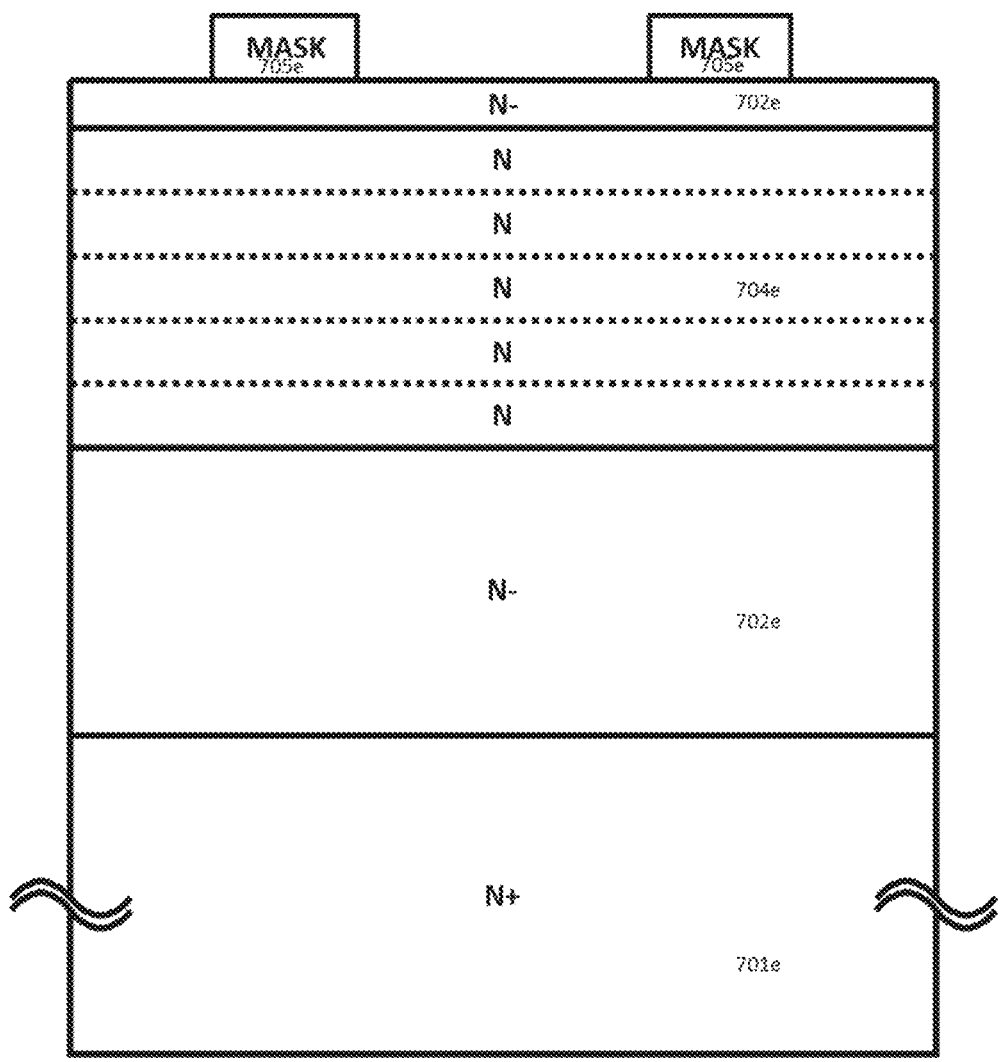
Figure 7E:
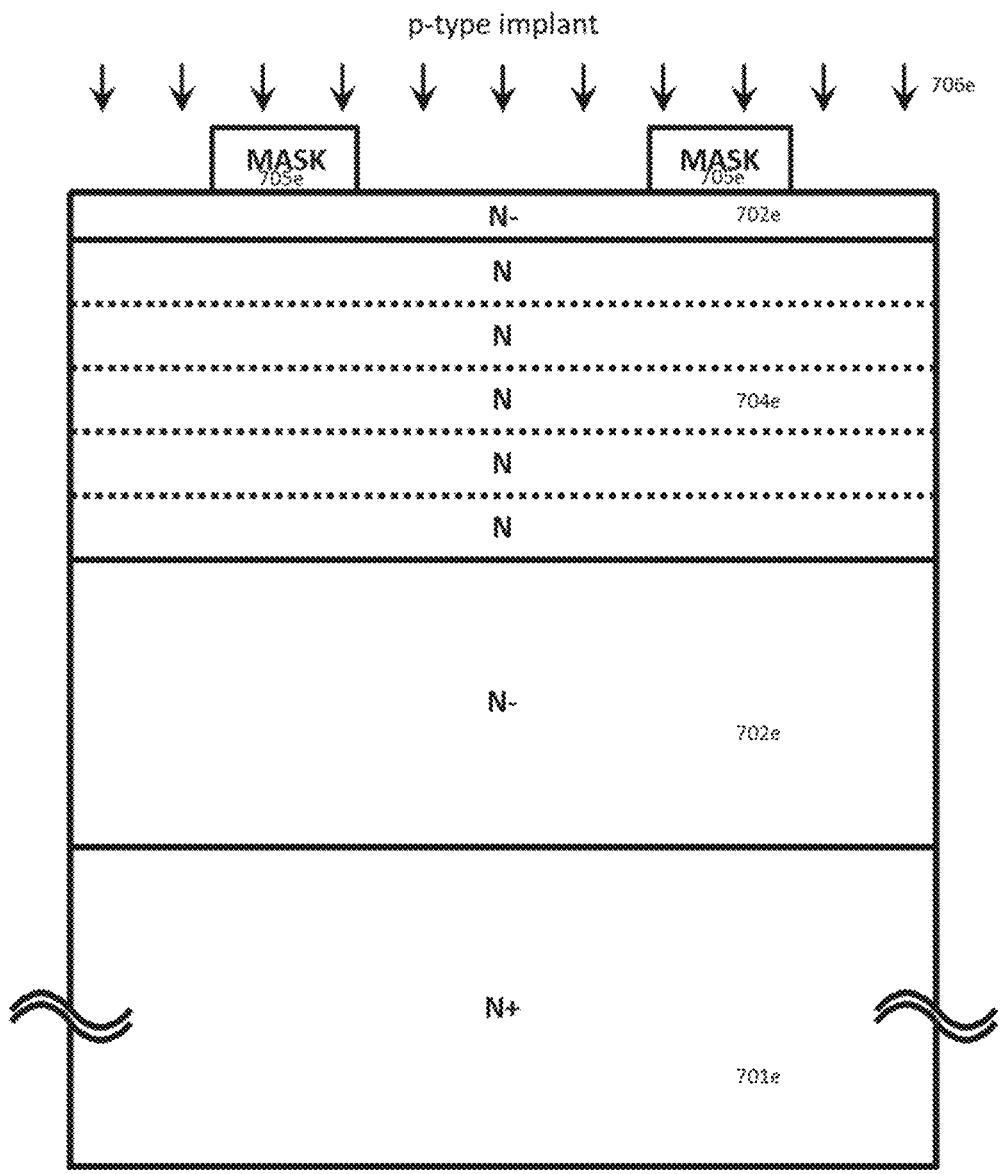
Figure 7E:
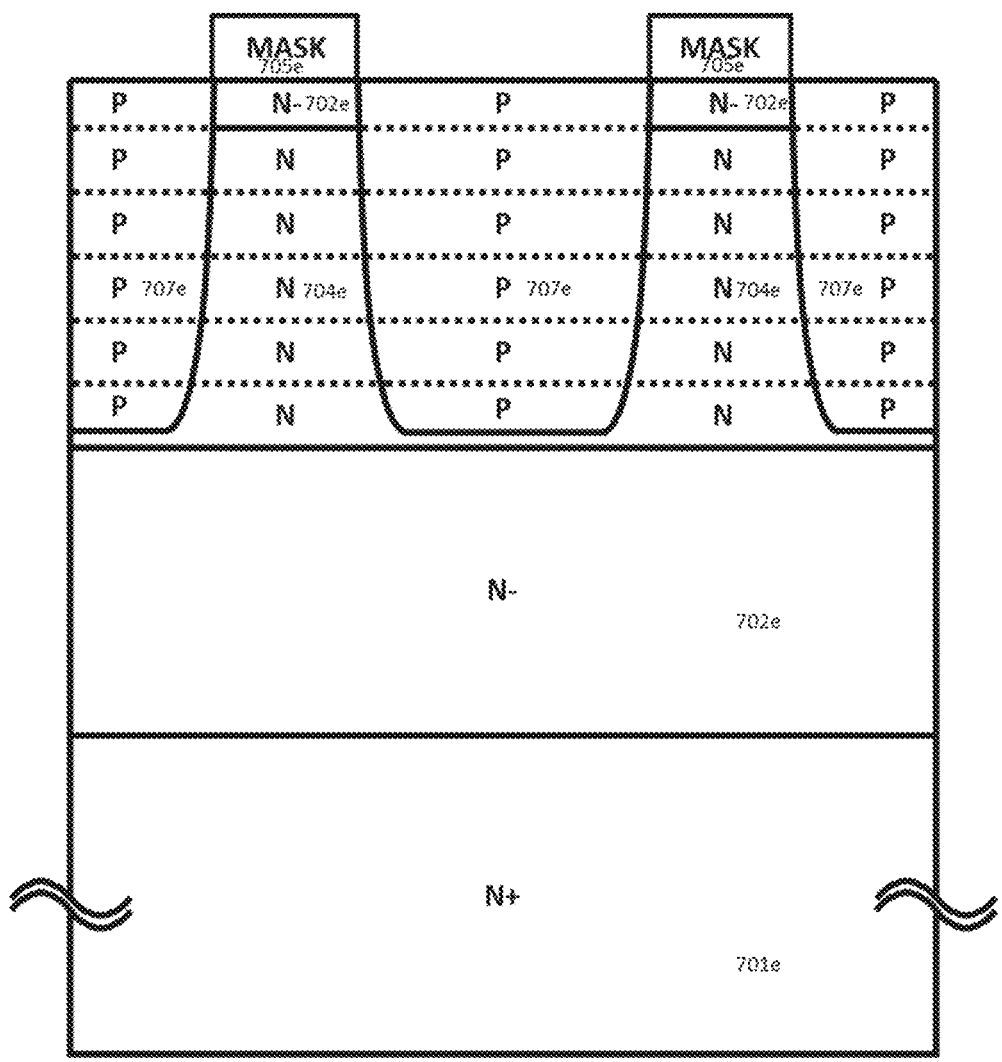
Figure 7E:
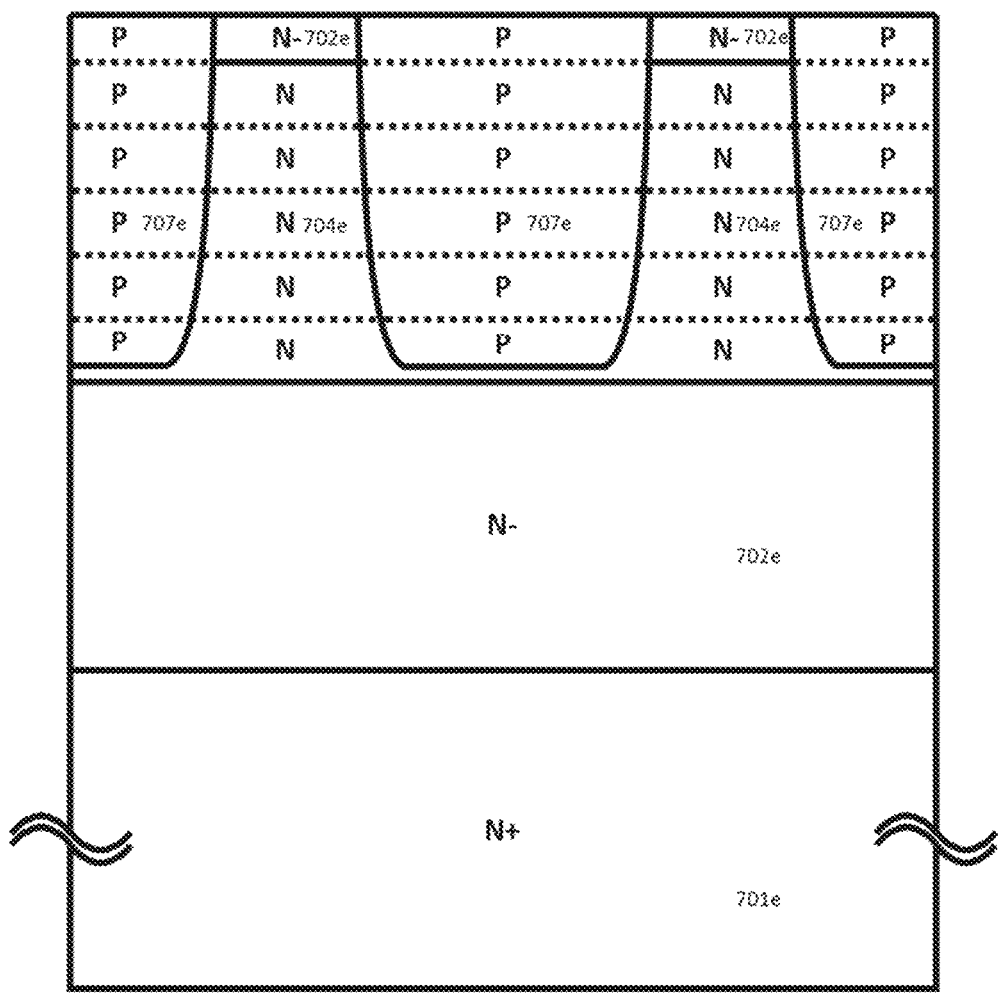
Figure 7E:
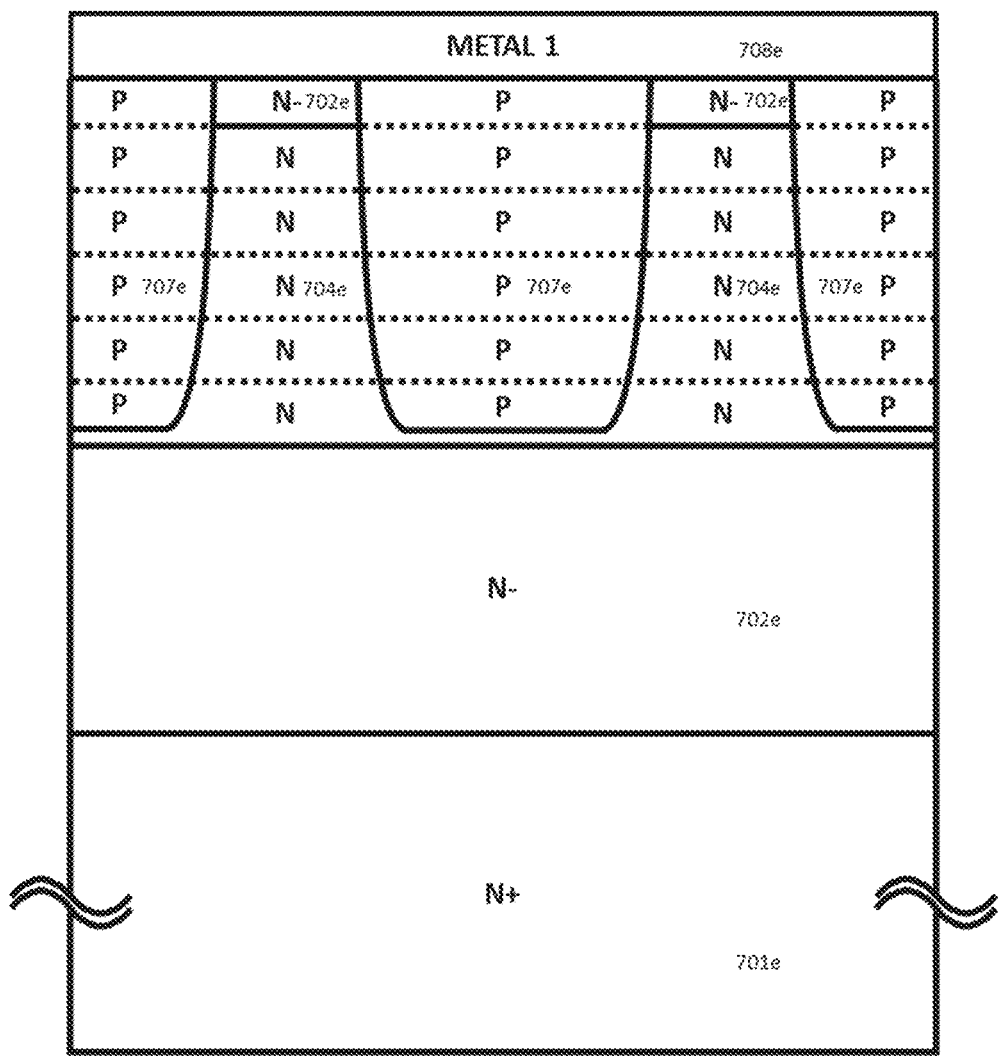
Figure 7E:
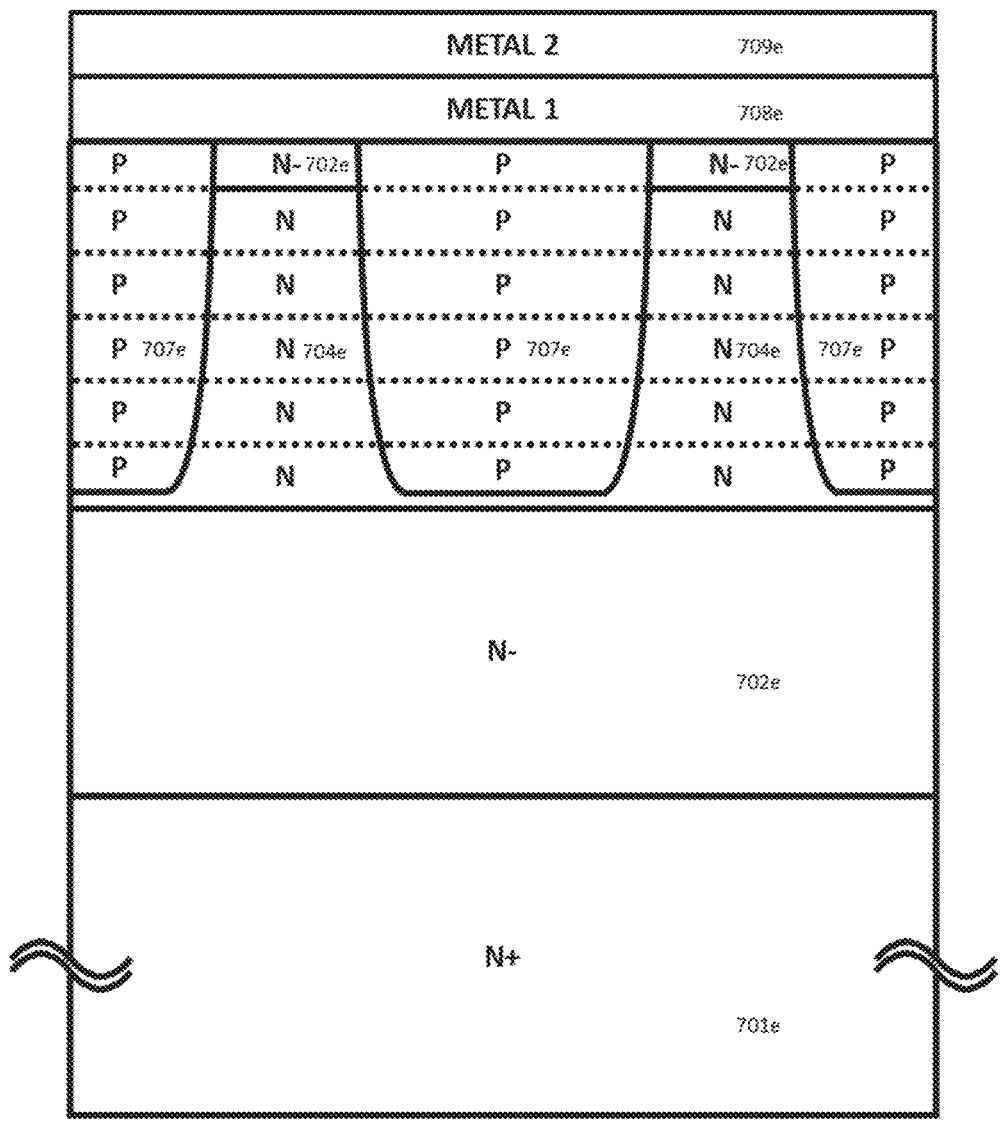
Figure 7E:
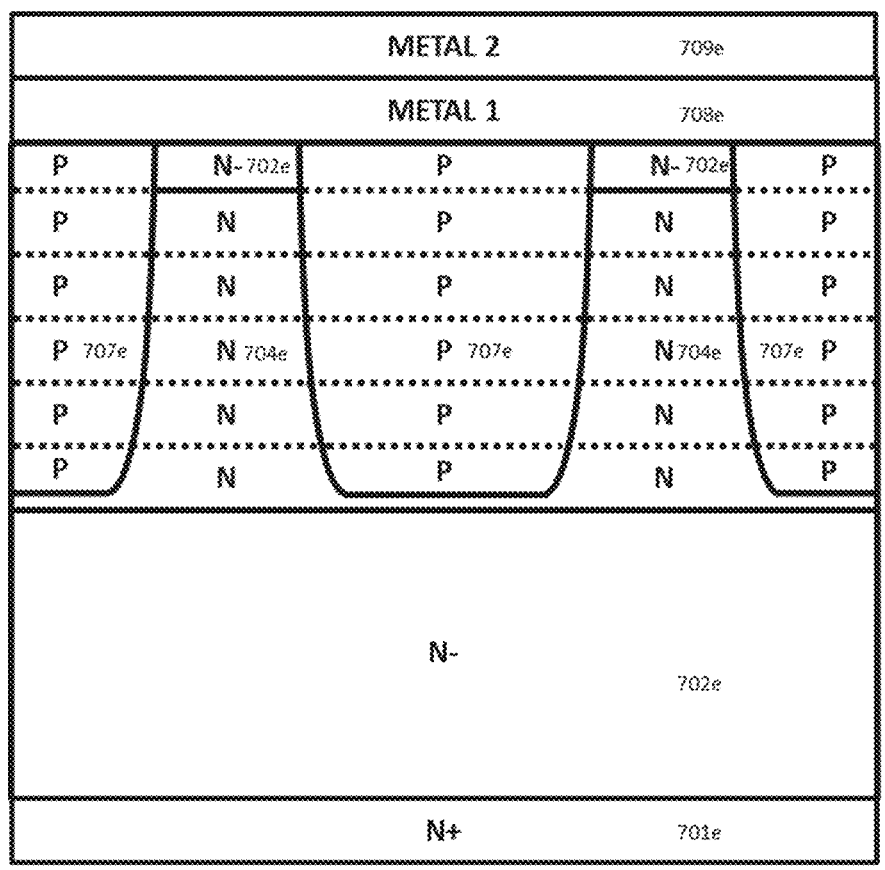
Figure 7E:
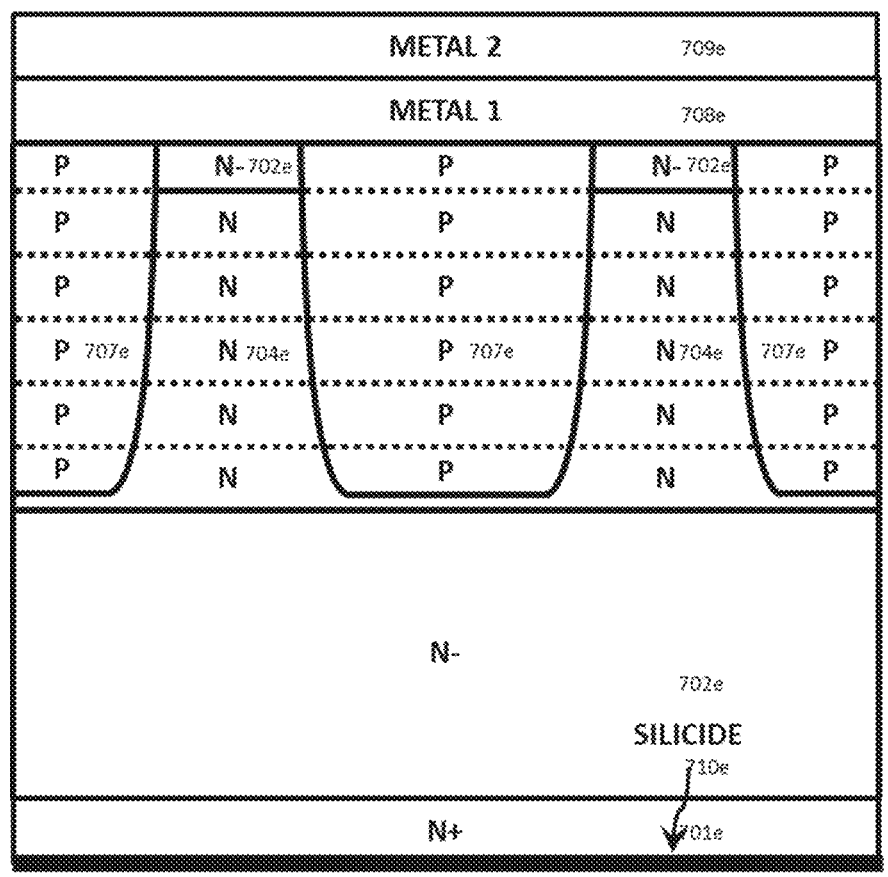
Figure 7E:
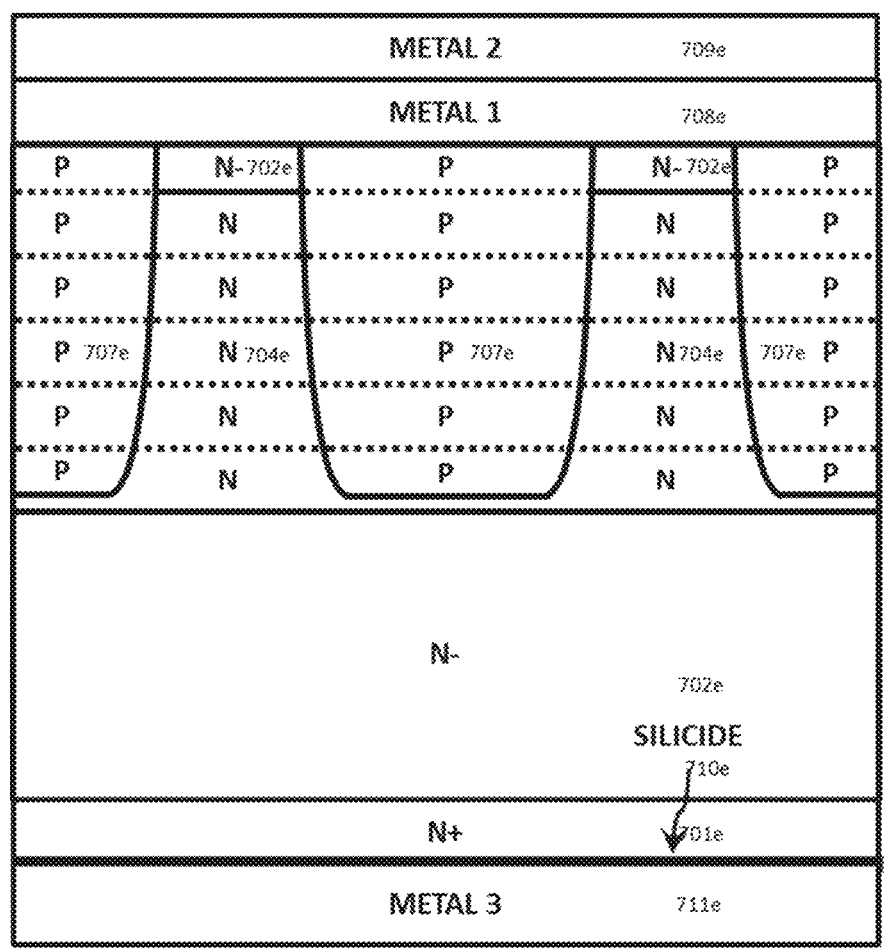

FIG. 7EA to FIG. 7EL describes the process of manufacturing the structure shown in FIG. 6E. The manufacturing process of the device includes preparing a SiC wafer in FIG. 7EA which consists of a highly conductive N+ substrate 701e and an N− drift region 702e, where the N− drift region is typically epi-grown. The N− drift region 702e is designed in such a way that the doping concentration and thickness of the N− drift region are primarily selected based on the required blocking performance. When the SiC wafer is prepared, a set of multiple ion implantation steps with an n-type species 703e such as nitrogen and/or phosphorus is performed onto the active region of the device in FIG. 7EB. The set of multiple ion implantation steps with the n-type species forms a set of sub n-type regions 704e in FIG. 7EC where each sub region is defined by the dotted line in the schematic for indicating the top and bottom of the sub region and all sub regions are interconnected. The interconnected sub regions consist of the N+ region as a whole. The edge termination which is not shown needs to be masked during the set of n-type ion implantation steps. It is important to note that the n-type ion implantation steps 703e needs to be performed in such a fashion that the N+ region 704e is completely buried inside the N− drift region in FIG. 7EC. The ion implantation steps should form the N+ region 704e where the top of the N+ region is physically off from the wafer surface.

A patterned mask 705e, which is preferably a hard mask made of such as an oxide, a nitride, a polysilicon layer, or a combination of these, is formed on the wafer surface in FIG. 7ED. The patterned mask must be thick enough to completely block any high energy impurities during the subsequent ion implant step. A set of multiple ion implantation steps with a p-type impurity 706e such as aluminum and/or boron is performed in FIG. 7EE to form a set of multiple P+ wells 707e in FIG. 7EF. The set of multiple ion implantation steps with the p-type species forms a set of sub p-type regions 707e in FIG. 7EF where each sub region is defined by the dotted line in the schematic for indicating the top and bottom of the sub region and all sub regions are interconnected. The P+ region 707e is formed by multiple P sub-regions. The bottoms of the set of multiple P+ wells 707e are formed such that they are above the bottom of the N+ region 704e. In the embodiments herein, the depth of the set of multiple P+ wells is less than the depth of the N+ region. The set of multiple P+ wells leads to a P+ region as a whole in FIG. 7EF. The edge termination region which is not shown may be formed by the p-type ion implantation step. The patterned mask 705e is removed by dry or wet etching process in FIG. 7EG. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 708e marked as METAL 1 directly on the wafer surface in FIG. 7EH. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 709e marked as METAL 2 is then deposited on top of the wafer in FIG. 7E1 and patterned by dry etching, wet etching, or lift-off. The first pad metal can be of Aluminum/Aluminum-based alloy. The wafer is then thinned from its back side until its thickness reaches to a target thickness of 100~200 μm in FIG. 7EJ. The thickness may be further reduced in the future when the wafer thinning technology improves and provides the target thickness less than the aforementioned 100~200 µm. The wafer thinning can be accomplished by CMP, wet etching, dry etching, or a combination of the aforementioned grinding techniques with a proper protective coating at the front side of the wafer.

A silicide region 710e on the back side of the wafer is then formed in FIG. 7EK. The silicide region is required to form a good ohmic contact on the back side of the wafer. The silicide region is formed by depositing ohmic metal stack and annealing the wafer by using a laser annealing technique as an example. A second pad metal 711e marked as METAL 3 is formed on the back side of the wafer in FIG. 7EL. The second pad metal can be of Aluminum or Aluminum-based alloy. After the second pad metal step is finished, a protective coating process step may be followed on top of the wafer to form a moisture barrier.

Another method to fabricate this embodiment is to use a SiC wafer with multiple n-type epi-grown layers to start with. In this case, the SiC wafer consists of multiple n-type epi-grown layers in FIG. 7EC with different doping concentrations and thicknesses and the N+ substrate at the bottom of the SiC wafer. On top of the N+ substrate 701e, an N− drift layer 702e can be epi-grown for serving as a drift/blocking layer. On top of the N− drift layer, a number of n-type epilayers can be grown to form an N+ region 704e as a whole which consists of a set of sub n-type regions where each sub region is defined by different doping concentration and thickness and all sub regions are interconnected. On top of the buried N+ region, an N− layer can be formed which reaches to the surface of the SIC wafer 702e.

When the SiC wafer with the aforementioned epi structure is prepared, a patterned mask 705e, which is preferably a hard mask made of such as an oxide, a nitride, a polysilicon layer, or a combination of these, is formed on the wafer surface in FIG. 7ED. The patterned mask must be thick enough to completely block any high energy impurities during the subsequent ion implant step. A set of multiple ion implantation steps with a p-type impurity 706e such as aluminum and/or boron is performed in FIG. 7EE to form a set of multiple P+ wells 707e in FIG. 7EF. The set of multiple ion implantation steps with the p-type species forms a set of sub p-type regions 707e in FIG. 7EF where each sub region is defined by the dotted line in the schematic for indicating the top and bottom of the sub region and all sub regions are interconnected. The P+ region 707e is formed by multiple P sub-regions. The bottoms of the set of multiple P+ wells 707e are formed such that they are above the bottom of the N+ region 704e. In the embodiments herein, the depth of the set of multiple P+ wells is less than the depth of the N+ region. The set of multiple P+ wells leads to a P+ region as a whole in FIG. 7EF. The edge termination region which is not shown may be formed by the p-type ion implantation step. The patterned mask 705e is removed by dry or wet etching process in FIG. 7EG. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 708e marked as METAL 1 directly on the wafer surface in FIG. 7EH. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 709e marked as METAL 2 is then deposited on top of the wafer in FIG. 7EI and patterned by dry etching, wet etching, or lift-off. The first pad metal can be of Aluminum/Aluminum-based alloy. The wafer is then thinned from its back side until its thickness reaches to a target thickness of 100~200 µm in FIG. 7EJ. The thickness may be further reduced in the future when the wafer thinning technology improves and provides the target thickness less than the aforementioned 100~200 µm. The wafer thinning can be accomplished by CMP, wet etching, dry etching, or a combination of the aforementioned grinding techniques with a proper protective coating at the front side of the wafer.

A silicide region 710e on the back side of the wafer is then formed in FIG. 7EK. The silicide region is required to form a good ohmic contact on the back side of the wafer. The silicide region is formed by depositing ohmic metal stack and annealing the wafer by using a laser annealing technique as an example. A second pad metal 711e marked as METAL 3 is formed on the back side of the wafer in FIG. 7EL. The second pad metal can be of Aluminum or Aluminum-based alloy. After the second pad metal step is finished, a protective coating process step may be followed on top of the wafer to form a moisture barrier.

Figure 6F:
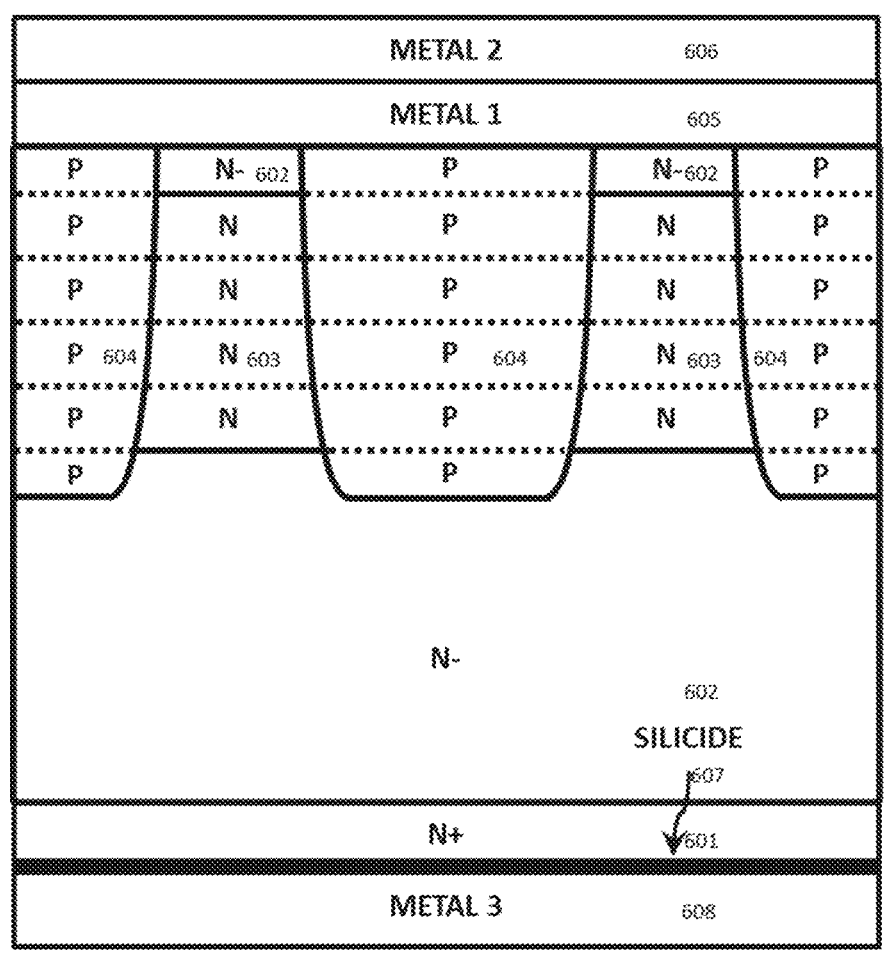
Figure 7F:
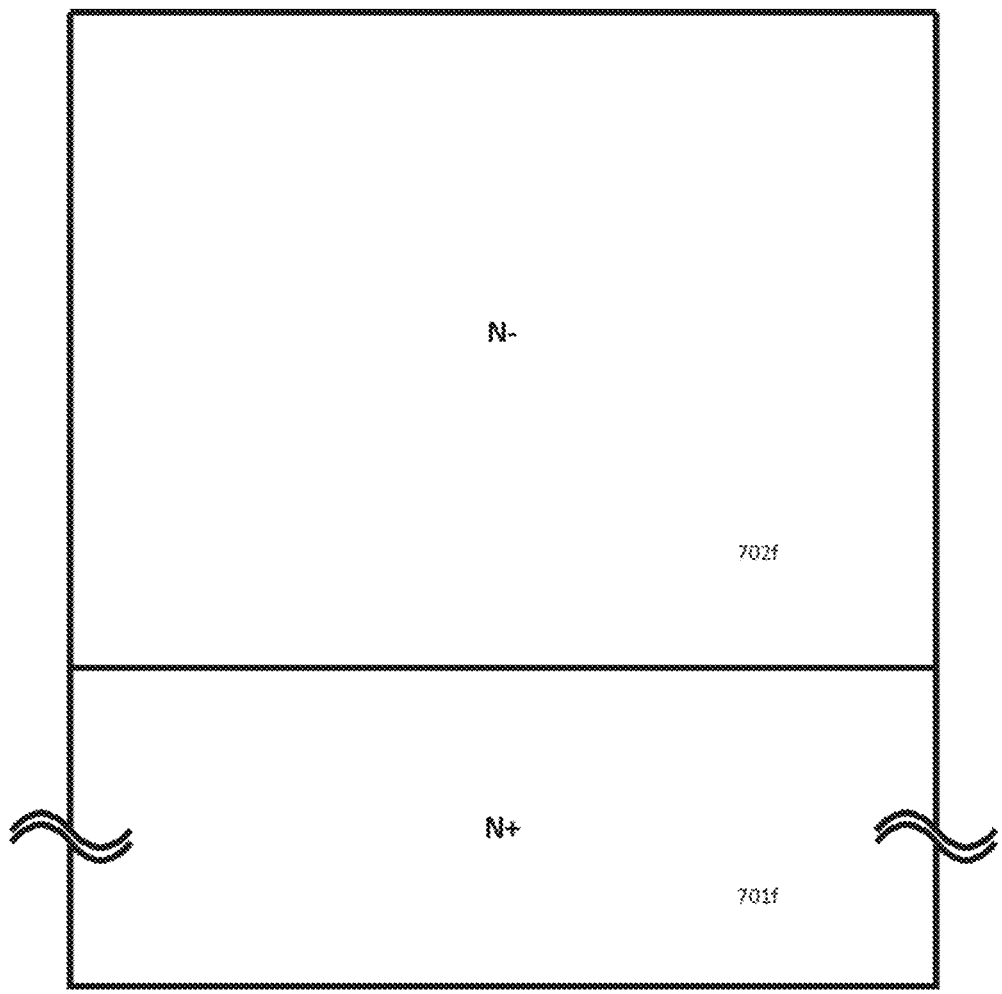
Figure 7F:
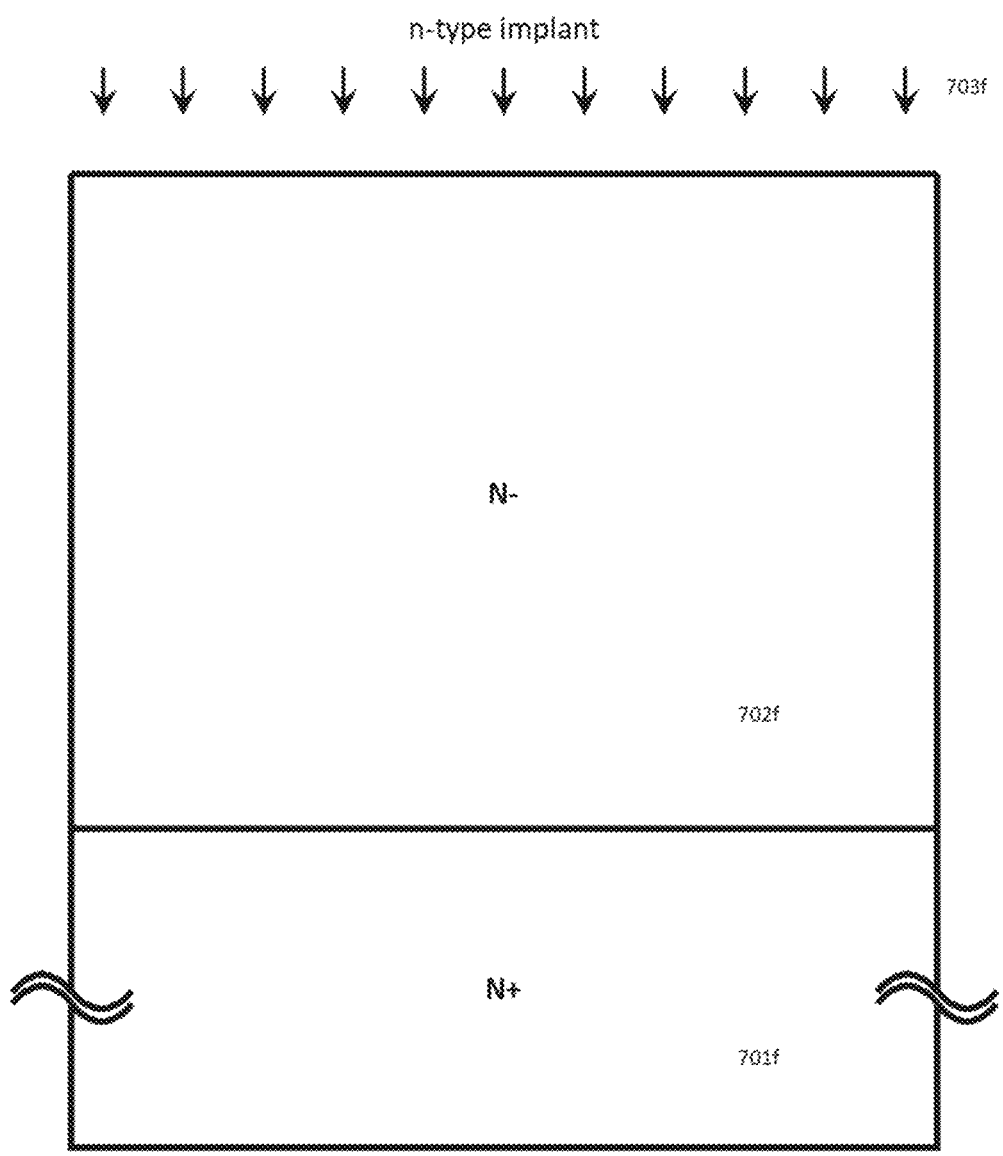
Figure 7F:
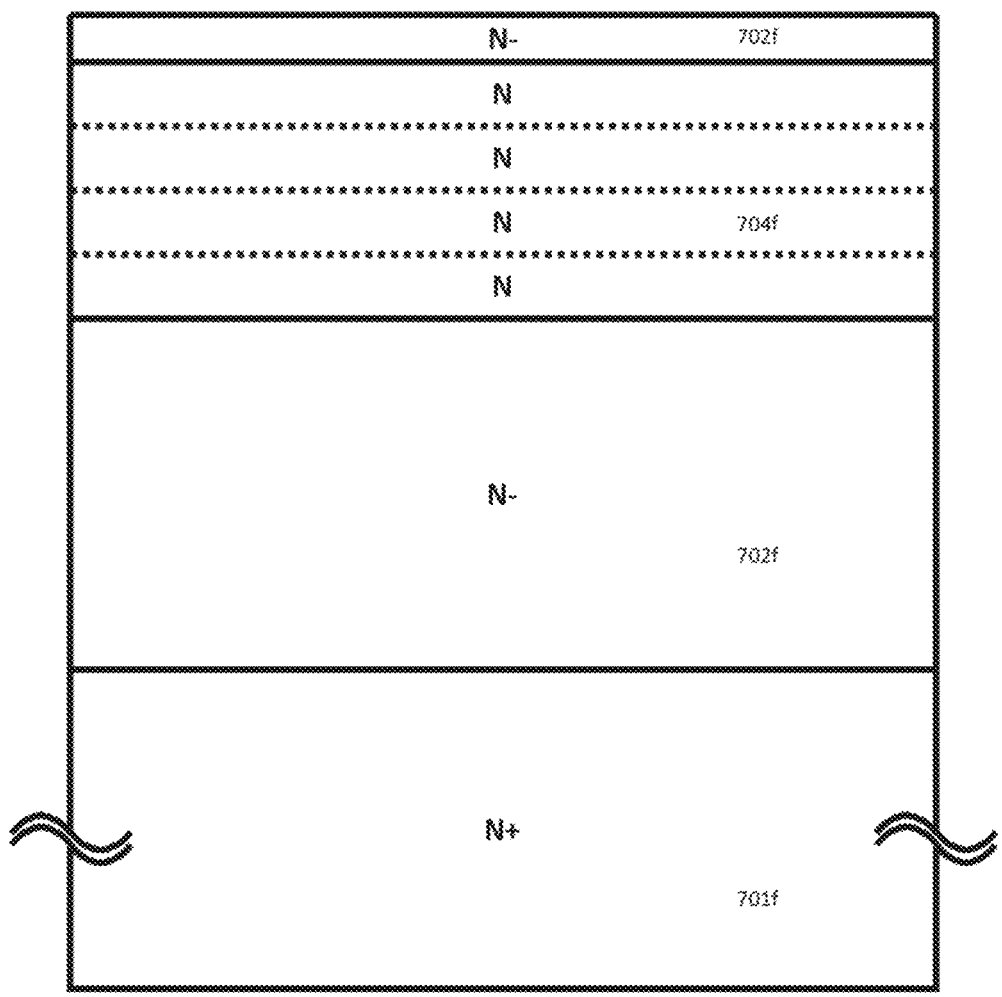
Figure 7F:
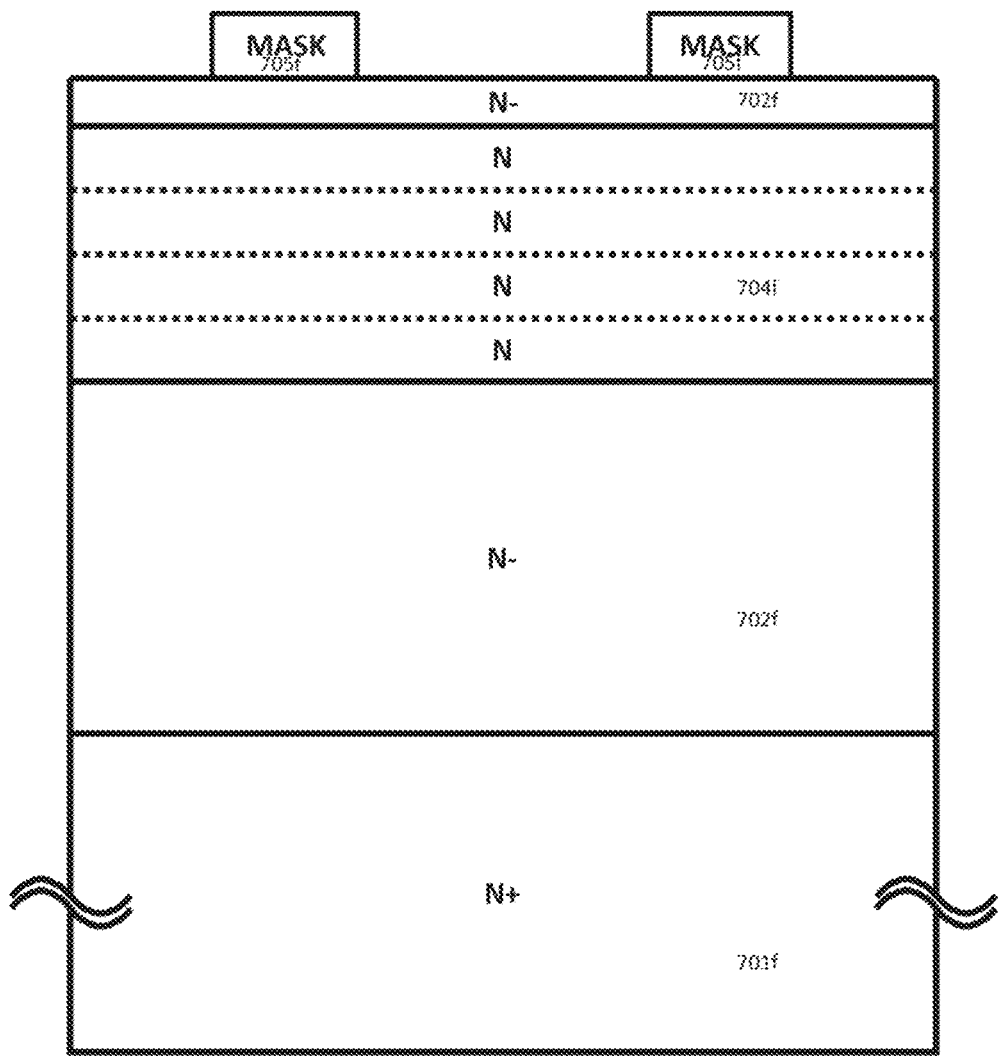
Figure 7F:
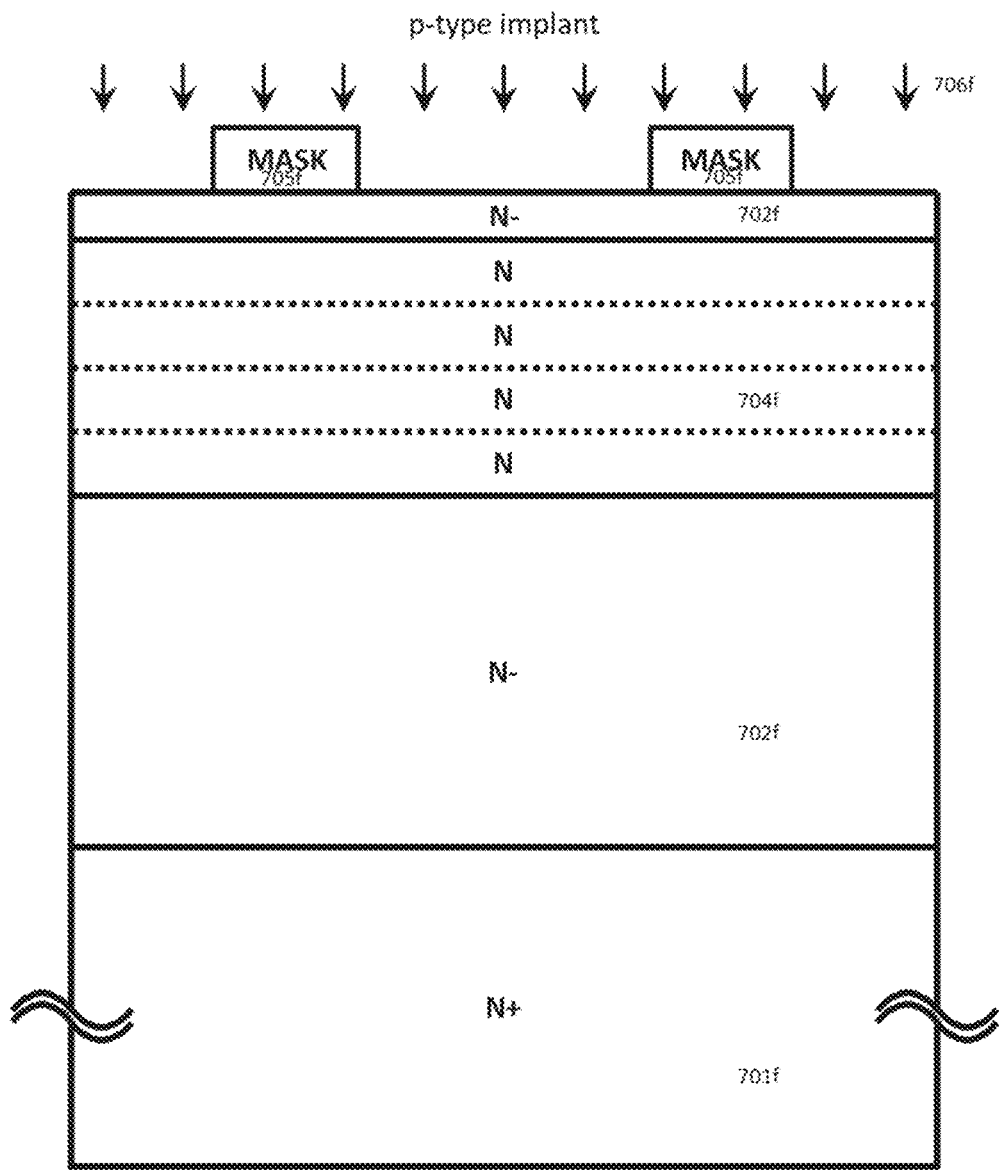
Figure 7F:
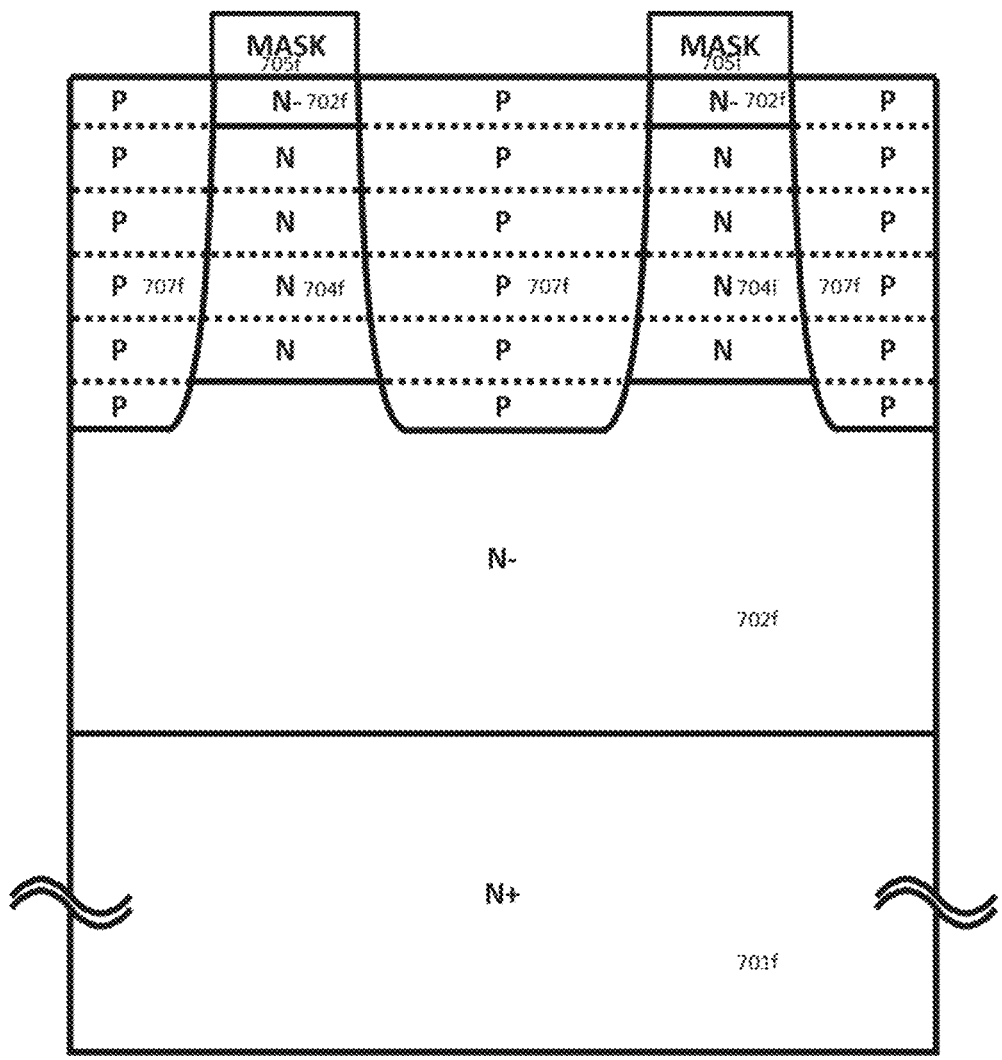
Figure 7F:
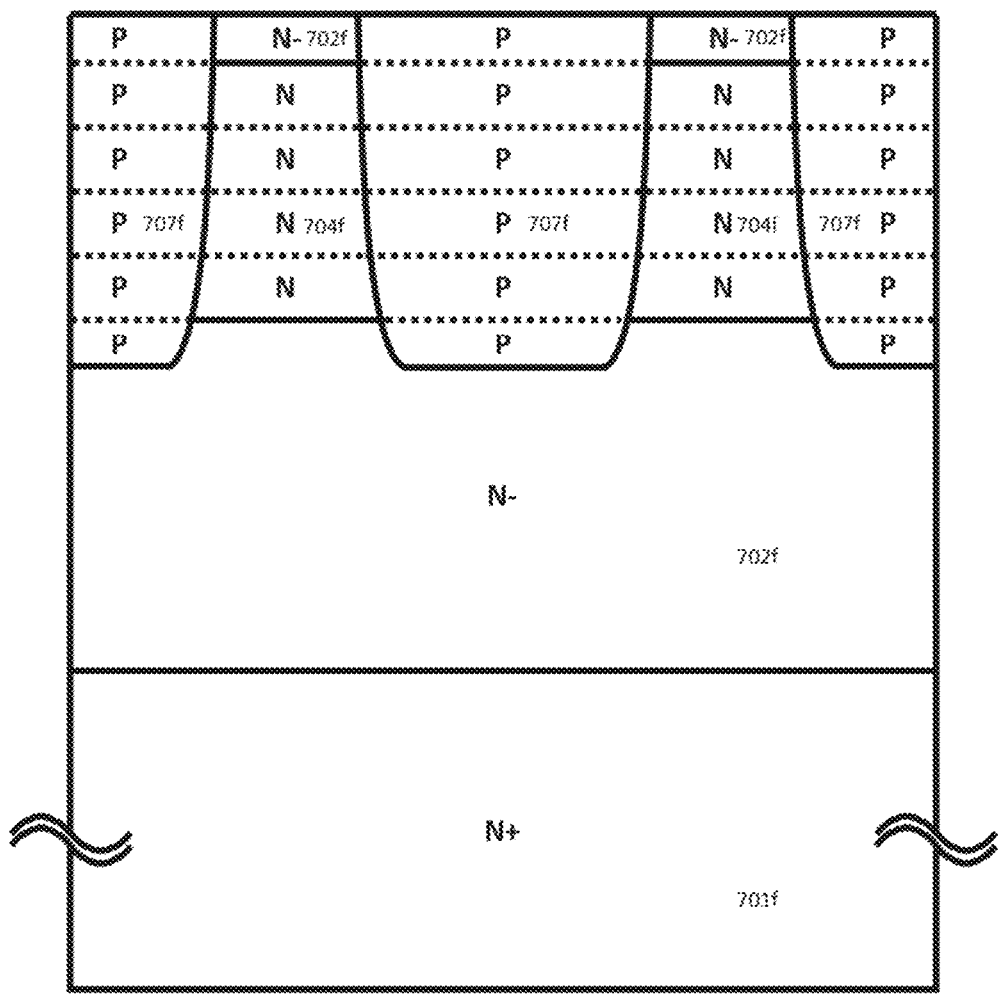
Figure 7F:
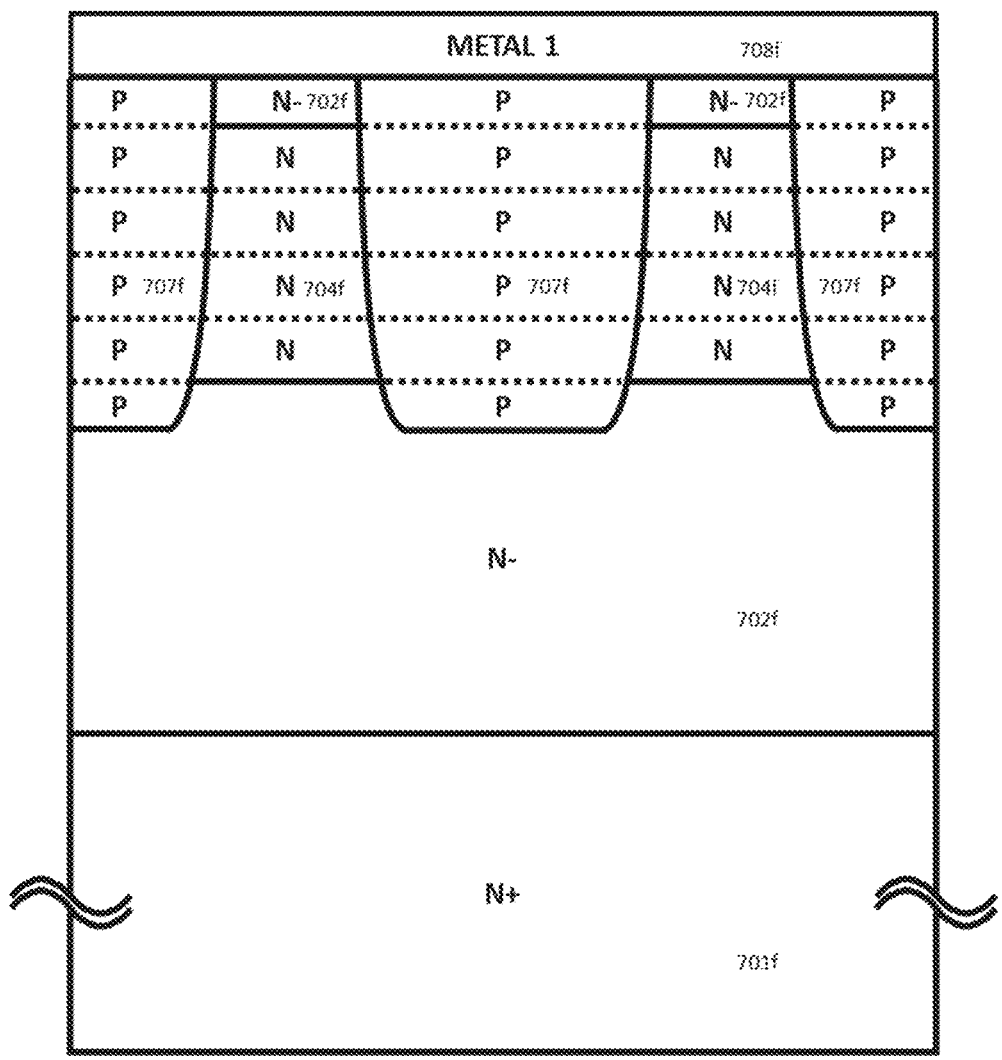
Figure 7F:
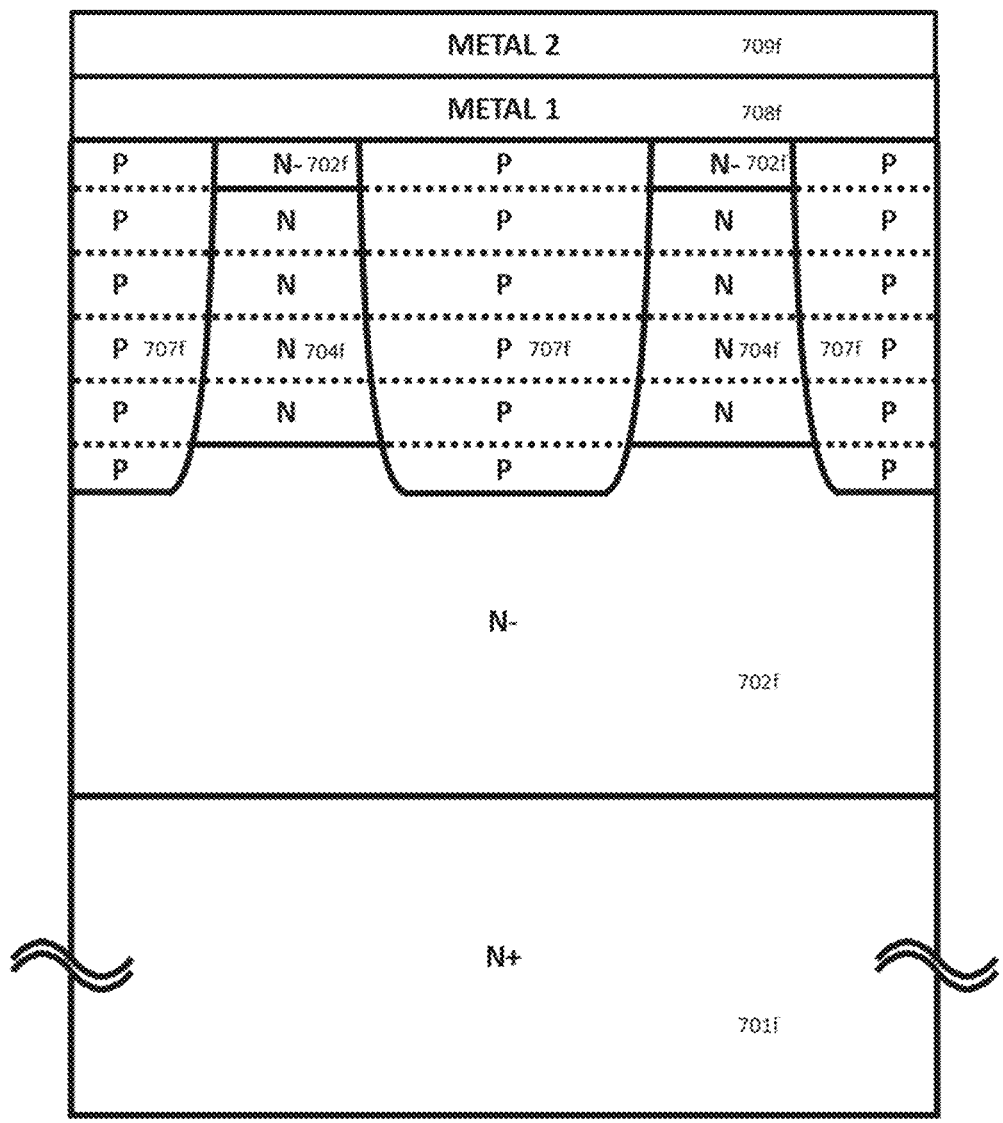
Figure 7F:
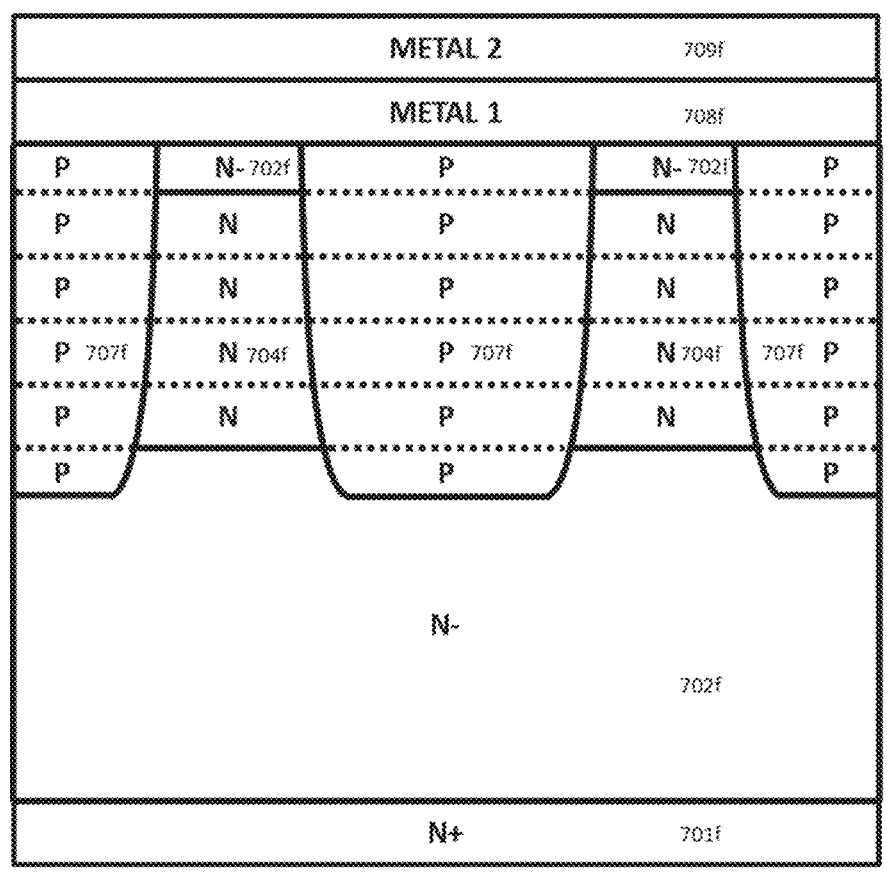
Figure 7F:
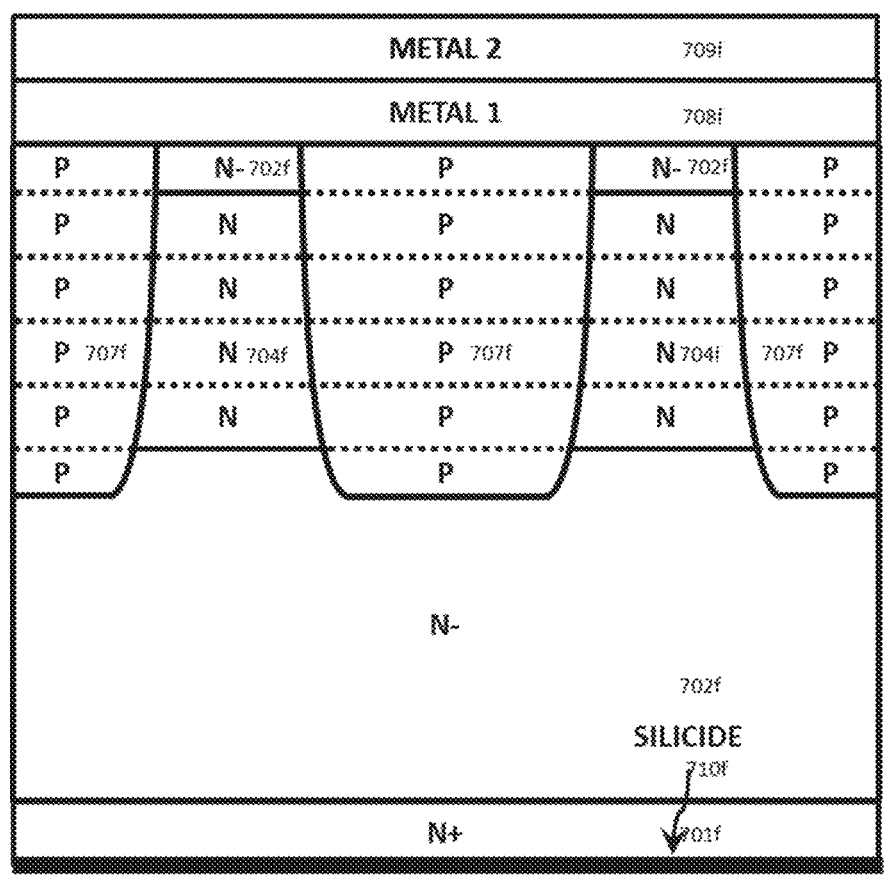
Figure 7F:
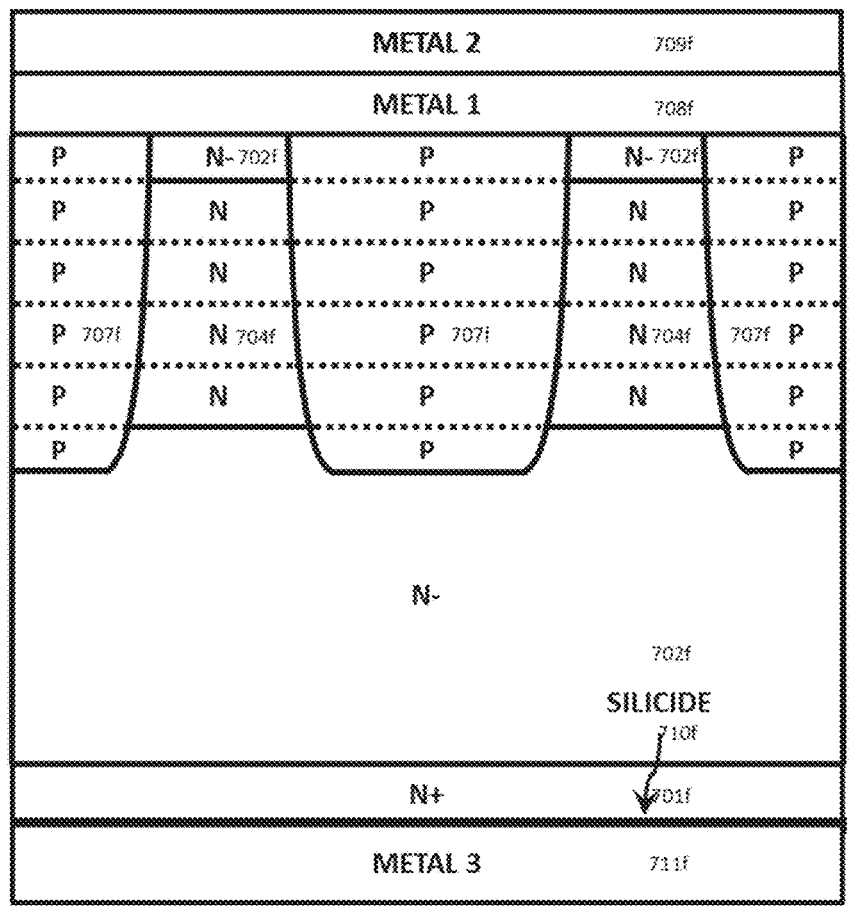

FIG. 7FA to FIG. 7FL describes the process of manufacturing the structure shown in FIG. 6F. The manufacturing process of the device includes preparing a SiC wafer in FIG. 7FA which consists of a highly conductive N+ substrate 701f and an N− drift region 702f, where the N− drift region is typically epi-grown. The N− drift region 702f is designed in such a way that the doping concentration and thickness of the N− drift region are primarily selected based on the required blocking performance. When the SiC wafer is prepared, a set of multiple ion implantation steps with an n-type species 703f such as nitrogen and/or phosphorus is performed onto the active region of the device in FIG. 7FB. The set of multiple ion implantation steps with the n-type species forms a set of sub n-type regions 704f in FIG. 7FC where each sub region is defined by the dotted line in the schematic for indicating the top and bottom of the sub region and all sub regions are interconnected. The interconnected sub regions consist of the N+ region as a whole. The edge termination which is not shown needs to be masked during the set of n-type ion implantation steps. It is important to note that the n-type ion implantation steps 703f needs to be performed in such a fashion that the N+ region 704f is completely buried inside the N− drift region in FIG. 7FC. The ion implantation steps should form the N+ region 704f where the top of the N+ region is physically off from the wafer surface.

A patterned mask 705f, which is preferably a hard mask made of such as an oxide, a nitride, a polysilicon layer, or a combination of these, is formed on the wafer surface in FIG. 7FD. The patterned mask must be thick enough to completely block any high energy impurities during the subsequent ion implant step. A set of multiple ion implantation steps with a p-type impurity 706f such as aluminum and/or boron is performed in FIG. 7FE to form a set of multiple P+ wells 707f in FIG. 7FF. The set of multiple ion implantation steps with the p-type species forms a set of sub p-type regions 707f in FIG. 7FF where each sub region is defined by the dotted line in the schematic for indicating the top and bottom of the sub region and all sub regions are interconnected. The P+ region 707f is formed by multiple P sub-regions. The bottoms of the set of multiple P+ wells 707f are formed such that they are below the bottom of the N+ region 704f. In the embodiments herein, the depth of the set of multiple P+ wells is greater than the depth of the N+ region. The set of multiple P+ wells leads to a P+ region as a whole in FIG. 7FF. The edge termination region which is not shown may be formed by the p-type ion implantation step. The patterned mask 705f is removed by dry or wet etching process in FIG. 7FG. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 708f marked as METAL 1 directly on the wafer surface in FIG. 7FH. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 709f marked as METAL 2 is then deposited on top of the wafer in FIG. 7FI and patterned by dry etching, wet etching, or lift-off. The first pad metal can be of Aluminum/Aluminum-based alloy. The wafer is then thinned from its back side until its thickness reaches to a target thickness of 100~200 µm in FIG. 7FJ. The thickness may be further reduced in the future when the wafer thinning technology improves and provides the target thickness less than the aforementioned 100~200 µm. The wafer thinning can be accomplished by CMP, wet etching, dry etching, or a combination of the aforementioned grinding techniques with a proper protective coating at the front side of the wafer.

A silicide region 710f on the back side of the wafer is then formed in FIG. 7FK. The silicide region is required to form a good ohmic contact on the back side of the wafer. The silicide region is formed by depositing ohmic metal stack and annealing the wafer by using a laser annealing technique as an example. A second pad metal 711f marked as METAL 3 is formed on the back side of the wafer in FIG. 7FL. The second pad metal can be of Aluminum or Aluminum-based alloy. After the second pad metal step is finished, a protective coating process step may be followed on top of the wafer to form a moisture barrier.

Another method to fabricate this embodiment is to use a SiC wafer with multiple n-type epi-grown layers to start with. In this case, the SiC wafer consists of multiple n-type epi-grown layers in FIG. 7FC with different doping concentrations and thicknesses and the N+ substrate at the bottom of the SiC wafer. On top of the N+ substrate 701f, an N− drift layer 702f can be epi-grown for serving as a drift/blocking layer. On top of the N− drift layer, a number of n-type epilayers can be grown to form an N+ region 704f as a whole which consists of a set of sub n-type regions where each sub region is defined by different doping concentration and thickness and all sub regions are interconnected. On top of the buried N+ region, an N− layer can be formed which reaches to the surface of the SIC wafer 702f.

When the SiC wafer with the aforementioned epi structure is prepared, a patterned mask 705f, which is preferably a hard mask made of such as an oxide, a nitride, a polysilicon layer, or a combination of these, is formed on the wafer surface in FIG. 7FD. The patterned mask must be thick enough to completely block any high energy impurities during the subsequent ion implant step. A set of multiple ion implantation steps with a p-type impurity 706f such as aluminum and/or boron is performed in FIG. 7FE to form a set of multiple P+ wells 707f in FIG. 7FF. The set of multiple ion implantation steps with the p-type species forms a set of sub p-type regions 707f in FIG. 7FF where each sub region is defined by the dotted line in the schematic for indicating the top and bottom of the sub region and all sub regions are interconnected. The P+ region 707f is formed by multiple P sub-regions. The bottoms of the set of multiple P+ wells 707f are formed such that they are below the bottom of the N+ region 704f. In the embodiments herein, the depth of the set of multiple P+ wells is greater than the depth of the N+ region. The set of multiple P+ wells leads to a P+ region as a whole in FIG. 7FF. The edge termination region which is not shown may be formed by the p-type ion implantation step. The patterned mask 705f is removed by dry or wet etching process in FIG. 7FG. This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 708f marked as METAL 1 directly on the wafer surface in FIG. 7FH. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 709f marked as METAL 2 is then deposited on top of the wafer in FIG. 7FI and patterned by dry etching, wet etching, or lift-off. The first pad metal can be of Aluminum/Aluminum-based alloy. The wafer is then thinned from its back side until its thickness reaches to a target thickness of 100~200 µm in FIG. 7FJ. The thickness may be further reduced in the future when the wafer thinning technology improves and provides the target thickness less than the aforementioned 100~200 µm. The wafer thinning can be accomplished by CMP, wet etching, dry etching, or a combination of the aforementioned grinding techniques with a proper protective coating at the front side of the wafer.

A silicide region 710f on the back side of the wafer is then formed in FIG. 7FK. The silicide region is required to form a good ohmic contact on the back side of the wafer. The silicide region is formed by depositing ohmic metal stack and annealing the wafer by using a laser annealing technique as an example. A second pad metal 711f marked as METAL 3 is formed on the back side of the wafer in FIG. 7FL. The second pad metal can be of Aluminum or Aluminum-based alloy. After the second pad metal step is finished, a protective coating process step may be followed on top of the wafer to form a moisture barrier.

The advantage of the device structures shown in embodiments of FIG. 6A to FIG. 6F over those in FIG. 2A and FIG. 4 is that the doping concentration of the sub-regions can be appropriately fine-tuned to realize more optimum trade-off between the reverse leakage current and on-state voltage drop. In one implementation, the doping concentration in the N-type sub-regions farther away from the SiC surface can be made progressively higher, which may benefit from lower conduction losses. In another implementation, the doping concentration in the P-type sub-regions farther away from the SiC surface can be made progressively lower, which may enable better blocking characteristics.

Figure 8:
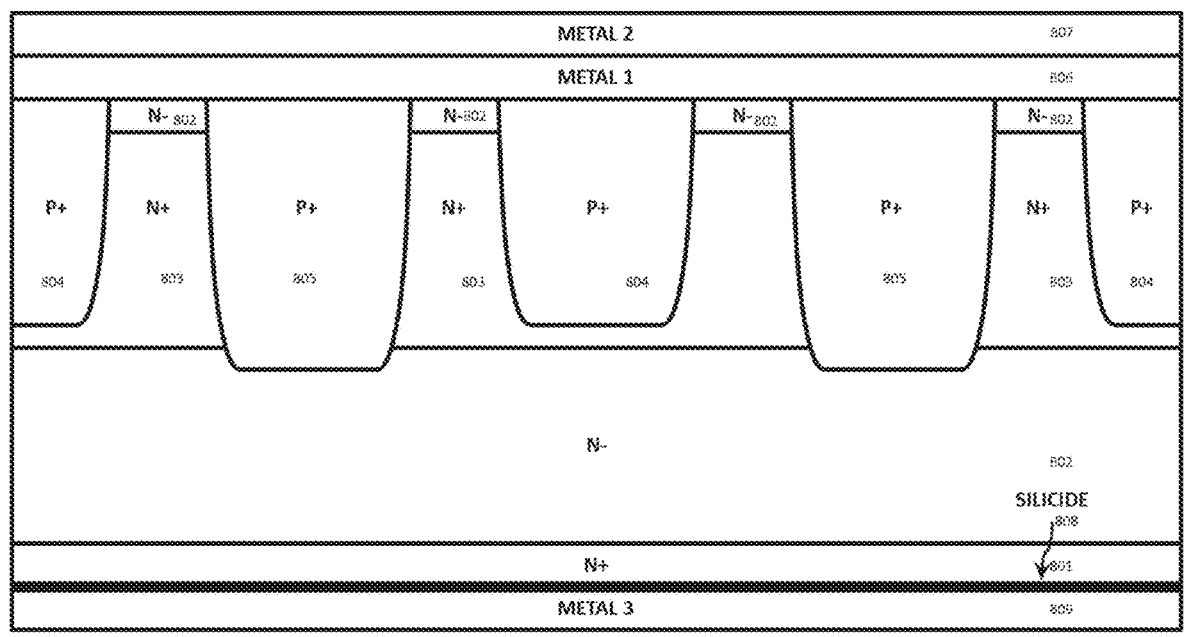
FIG. 8 is an embodiment of MPS diode structure with two different types of P+ wells depending on their depths which are in comparison to the depth of the N+ layer

In the device of shown in FIG. 8 is the cross-sectional schematic of SiC MPS diode. The key regions of this device are an N+ substrate 801 at the bottom which gives mechanical support of the wafer and is ~350 μm-thick. An N− drift region 802 which is usually an epi layer and is on top of the N+ substrate. There are two different types of P+ wells depending on their depths which are in comparison to the depth of the N+ layer. The P+ wells 804 whose depths are less than the depth of the N+ layer 803 is called a first P+ wells while other P+ wells 805 whose depths are greater than the depth of the N+ layer 803 is called a second P+ wells. The N+ layer 803 is formed in such a way to completely surround the first P+ wells 804 and allow the second P+ wells 805 to completely penetrate the N+ layer which exposes the bottom of the second P+ wells 805 to the N− drift region 802. The device has a first metal layer 806 denoted as METAL 1, which is the Schottky metal to an N-type SiC semiconductor region and forms Schottky contact to its underlying N-type regions. The device has a second metal layer 807 denoted as METAL 2 on the front side of the wafer which is in contact with the METAL 1. METAL 2 is often called "power metal" and is usually in Aluminum. There is a silicide layer 808 under the bottom of the N+ substrate. There is a third metal layer 809 denoted as METAL 3 under the back side of the wafer which is in contact with the silicide layer.

The device shown in FIG. 8 has a N+ region 803 which is interspersed between a set of two different types of P+ wells depending on their depths which are in comparison to the depth of the N+ layer. The P+ wells 804 whose depths are less than the depth of the N+ layer 803 is called a first P+ wells while other P+ wells 805 whose depths are greater than the depth of the N+ layer 803 is called a second P+ wells. The N+ layer 803 is formed in such a way to completely surround the first P+ wells 804 and allow the second P+ wells 805 to completely penetrate the N+ layer which exposes the bottom of the second P+ wells 805 to the N− drift region 802. The physical separation of the N+ region from a SiC wafer surface is a critical feature of the embodiment described herein and distinguishes it from other similar inventions. A part of the SiC wafer which is in contact with a Schottky metal 806 denoted as METAL 1 and is an n-type semiconductor has the same doping concentration of the N− drift 802. In the embodiment described herein, the doping concentration of the n-type SiC semiconductor which is in direct contact with the Schottky metal 806 labeled METAL 1 is critical for reducing the strength of the electric field at the wafer surface, during the high-voltage blocking mode of operation of the SiC MPS diode.

Figure 9A:
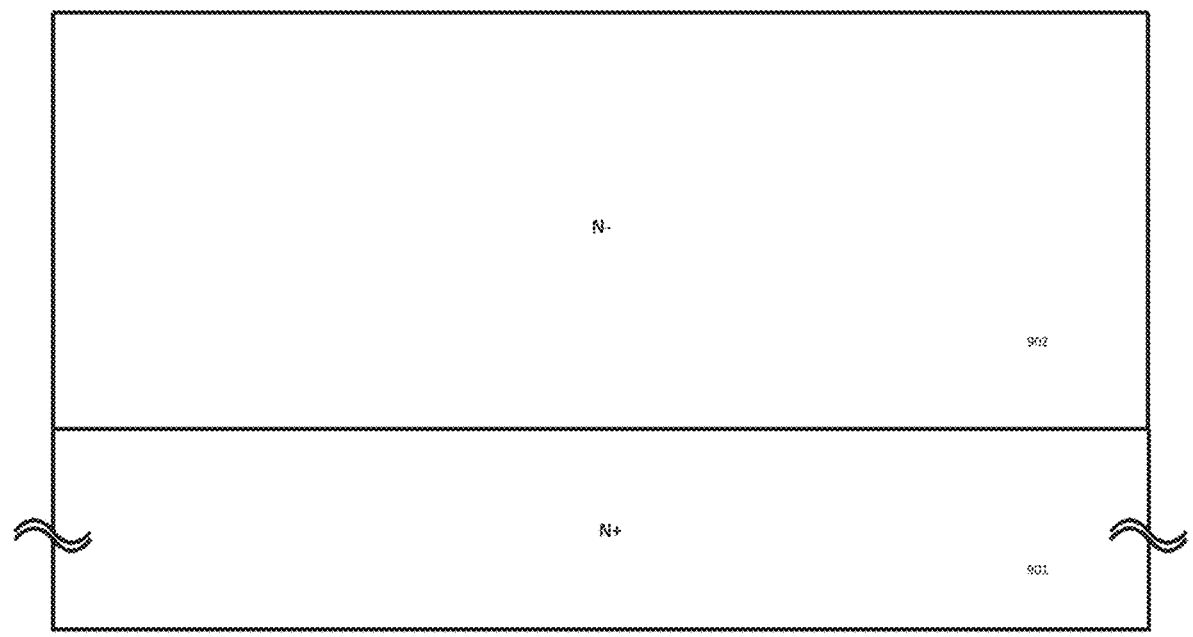
FIG. 9A to FIG. 9P are cross sectional views showing the process steps for manufacturing the SiC MPS diode shown in FIG. 8.
Figure 9B:
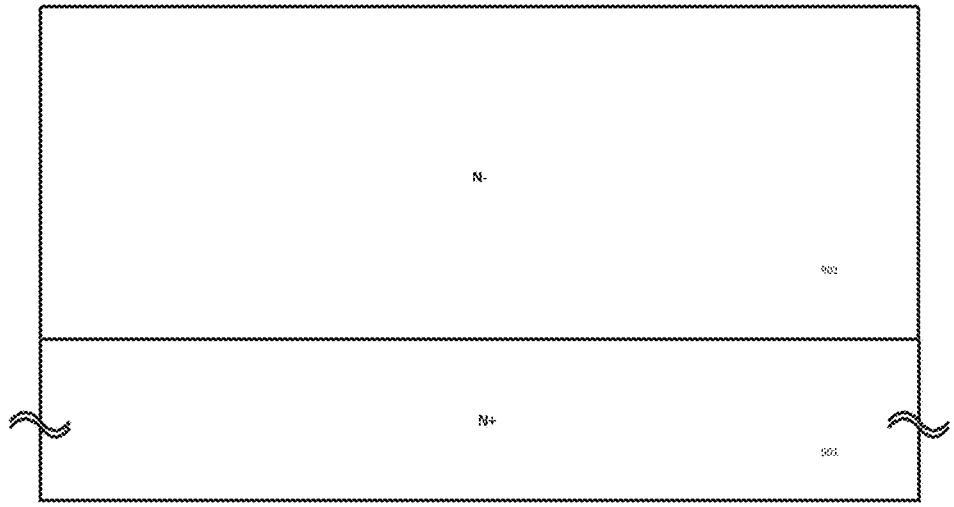
Figure 9C:
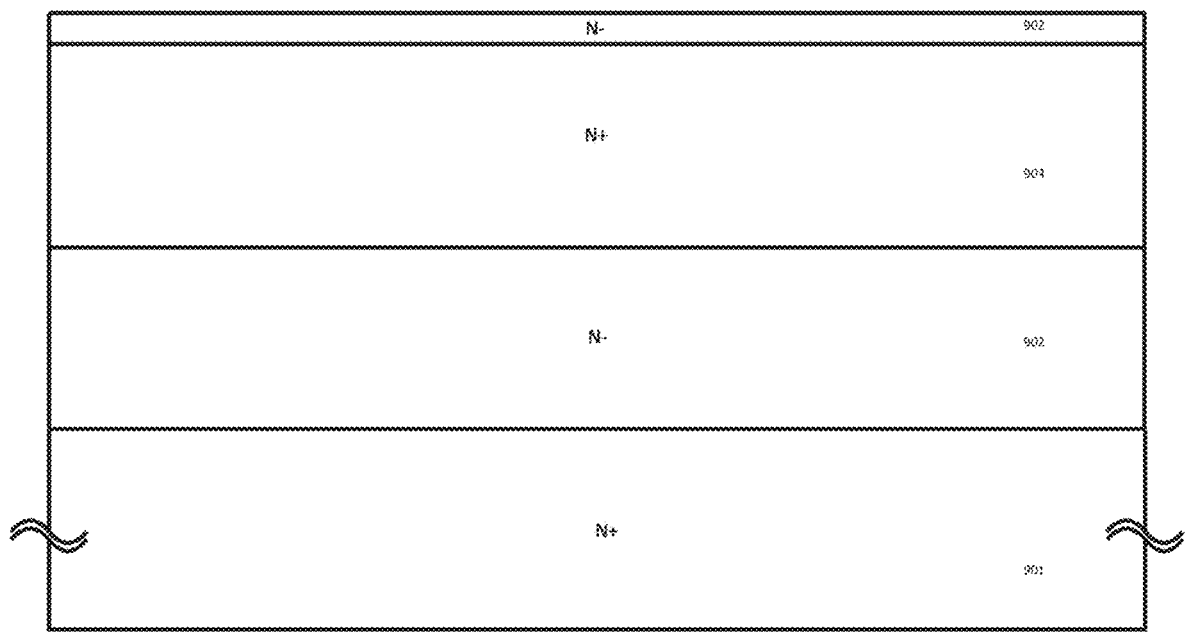
Figure 9D:
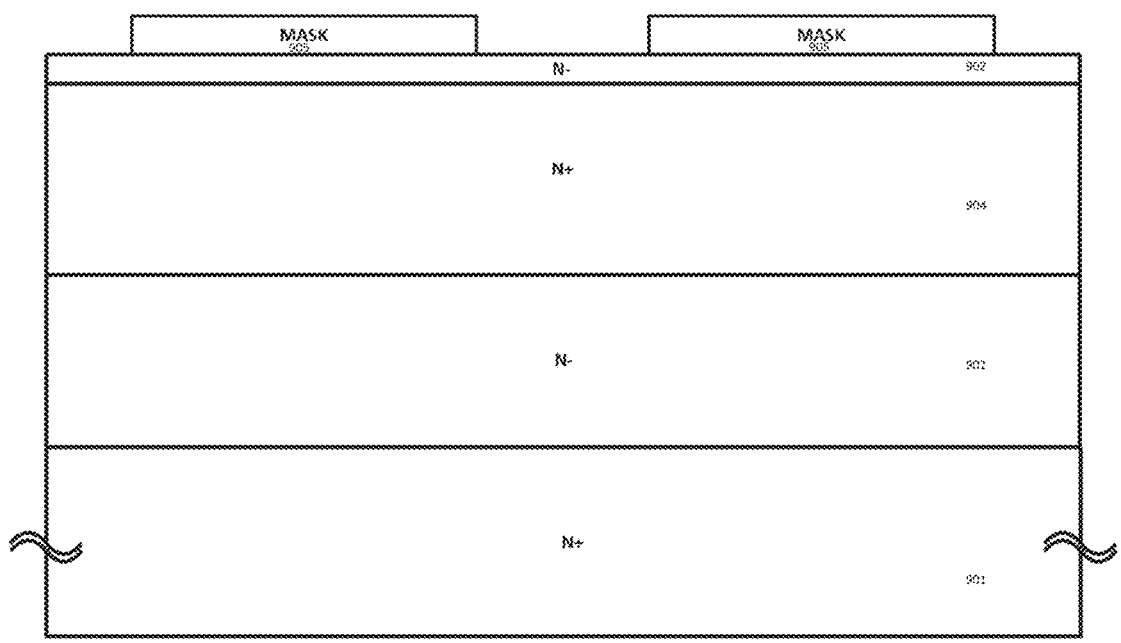
Figure 9E:
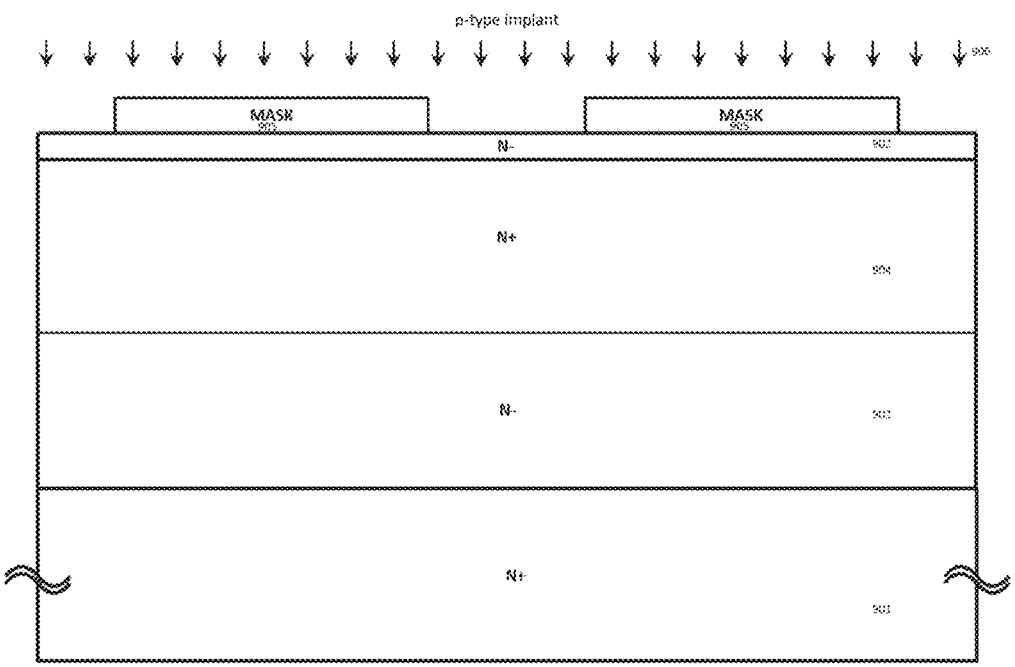
Figure 9F:
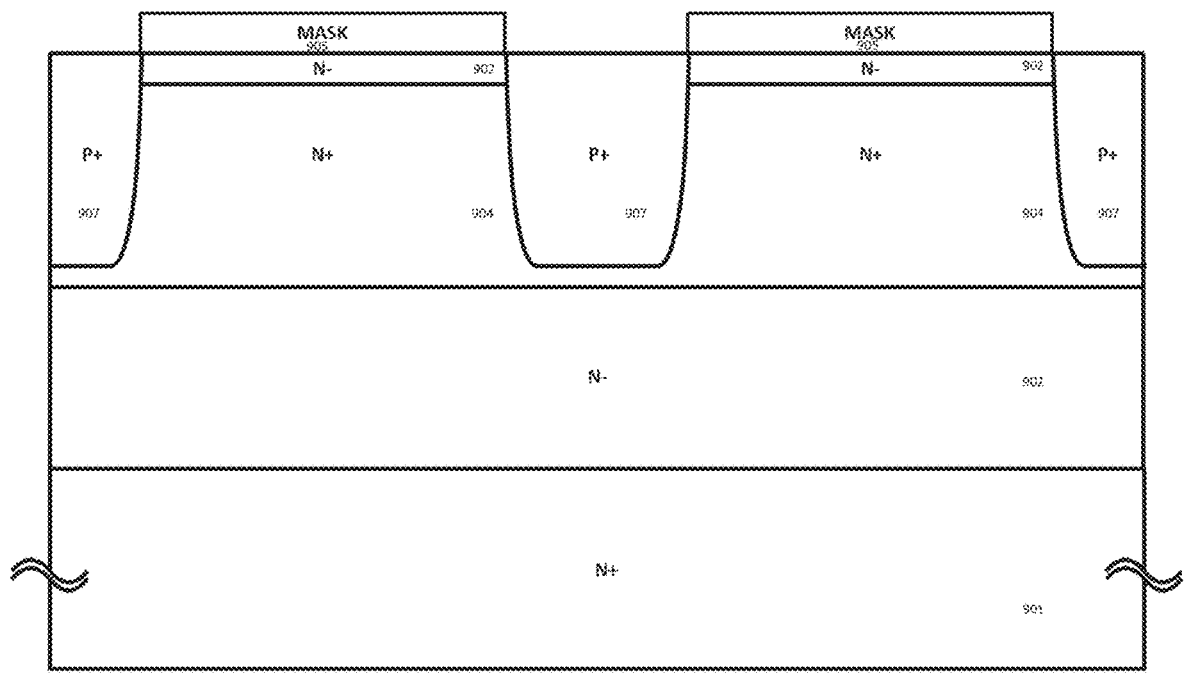
Figure 9G:
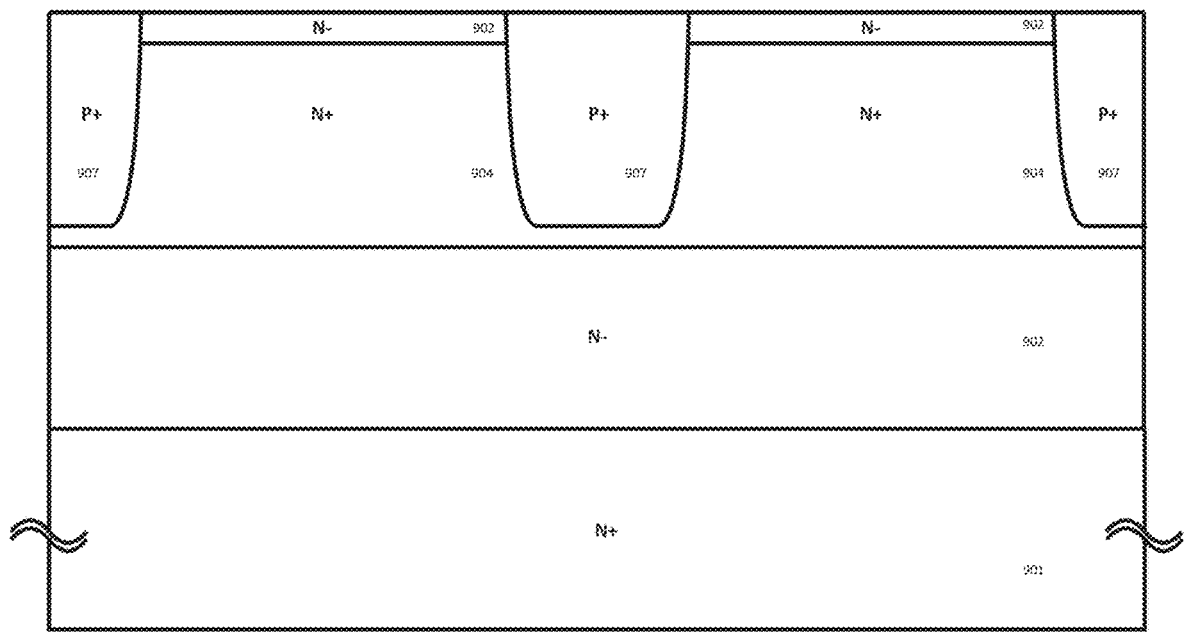
Figure 9H:
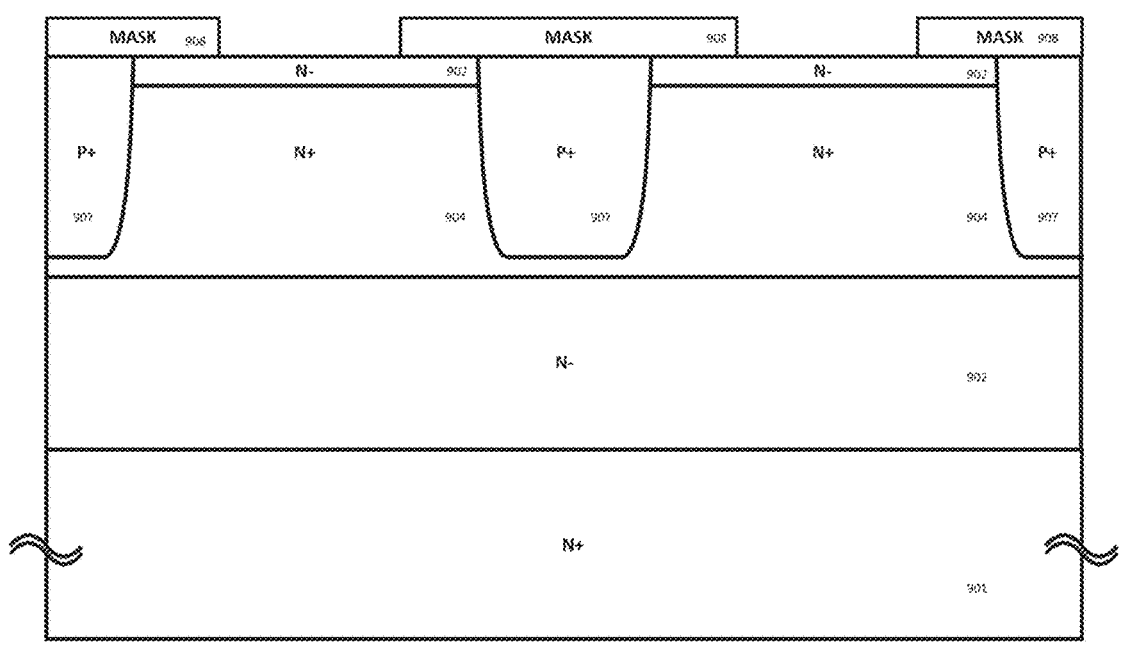
Figure 9I:
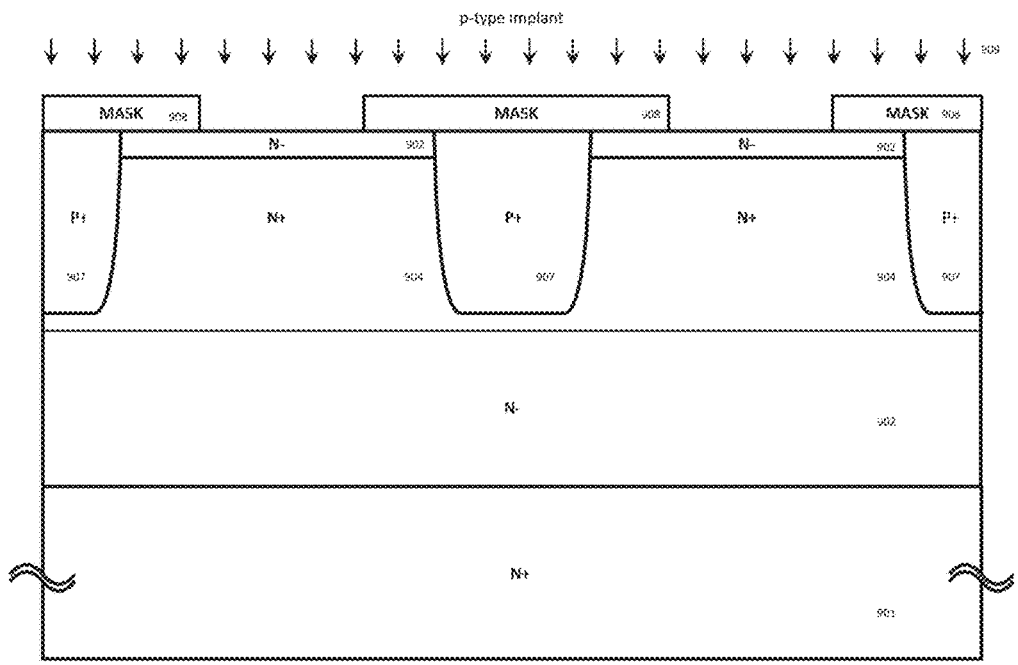
Figure 9J:
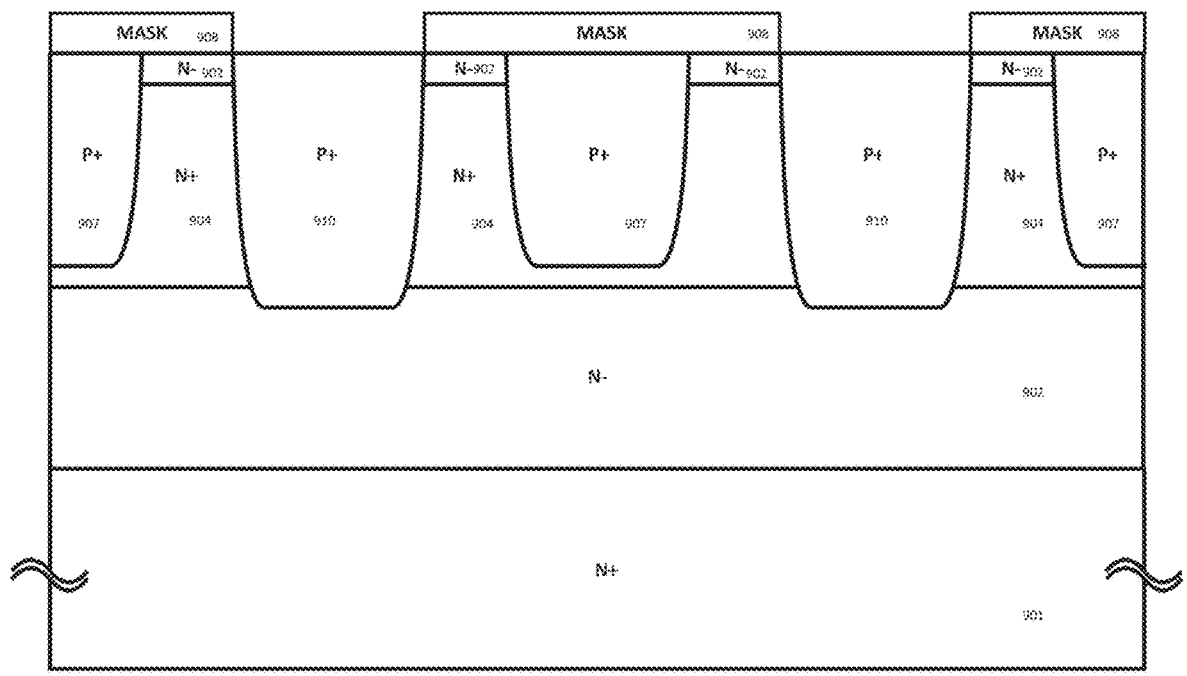
Figure 9K:
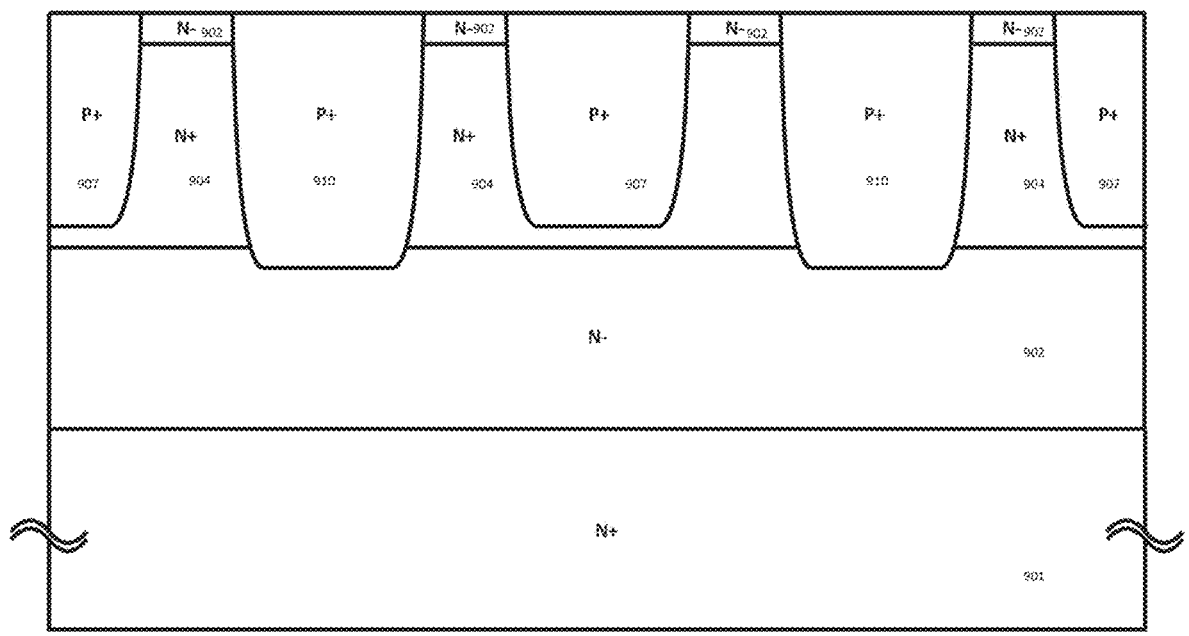
Figure 9L:
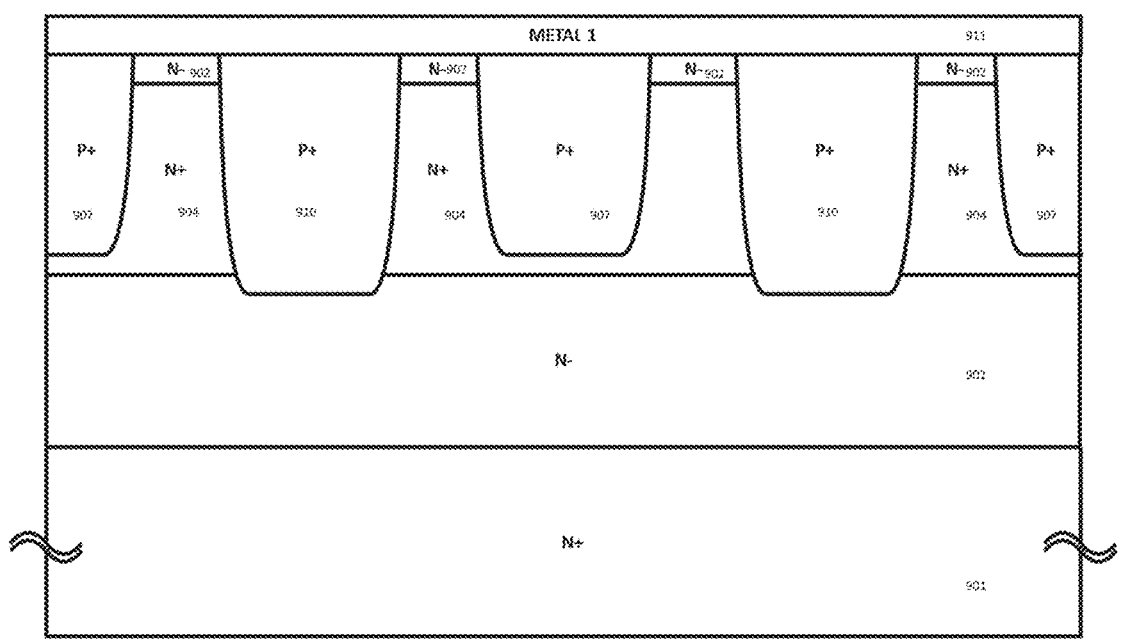
Figure 9M:
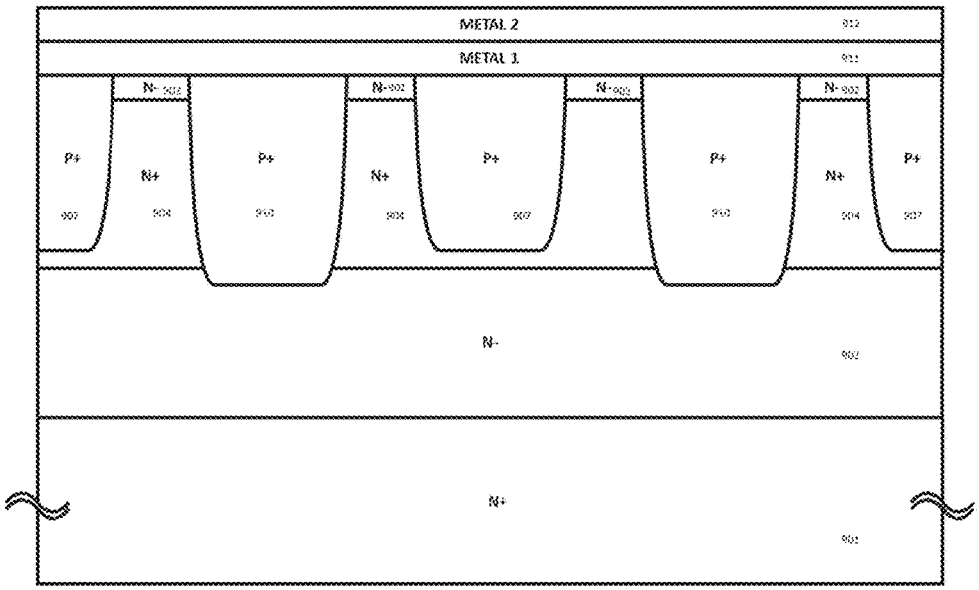
Figure 9N:
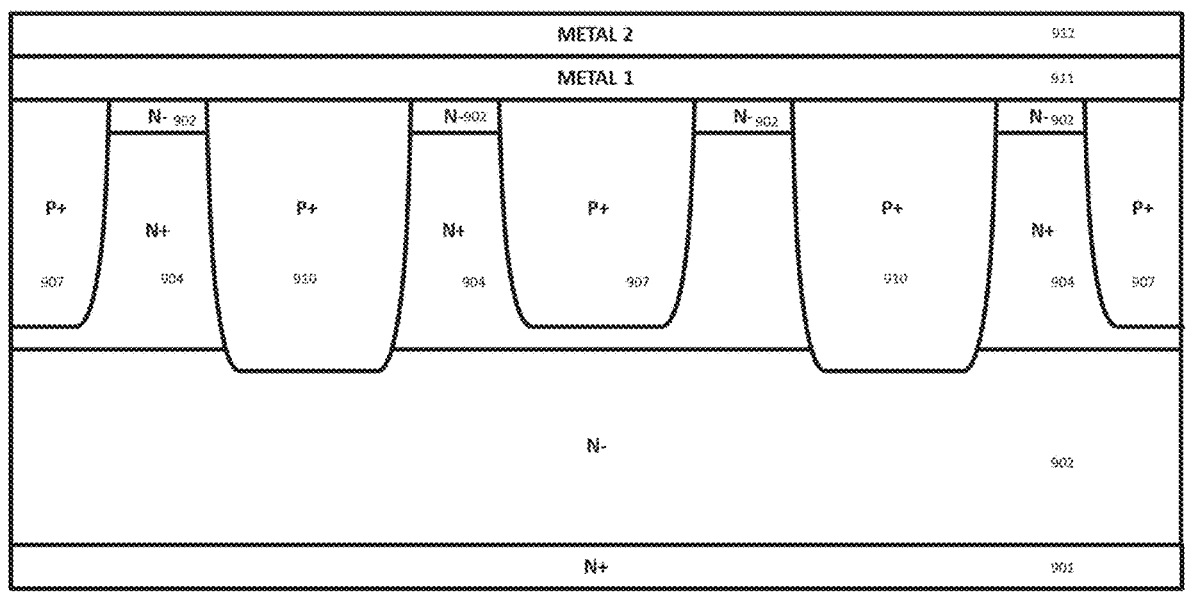
Figure 9O:
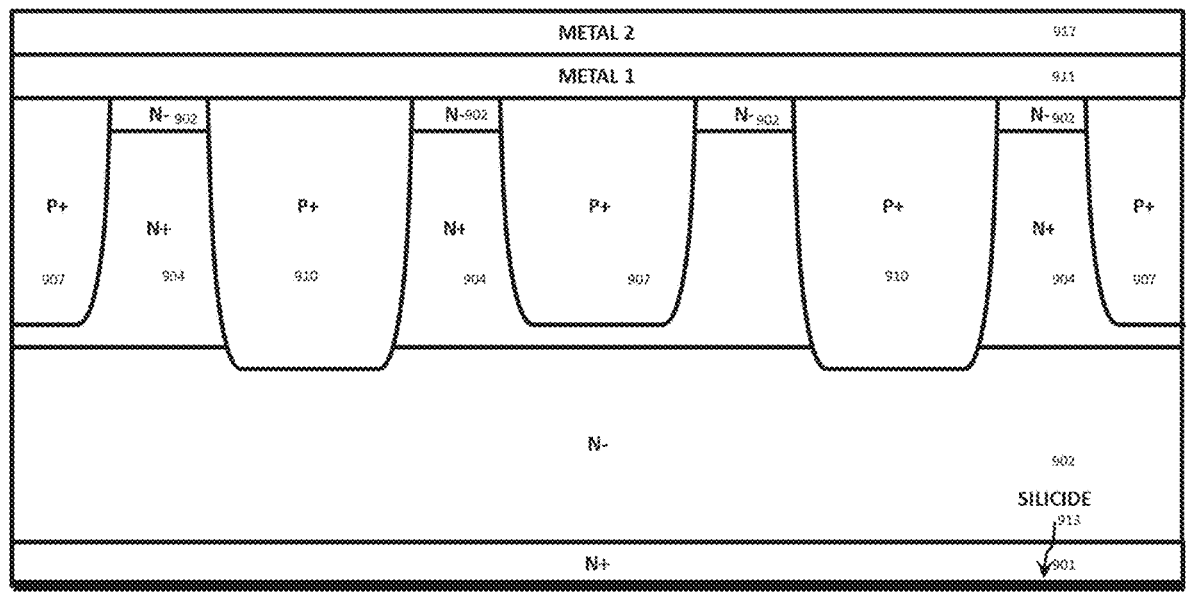
Figure 9P:
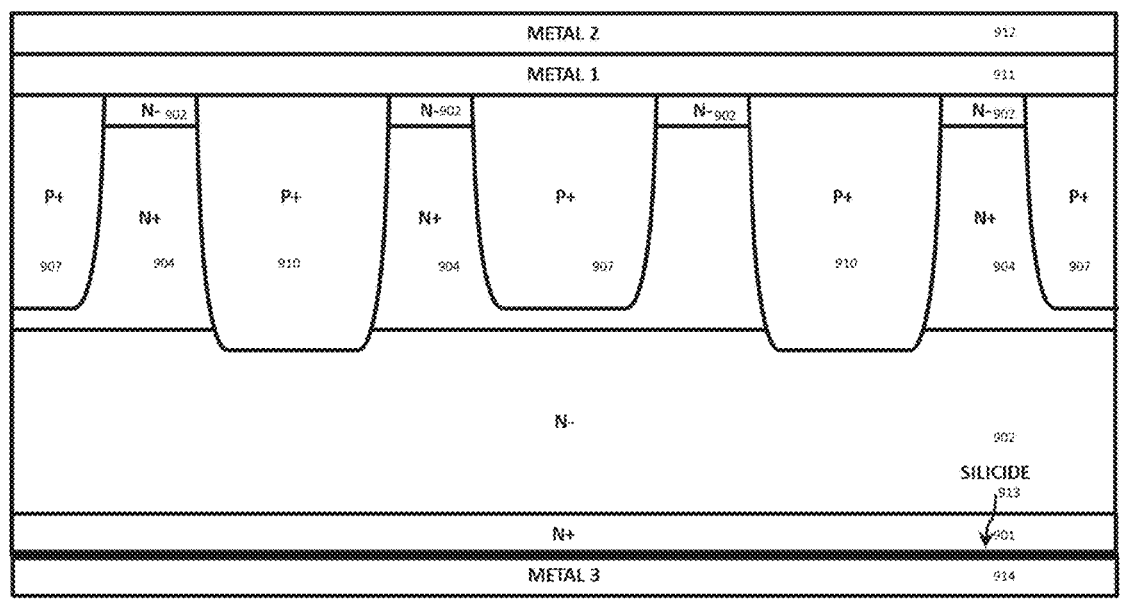

FIG. 9A to FIG. 9P describes the process of manufacturing the structure shown in FIG. 8. The manufacturing process of the device includes preparing a SiC wafer in FIG. 9A which consists of a highly conductive N+ substrate 901 and an N− drift region 902, where the N− drift region is typically epi-grown. The N− drift region 902 is designed in such a way that the doping concentration and thickness of the N− drift region are primarily selected based on the required blocking performance. When the SiC wafer is prepared, an ion implantation step with an n-type species 903 such as nitrogen and/or phosphorus is performed onto the active region of the device in FIG. 9B forming an N+ region within the N− drift region. The edge termination which is not shown needs to be masked during the n-type ion implantation step. It is important to note that the n-type ion implantation step 903 needs to be performed in such a fashion that the N+ region 904 is completely buried inside the N− drift region in FIG. 9C. The ion implantation step should form the N+ region 904 where the top of the N+ region is physically off from the wafer surface.

A first patterned mask 905, which is preferably a hard mask made of such as an oxide, a nitride, a polysilicon layer, or a combination of these, is formed on the wafer surface in FIG. 9D. The first patterned mask must be thick enough to completely block any high energy impurities during the subsequent ion implant step. A first p-type ion implantation step with a p-type impurity 906 such as aluminum and/or boron is performed in FIG. 9E to form a first set of multiple P+ wells 907 in FIG. 9F. The depths of the first set of multiple P+ wells 907 are formed such that they are completely surrounded by the N+ region 904. In the embodiments herein, the depth of the first set of multiple P+ wells is less than the depth of the N+ region. The first patterned mask 909 is removed by dry or wet etching process in FIG. 9G.

After the first patterned mask is removed, a second patterned mask 908, which preferably is a hard mask made of such as an oxide, a nitride, a polysilicon layer, or a combination of these, is formed on the wafer surface in FIG. 9H. The second patterned 908 mask must be thick enough to completely block any high energy impurities during the subsequent ion implant step. A second p-type ion implantation step 909 with a p-type impurity such as aluminum and/or boron is performed in FIG. 9I in such a way to form a second multiple P+ wells where the bottom of the second set of multiple P+ wells 910 is below the bottom of the N+ region 904 in FIG. 9J. The first set of multiple P+ wells and the second set of multiple P+ wells lead to a P+ region as a whole. The edge termination region which is not shown may be formed by the first p-type ion implantation step and/or the second p-type ion implantation step. The second patterned mask 908 is removed by dry or wet etching process in FIG. 9K.

This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 911 marked as METAL 1 directly on the wafer surface in FIG. 9L. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 912 marked as METAL 2 is then deposited on top of the wafer in FIG. 9M and patterned by dry etching, wet etching, or lift-off. The first pad metal can be of Aluminum/Aluminum-based alloy. The wafer is then thinned from its back side until its thickness reaches to a target thickness of 100~200 μm in FIG. 9N. The thickness may be further reduced in the future when the wafer thinning technology improves and provides the target thickness less than the aforementioned 100~200 µm. The wafer thinning can be accomplished by CMP, wet etching, dry etching, or a combination of the aforementioned grinding techniques with a proper protective coating at the front side of the wafer.

A silicide region 913 on the back side of the wafer is then formed in FIG. 9O. The silicide region is required to form a good ohmic contact on the back side of the wafer. The silicide region is formed by depositing ohmic metal stack and annealing the wafer by using a laser annealing technique as an example. A second pad metal 914 marked as METAL 3 is formed on the back side of the wafer in FIG. 9P. The second pad metal can be of Aluminum or Aluminum-based alloy. After the second pad metal step is finished, a protective coating process step may be followed on top of the wafer to form a moisture barrier.

Another method to fabricate this embodiment is to use a SiC wafer with multiple n-type epi-grown layers to start with. In this case, the SiC wafer consists of three n-type epi-grown layers in FIG. 9C with different doping concentrations and thicknesses and the N+ substrate at the bottom of the SiC wafer. The three n-type epi-grown layers should be formed in such a way that an N– layer 902 is meeting a device side of the wafer and an N+ layer 904 is positioned right underneath the N– layer, where the N+ layer is on top of a second N– layer also labeled 902 which serves as a drift region and the second N– layer is positioned on top of the N+ substrate 901.

When the SiC wafer with the aforementioned epi structure is prepared, a first patterned mask 905, which is preferably a hard mask made of such as an oxide, a nitride, a polysilicon layer, or a combination of these, is formed on the wafer surface in FIG. 9D. The first patterned mask must be thick enough to completely block any high energy impurities during the subsequent ion implant step. A first p-type ion implantation step with a p-type impurity 906 such as aluminum and/or boron is performed in FIG. 9E to form a first set of multiple P+ wells 907 in FIG. 9F. The depths of the first set of multiple P+ wells 907 are formed such that they are completely surrounded by the N+ region 904. In the embodiments herein, the depth of the first set of multiple P+ wells is less than the depth of the N+ region. The first patterned mask 909 is removed by dry or wet etching process in FIG. 9G.

After the first patterned mask is removed, a second patterned mask 908, which preferably is a hard mask made of such as an oxide, a nitride, a polysilicon layer, or a combination of these, is formed on the wafer surface in FIG. 9H. The second patterned 908 mask must be thick enough to completely block any high energy impurities during the subsequent ion implant step. A second p-type ion implantation step 909 with a p-type impurity such as aluminum and/or boron is performed in FIG. 9I in such a way to form a second multiple P+ wells where the bottom of the second set of multiple P+ wells 910 is below the bottom of the N+ region 904 in FIG. 9J. The first set of multiple P+ wells and the second set of multiple P+ wells lead to a P+ region as a whole. The edge termination region which is not shown may be formed by the first p-type ion implantation step and/or the second p-type ion implantation step. The second patterned mask 908 is removed by dry or wet etching process in FIG. 9K.

This is followed by a process step to electrically activate all the implanted impurity species by coating the wafer with a suitable coating material such as a carbon cap and annealing at high temperature such as 1700° C. The active region is then defined by forming a field oxide layer on the entire wafer surface and clearing out a part of the field oxide where the conduction current needs to flow for on-state operation of the device.

The Schottky contact is formed on the wafer surface by depositing a Schottky metal 911 marked as METAL 1 directly on the wafer surface in FIG. 9L. The deposited Schottky metal layer is then patterned by using dry etching, wet etching, or lift-off process and annealed at a certain temperature for a certain amount of time by using a furnace or RTA. The thermal budget of the annealing step after the Schottky metal deposition needs to be carefully designed and controlled because it directly affects the barrier height of the Schottky contact. A first pad metal 912 marked as METAL 2 is then deposited on top of the wafer in FIG. 9M and patterned by dry etching, wet etching, or lift-off. The first pad metal can be of Aluminum/Aluminum-based alloy. The wafer is then thinned from its back side until its thickness reaches to a target thickness of 100~200 µm in FIG. 9N. The thickness may be further reduced in the future when the wafer thinning technology improves and provides the target thickness less than the aforementioned 100~200 µm. The wafer thinning can be accomplished by CMP, wet etching, dry etching, or a combination of the aforementioned grinding techniques with a proper protective coating at the front side of the wafer.

A silicide region 913 on the back side of the wafer is then formed in FIG. 9O. The silicide region is required to form a good ohmic contact on the back side of the wafer. The silicide region is formed by depositing ohmic metal stack and annealing the wafer by using a laser annealing technique as an example. A second pad metal 914 marked as METAL 3 is formed on the back side of the wafer in FIG. 9P. The second pad metal can be of Aluminum or Aluminum-based alloy. After the second pad metal step is finished, a protective coating process step may be followed on top of the wafer to form a moisture barrier.

The device of embodiment shown in FIG. 8 combines the desirable features of the devices shown in embodiments described in FIG. 2A and FIG. 4. In the embodiment described in FIG. 8 the first P+ wells that are formed deeper than the N+ layer may serve to inject minority carriers into the N+ drift layer under surge current conditions and the second P+ wells that are completely enclosed by the N+ layer reduce the spreading resistance of the diode current as it spreads vertically from the region in-between the P-type wells to the N– drift layer. The device of embodiment is constructed with both first and second type P+ wells to exploit both aforementioned benefits of the first and second P+ wells, respectively. The proportion of the first and second type P+ wells may be appropriately adjusted to yield a diode that is either tuned for lower conduction losses or one that is designed for withstanding higher surge currents.

Figure 10A:
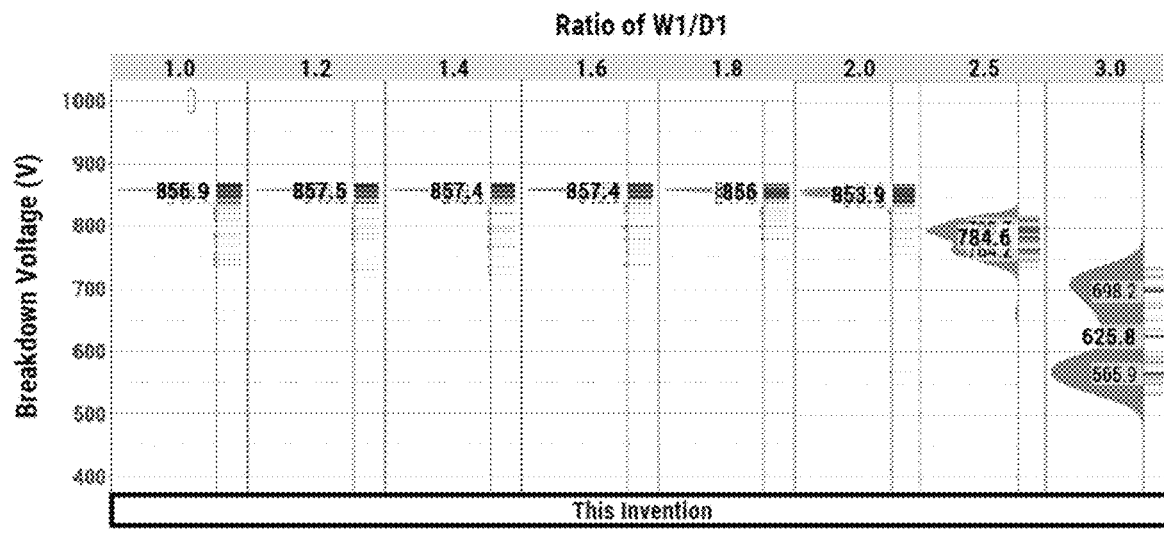
FIG. 10A is the blocking performances of the devices of this invention with varying ratio of W1/D1.

FIG. 10A shows blocking performances of the devices of this invention with varying ratio of W1/D1 that ranges from 1.0 to 3.0 and blocking performance of the device of the prior art with a fixed ratio of W1/D1 which is equal to 3.0. FIG. 10A shows the statistical distribution of the measured blocking voltages of the devices described the various embodiments herein. With a targeted breakdown voltage for these devices at 650 V, the median value of each distribution is highlighted. A leakage current of 10 µA is used as a criteria to measure the blocking voltages and the blocking voltages is greater than the target of 650 V. The measured blocking voltages of the devices of this invention whose ratio of W1/D1 is varied from 1.0 to 2.5 are greater than 650 V. The case when the ratio of W1/D1 equals to 3.0, however, shows its blocking voltage distribution spreads out from 500 V to 730 V where a large portion of the distribution is below the targeted 650 V.

Figure 10B:
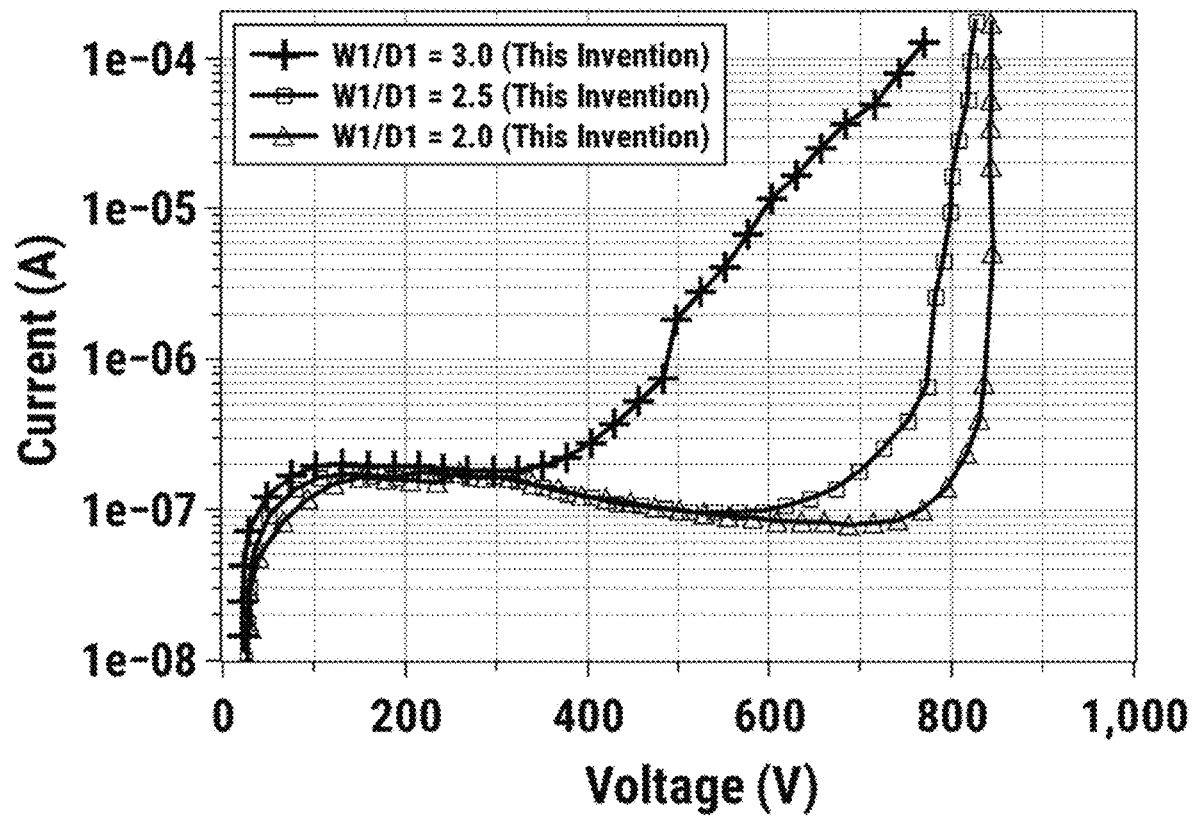
FIG. 10B is the blocking I-V curves of the devices of this invention with varying ratio of W1/D1.

FIG. 10B shows the blocking I-V curves of the devices of this invention with varying ratio of W1/D1 (i.e., 2.0, 2.5 and 3.0). FIG. 10B shows that all the devices with the exception of the device of this invention where the radio of W1/D1 equals to 3.0 block at 650 V with their leakage current kept less than 10 µA which is used as the blocking criterion as mentioned earlier. At 650 V, the device of this invention with the ratio of W1/D1 that equals to 3.0 shows high leakage current of 22 µA which is above 10 µA. Due to the high leakage current density of the device of this invention with the ratio of W1/D1 of 3.0 at the targeted rated voltage of 650 V, the device of this invention with the ratio of W1/D1 of 3.0 is not adequate for the use. Based on the discussion on the blocking performance, it is clear that the ratio of W1/D1 of the devices of this invention should be less than 3.0 to meet the targeted blocking voltage of 650 V.

Figure 10C:
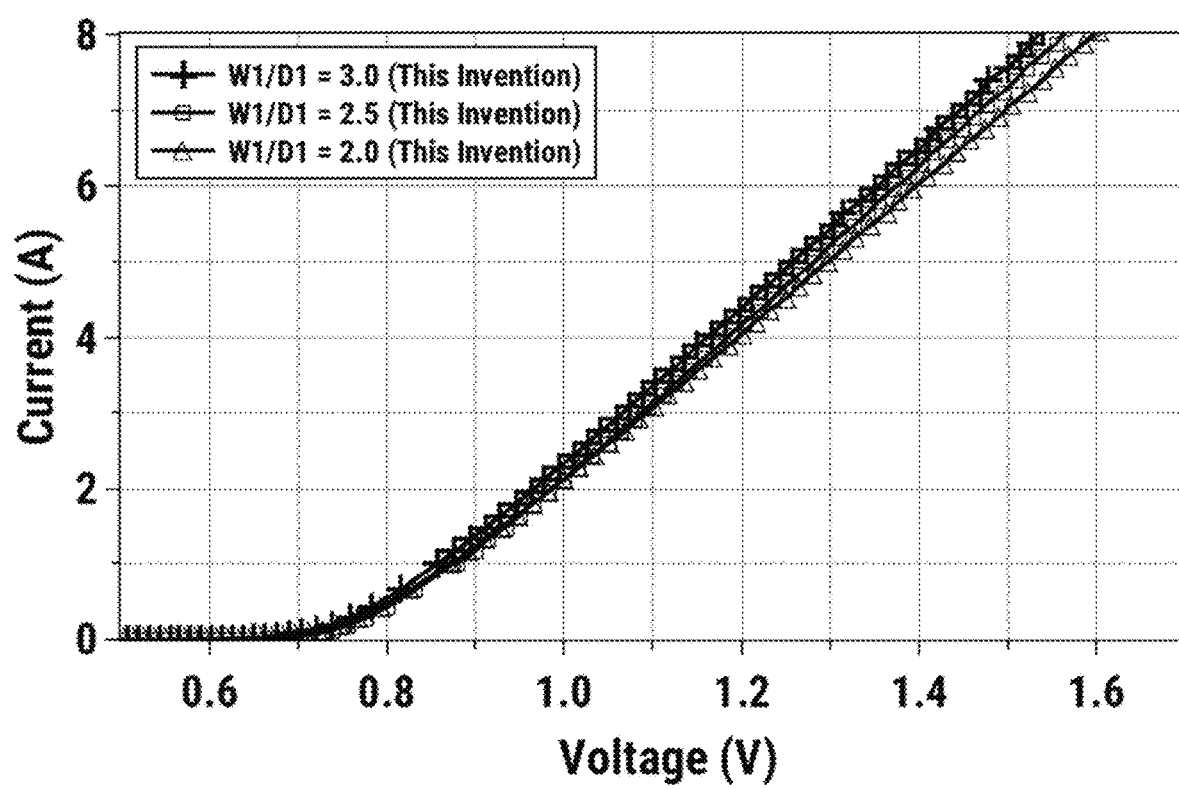
FIG. 10C is the forward I-V curves of the devices of this invention with varying ratio of W1/D1.

FIG. 10C is the forward I-V curves of the devices of this invention with varying ratio of W1/D1 that ranges from 2.0 to 3.0. FIG. 10C shows that increasing the ratio of W1/D1 from 2.0 to 3.0 decreases the forward conduction loss. The device of this invention of the ratio of W1/D1 of 3.0 shows the best forward conduction performance, however due to the aforementioned poor blocking performance of the device, the device is not suitable for the use of 650 V applications.

Figure 10D:
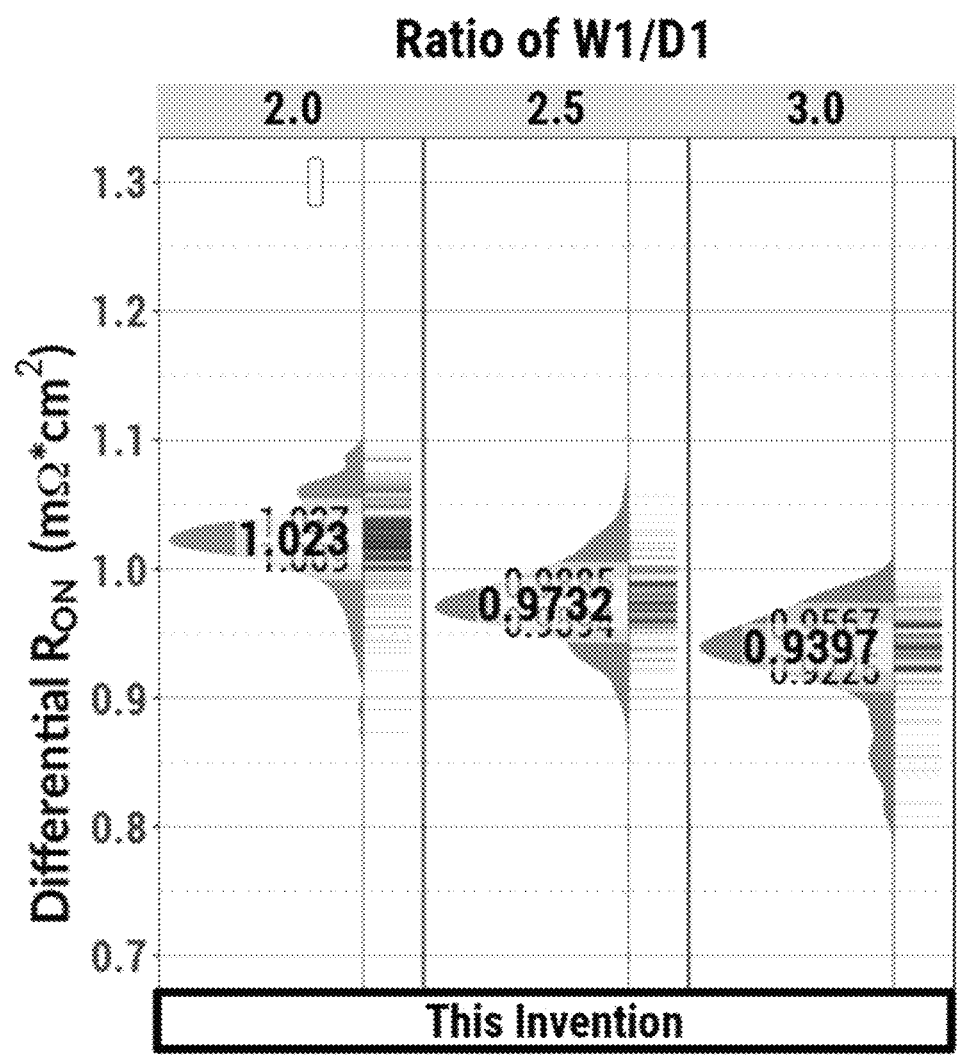
FIG. 10D is the performance of differential specific on-resistances of the devices of this invention with varying ratio of W1/D1.

FIG. 10D shows the performance of differential specific on-resistances of the devices of this invention with varying ratio of W1/D1 that ranges from 2.0 to 3.0. FIG. 10D shows the statistical distribution of the measured differential specific on-resistances of the devices of this invention. The median value of each distribution is highlighted in bold. Clearly, the differential specific on-resistance drops as the ratio of W1/D1 increases. This trend agrees with the observation made on the forward I-V curves in FIG. 10C. Even though the device of this invention of the ratio of W1/D1 of 3.0 shows the best forward conduction performance, the device should not be considered to be appropriate due to its poor blocking performance as mentioned earlier.

The devices of this invention show improvement in both the forward and blocking performance is only valid when the ratio of W1/D1 is less than 3.0.

Other embodiments are also within the scope of the following claims.

Although, various embodiments which incorporate the teachings described in detail herein, those skilled in the art can readily devise many other varied embodiments that still incorporate these teachings. For example, a complementary SiC diode device with a P+ substrate, P– drift layer and multiple N+ islands interspersed with the P+ regions source can be created. The embodiments described are all applicable to the complementary SiC diodes as well.

In the embodiments and claims herein, the terms "first conductivity type region" and "second conductivity type region" are used to describe n-type and p-type regions respectively for a N type device. For a P type device "first conductivity type region" and "second conductivity type region" are used to describe p-type and n-type regions respectively.

All documents (patents, patent publications or other publications) mentioned in the specification are incorporated herein in their entirety by reference.

What is claimed is:

1. A semiconductor component, comprising a semiconductor body of a first conduction type comprising a voltage blocking layer; and islands of a second conductivity type on a contact surface; and a metal layer on the voltage blocking layer, wherein the metal layer and the voltage blocking layer includes a Schottky contact, and a first conductivity type layer comprising the first conduction type not in contact with the Schottky contact that is interspersed between the islands of the second conductivity type.

2. The semiconductor component of claim 1, wherein a vertical extent of the first conductivity type layer is lower than a bottom of the islands of the second conductivity type.

3. The semiconductor component of claim 1, wherein a vertical extent of the first conductivity type layer is higher than a bottom of the islands of the second conductivity type.

4. The semiconductor component of claim 1, wherein a doping concentration within the first conductivity type layer is non-uniform in a direction that is perpendicular to the Schottky contact.

5. The semiconductor component of claim 1, wherein a vertical extent of the first conductivity type layer is higher or lower than a bottom of the islands of the second conductivity type.

6. The semiconductor component of claim 1, wherein the first conductivity type layer has a doping concentration that does not vary in any direction along the contact surface.

7. The semiconductor component of claim 1, wherein the first conductivity type layer has a first doping concentration that is higher than a second doping concentration of a drift region.

8. The semiconductor component of claim 1, wherein the first conductivity type layer has a first doping concentration that is lower than a second doping concentration of a drift region.

9. The semiconductor component of claim 1, wherein the Schottky contact comprises a metal comprising Al, Ag, Au, Mo, Ni, Ti, W, $Ti_xW_y$, $Ti_xN_y$, or combinations thereof.

10. A diode comprising P+ islands interspersed within a N+ region and a N– region contacts with a Schottky layer.

11. The diode of claim 10, wherein a vertical extent of the N+ region is lower than a bottom of the P+ islands.

12. The diode of claim 10, wherein a vertical extent of the N+ region is higher than a bottom of the P+ islands.

13. The diode of claim 10, wherein a doping concentration within the N+ region is non-uniform in a direction that is perpendicular to the Schottky layer.

14. The diode of claim 10, wherein a vertical extent of the N+ region is higher or lower than a bottom of the P+ islands.

15. A diode comprising N+ islands interspersed within a P+ region and a P– region contacts with a Schottky layer.

16. The diode of claim 15, wherein a vertical extent of the P+ region is lower than a bottom of the N+ islands.

17. The diode of claim 15, wherein a vertical extent of the P+ region is higher than a bottom of the N+ islands.

18. The diode of claim 15, wherein a doping concentration within the P+ region is non-uniform in a direction that is perpendicular to the Schottky layer.

19. The diode of claim 15, wherein a vertical extent of the P+ region is higher or lower than a bottom of the N+ islands.

* * * * *